US012794441B2

(12) United States Patent
Burak et al.

(10) Patent No.: US 12,794,441 B2

(45) **Date of Patent: *Nov. 10, 2026**

(54) DOPED ACOUSTIC WAVE RESONATORS, STRUCTURES, DEVICES AND SYSTEMS

(71) Applicant: QXONIX INC., Irvine, CA (US)

(72) Inventors: Dariusz Burak, Fort Collins, CO (US); Kevin J. Grannen, Thornton, CO (US); Jack Lenell, Fort Collins, CO (US)

(73) Assignee: QXONIX Inc., Irvine, CA (US)

( * ) Notice: Subject to any disclaimer, the term of this patent is extended or adjusted under 35 U.S.C. 154(b) by 109 days.

This patent is subject to a terminal disclaimer.

(21) Appl. No.: 18/893,845

(22) Filed: Sep. 23, 2024

(65) Prior Publication Data

US 2025/0023542 A1 Jan. 16, 2025

Related U.S. Application Data

(63) Continuation of application No. 17/564,214, filed on Dec. 29, 2021, now Pat. No. 12,126,319, which is a (Continued)

(51) Int. Cl.

*H03H 9/02* (2006.01)

*H03H 3/02* (2006.01)

(Continued)

(52) U.S. Cl.

CPC .......... *H03H 9/02259* (2013.01); *H03H 3/02* (2013.01); *H03H 9/02015* (2013.01);

(Continued)

(58) Field of Classification Search

CPC ...... H03H 9/02259; H03H 9/175; H03H 3/02; H03H 3/04; H03H 9/02015; H03H 9/0207;

(Continued)

(56) References Cited

U.S. PATENT DOCUMENTS

2005/0012568 A1* 1/2005 Aigner .................. H03H 9/174 333/187

2006/0119230 A1* 6/2006 Umeda .................. H03H 9/175 310/358

(Continued)

*Primary Examiner* — Quan Tra

(57) ABSTRACT

Techniques for improving Bulk Acoustic Wave (BAW) resonator structures are disclosed, including filters, oscillators and systems that may include such devices. A first layer of doped piezoelectric layer material and a second layer of piezoelectric material may be acoustically coupled with one another to have a piezoelectrically excitable resonance mode. The first layer of doped piezoelectric material may have a first piezoelectric axis orientation, and the second layer of piezoelectric material may have a second piezoelectric axis orientation that substantially opposes the first piezoelectric axis orientation of the first layer of piezoelectric material. An acoustic reflector including a first pair of metal electrode layers may be electrically and acoustically coupled with the first layer of doped piezoelectric material and the second layer of piezoelectric material to excite the piezoelectrically excitable main resonance mode at a resonant frequency.

20 Claims, 31 Drawing Sheets

Related U.S. Application Data continuation of application No. PCT/US2020/043730, filed on Jul. 27, 2020.

(60) Provisional application No. 62/881,085, filed on Jul. 31, 2019, provisional application No. 62/881,074, filed on Jul. 31, 2019, provisional application No. 62/881,077, filed on Jul. 31, 2019, provisional application No. 62/881,061, filed on Jul. 31, 2019, provisional application No. 62/881,087, filed on Jul. 31, 2019, provisional application No. 62/881,091, filed on Jul. 31, 2019, provisional application No. 62/881,094, filed on Jul. 31, 2019.

(51) Int. Cl.

| | |
|---|---|
| ***H03H 9/13*** | (2006.01) |
| ***H03H 9/17*** | (2006.01) |
| ***H03H 9/205*** | (2006.01) |
| ***H03H 9/54*** | (2006.01) |
| ***H03H 9/56*** | (2006.01) |

(52) U.S. Cl.

CPC ...... *H03H 9/0207* (2013.01); *H03H 9/02102* (2013.01); *H03H 9/0211* (2013.01); *H03H 9/02157* (2013.01); *H03H 9/13* (2013.01); *H03H 9/131* (2013.01); *H03H 9/17* (2013.01); *H03H 9/173* (2013.01); *H03H 9/175* (2013.01); *H03H 9/205* (2013.01); *H03H 9/54* (2013.01); *H03H 9/568* (2013.01); *H03H 2003/021* (2013.01); *H03H 2009/02165* (2013.01)

(58) Field of Classification Search

CPC ........... H03H 9/02078; H03H 9/02102; H03H 9/0211; H03H 9/02118; H03H 9/02157; H03H 9/13; H03H 9/131; H03H 9/17; H03H 9/173; H03H 9/174; H03H 9/205; H03H 9/54; H03H 9/568; H03H 9/589; H03H 9/605; H03H 2003/021; H03H 2003/0428; H03H 2009/02165

See application file for complete search history.

(56) References Cited

U.S. PATENT DOCUMENTS

| | | | | |
|---|---|---|---|---|
| 2007/0096851 | A1* | 5/2007 | Uno | H03H 9/605<br>333/191 |
| 2017/0301992 | A1* | 10/2017 | Khlat | H04B 11/00 |
| 2018/0175826 | A1* | 6/2018 | Sadhu | H03H 9/605 |
| 2019/0305752 | A1* | 10/2019 | Sadhu | H03H 9/02157 |
| 2019/0363694 | A1* | 11/2019 | Song | H03H 9/542 |

* cited by examiner

9000B 9051
9052
9060
9050
3GPP
5G n258
24250-
27500
3GPP
5G n261
27500-
2835
9053
3GPP 5G n257
26500-
29500
35PP
5G n260
37000-
40000
12 GHZ
18 GHz
27GHZ
X Band
8 - 12 GHz
Ku Band
12 - 18 GHz
K Band
18 - 27 GHz
Ka Band
27 - 40 GHz
9070
9071
802.11ad/ay WiGig
US
57000-71000
9072
EU/Japan
57000-
66000
9073
S. Korea
57000-
64000
9074
China
59000-
64000
9080
Car Radar
76000-
81000
40 GHZ
75 GHZ
V Band
40 – 75 GHz
W Band
75 – 110 GHz

DOPED ACOUSTIC WAVE RESONATORS, STRUCTURES, DEVICES AND SYSTEMS

PRIORITY CLAIM

This application arises from a continuation of U.S. patent application Ser. No. 17/564,214 filed Dec. 29, 2021, entitled "DOPED ACOUSTIC WAVE RESONATOR STRUCTURES, DEVICES AND SYSTEMS" (amended), which is a continuation of and claims priority to: PCT Application No. PCTUS2020043730 filed Jul. 27, 2020, titled "DOPED BULK ACOUSTIC WAVE (BAW) RESONATOR STRUCTURES, DEVICES AND SYSTEMS", which claims priority to the following provisional patent applications:

U.S. Provisional Patent Application Ser. No. 62/881,061, entitled "BULK ACOUSTIC WAVE (BAW) RESONATOR STRUCTURES, DEVICES AND SYSTEMS" and filed on Jul. 31, 2019;

U.S. Provisional Patent Application Ser. No. 62/881,074, entitled "ACOUSTIC DEVICE STRUCTURES, DEVICES AND SYSTEMS" and filed on Jul. 31, 2019;

U.S. Provisional Patent Application Ser. No. 62/881,077, entitled "DOPED BULK ACOUSTIC WAVE (BAW) RESONATOR STRUCTURES, DEVICES AND SYSTEMS" and filed on Jul. 31, 2019;

U.S. Provisional Patent Application Ser. No. 62/881,085, entitled "BULK ACOUSTIC WAVE (BAW) RESONATOR WITH PATTERNED LAYER STRUCTURES, DEVICES AND SYSTEMS" and filed on Jul. 31, 2019;

U.S. Provisional Patent Application Ser. No. 62/881,087, entitled "BULK ACOUSTIC WAVE (BAW) REFLECTOR AND RESONATOR STRUCTURES, DEVICES AND SYSTEMS" and filed on Jul. 31, 2019;

U.S. Provisional Patent Application Ser. No. 62/881,091, entitled "MASS LOADED BULK ACOUSTIC WAVE (BAW) RESONATOR STRUCTURES, DEVICES AND SYSTEMS" and filed on Jul. 31, 2019; and U.S. Provisional Patent Application Ser. No. 62/881,094, entitled "TEMPERATURE COMPENSATING BULK ACOUSTIC WAVE (BAW) RESONATOR STRUCTURES, DEVICES AND SYSTEMS" and filed on Jul. 31, 2019.

Each of the applications identified above are hereby incorporated by reference in their entirety.

TECHNICAL FIELD

The present disclosure relates to acoustic resonators and to devices and to systems comprising acoustic resonators.

BACKGROUND

Bulk Acoustic Wave (BAW) resonators have enjoyed commercial success in filter applications. For example, 4G cellular phones that operate on fourth generation broadband cellular networks typically include a large number of BAW filters for various different frequency bands of the 4G network. In addition to BAW resonators and filters, also included in 4G phones are filters using Surface Acoustic Wave (SAW) resonators, typically for lower frequency band filters. SAW based resonators and filters are generally easier to fabricate than BAW based filters and resonators. However, performance of SAW based resonators and filters may decline if attempts are made to use them for higher 4G frequency bands. Accordingly, even though BAW based filters and resonators are relatively more difficult to fabricate than SAW based filters and resonators, they may be included in 4G cellular phones to provide better performance in higher 4G frequency bands what is provided by SAW based filters and resonators.

5G cellular phones may operate on newer, fifth generation broadband cellular networks. 5G frequencies include some frequencies that are much higher frequency than 4G frequencies. Such relatively higher 5G frequencies may transport data at relatively faster speeds than what may be provided over relatively lower 4G frequencies. However, previously known SAW and BAW based resonators and filters have encountered performance problems when attempts were made to use them at relatively higher 5G frequencies. Many learned engineering scholars have studied these problems, but have not found solutions. For example, performance problems cited for previously known SAW and BAW based resonators and filters include scaling issues and significant increases in acoustic losses at high frequencies.

From the above, it is seen that techniques for improving acoustic devices are highly desirable, for example for operation over frequencies higher than 4G frequencies, in particular for filters, oscillators and systems that may include such devices.

DETAILED DESCRIPTION

Figure 1A:
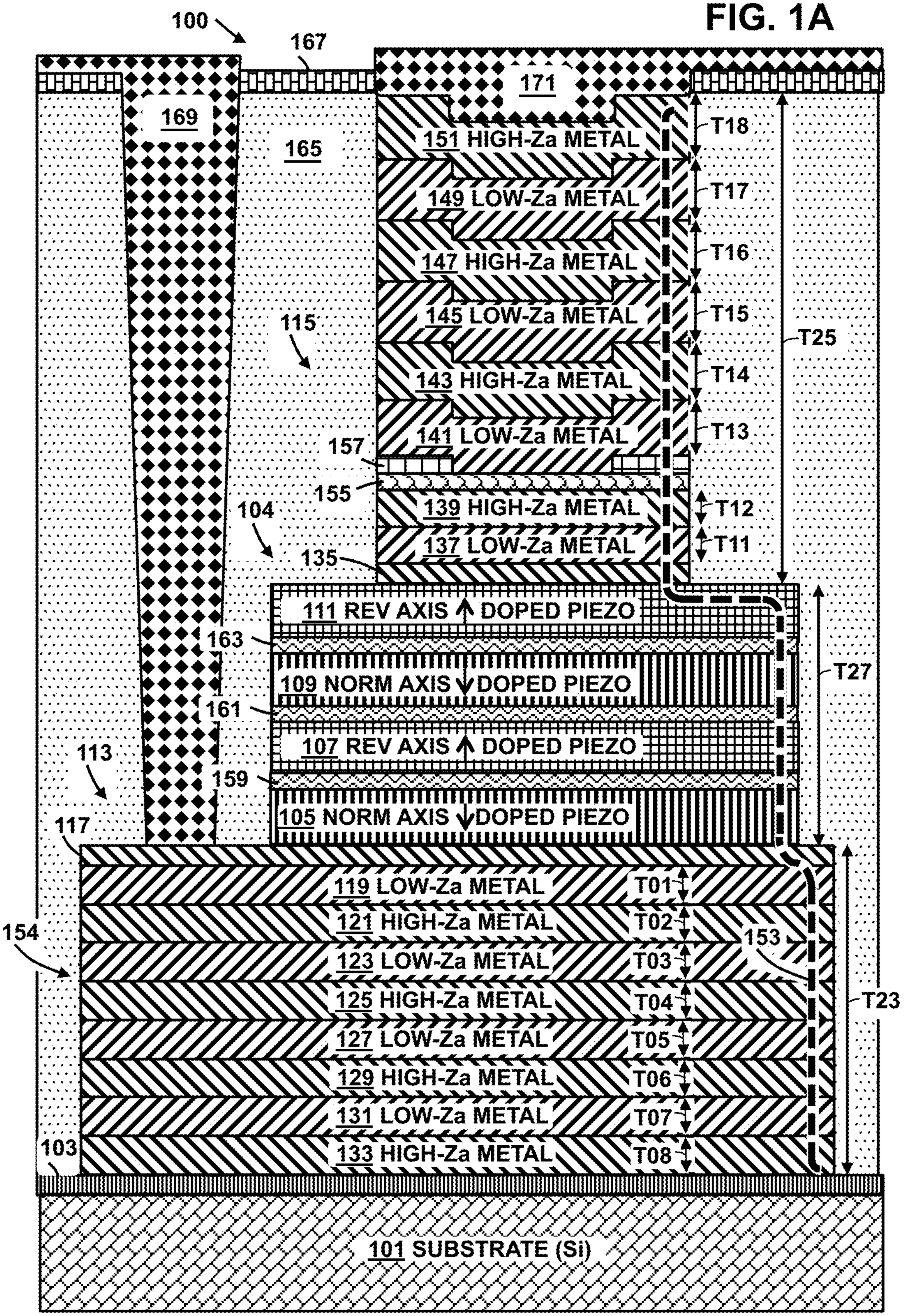
FIG. 1A is a diagram that illustrates an example bulk acoustic wave resonator structure.

Non-limiting embodiments will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment shown where illustration is not necessary to allow understanding by those of ordinary skill in the art. In the specification, as well as in the claims, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element. The term "compensating" is to be understood as including "substantially compensating". The terms "oppose", "opposes" and "opposing" are to be understood as including "substantially oppose", "substantially opposes" and "substantially opposing" respectively. Further, as used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As used in the specification and the appended claims and in addition to its ordinary meaning, the term "approximately" or "about" means to within an acceptable limit or amount to one of ordinary skill in the art. For example, "approximately the same" means that one of ordinary skill in the art would consider the items being compared to be the same. As used in the specification and appended claims, the terms "a", "an" and "the" include both singular and plural referents, unless the context clearly dictates otherwise. Thus, for example, "a device" includes one device and plural devices. As used herein, the International Telecommunication Union (ITU) defines Super High Frequency (SHF) as extending between three Gigahertz (3 GHz) and thirty Gigahertz (30 GHz). The ITU defines Extremely High Frequency (EHF) as extending between thirty Gigahertz (30 GHz) and three hundred Gigahertz (300 GHz).

FIG. 1A is a diagram that illustrates an example bulk acoustic wave resonator structure 100. FIGS. 4A through 4G show alternative example bulk acoustic wave resonators, 400A through 400G, to the example bulk acoustic wave resonator structure 100 shown in FIG. 1A. The resonator structures are formed over a substrate 101, 401A through 401G (e.g., silicon substrate 101, 401A, 401B, 401D through 401F, e.g., silicon carbide substrate 401C. In some examples, the substrate may further comprise a seed layer 103, 403A, 403B, 403D through 403F, formed of, for example, Aluminum Nitride (AlN), or another suitable material (e.g., silicon dioxide ($SiO_2$), aluminum oxide ($Al_2O_3$), silicon nitride ($Si_3N_4$), amorphous silicon (a-Si), silicon carbide (SiC)), having an example thickness in a range from approximately 100 A to approximately 1 um on the silicon substrate.

The example resonators 100, 400A through 400G, include a respective stack 104, 404A through 404G, of an example four layers of doped piezoelectric material, for example, four layers of Aluminum Nitride (AlN) having a wurtzite structure and doped with a suitable percentage of a suitable dopant (e.g., Scandium, e.g., Magnesium Zirconium, e.g., Magnesium Hafnium, e.g., Magnesium Niobium). For example, FIG. 1A and FIGS. 4A through 4G show a bottom doped piezoelectric layer 105, 405A through 405G, a first middle doped piezoelectric layer 107, 407A through 407G, a second middle doped piezoelectric layer 109, 409A through 409G, and a top doped piezoelectric layer 111, 411A through 411G. A mesa structure 104, 404A through 404G (e.g., first mesa structure 104, 404A through 404G) may comprise the respective stack 104, 404A through 404G, of the example four layers of doped piezoelectric material. The mesa structure 104, 404A through 404G (e.g., first mesa structure 104, 404A through 404G) may comprise bottom doped piezoelectric layer 105, 405A through 405G. The mesa structure 104, 404A through 404G (e.g., first mesa structure 104, 404A through 404G) may comprise first middle doped piezoelectric layer 107, 407A through 407G.

The mesa structure 104, 404A through 404G (e.g., first mesa structure 104, 404A through 404G) may comprise second middle doped piezoelectric layer 109, 409A through 409G. The mesa structure 104, 404A through 404G (e.g., first mesa structure 104, 404A through 404G) may comprise top doped piezoelectric layer 111, 411A through 411G.

The four layers of doped piezoelectric material in the respective stack 104, 404A through 404G of FIG. 1A and FIGS. 4A through 4G may have an alternating axis arrangement in the respective stack 104, 404A through 404G. For example the bottom doped piezoelectric layer 105, 405A through 405G may have a normal axis orientation, which is depicted in the figures using a downward directed arrow. Next in the alternating axis arrangement of the respective stack 104, 404A through 404G, the first middle doped piezoelectric layer 107, 407A through 407G may have a reverse axis orientation, which is depicted in the figures using an upward directed arrow. Next in the alternating axis arrangement of the respective stack 104, 404A through 404G, the second middle doped piezoelectric layer 109, 409A through 409G may have the normal axis orientation, which is depicted in the figures using the downward directed arrow. Next in the alternating axis arrangement of the respective stack 104, 404A through 404G, the top doped piezoelectric layer 111, 411A through 411G may have the reverse axis orientation, which is depicted in the figures using the upward directed arrow.

For example, polycrystalline thin film AlN may be grown in a crystallographic c-axis negative polarization, or normal axis orientation perpendicular relative to the substrate surface using reactive magnetron sputtering of an Aluminum target in a nitrogen atmosphere. However, as will be discussed in greater detail subsequently herein, changing sputtering conditions, for example by adding oxygen, may reverse the axis to a crystallographic c-axis positive polarization, or reverse axis, orientation perpendicular relative to the substrate surface. Further, the polycrysaline thin film AlN having normal axis or reverse axis may be doped, for example, by co-sputtering one or more dopant targets along with an Aluminum target.

In the example resonators 100, 400A through 400G, of FIG. 1A and FIGS. 4A through 4G, the bottom doped piezoelectric layer 105, 405A through 405G, may have a piezoelectrically excitable resonance mode (e.g., main resonance mode) at a resonant frequency (e.g., main resonant frequency) of the example resonators. Similarly, the first middle doped piezoelectric layer 107, 407A through 407G, may have its piezoelectrically excitable resonance mode (e.g., main resonance mode) at the resonant frequency (e.g., main resonant frequency) of the example resonators. Similarly, the second middle doped piezoelectric layer 109, 409A through 409G, may have its piezoelectrically excitable resonance mode (e.g., main resonance mode) at the resonant frequency (e.g., main resonant frequency) of the example resonators. Similarly, the top doped piezoelectric layer 111, 411A through 411G, may have its piezoelectrically excitable main resonance mode (e.g., main resonance mode) at the resonant frequency (e.g., main resonant frequency) of the example resonators. Accordingly, the top doped piezoelectric layer 111, 411A through 411G, may have its piezoelectrically excitable main resonance mode (e.g., main resonance mode) at the resonant frequency (e.g., main resonant frequency) with the bottom doped piezoelectric layer 105, 405A through 405G, the first middle doped piezoelectric layer 107, 407A through 407G, and the second middle doped piezoelectric layer 109, 409A through 409G.

The bottom doped piezoelectric layer 105, 405A through 405G, may be acoustically coupled with the first middle doped piezoelectric layer 107, 407A through 407G, in the piezoelectrically excitable resonance mode (e.g., main resonance mode) at the resonant frequency (e.g., main resonant frequency) of the example resonators 100, 400A through 400G. The normal axis of bottom doped piezoelectric layer 105, 405A through 405G, in opposing the reverse axis of the first middle doped piezoelectric layer 107, 407A through 407G, may cooperate for the piezoelectrically excitable resonance mode (e.g., main resonance mode) at the resonant frequency (e.g., main resonant frequency) of the example resonators. The first middle doped piezoelectric layer 107, 407A through 407G, may be sandwiched between the bottom doped piezoelectric layer 105, 405A through 405G, and the second middle doped piezoelectric layer 109, 409A through 409G, for example, in the alternating axis arrangement in the respective stack 104, 404A through 404G. For example, the reverse axis of the first middle doped piezoelectric layer 107, 407A through 407G, may oppose the normal axis of the bottom doped piezoelectric layer 105, 405A through 405G, and the normal axis of the second middle doped piezoelectric layer 109, 409A-409G. In opposing the normal axis of the bottom doped piezoelectric layer 105, 405A through 405G, and the normal axis of the second middle doped piezoelectric layer 109, 409A through 409G, the reverse axis of the first middle doped piezoelectric layer 107, 407A through 407G, may cooperate for the piezoelectrically excitable resonance mode (e.g., main resonance mode) at the resonant frequency (e.g., main resonant frequency) of the example resonators.

The second middle doped piezoelectric layer 109, 409A through 409G, may be sandwiched between the first middle doped piezoelectric layer 107, 407A through 407G, and the top doped piezoelectric layer 111, 411A through 411G, for example, in the alternating axis arrangement in the respective stack 104, 404A through 404G. For example, the normal axis of the second middle doped piezoelectric layer 109, 409A through 409G, may oppose the reverse axis of the first middle doped piezoelectric layer 107, 407A through 407G, and the reverse axis of the top doped piezoelectric layer 111, 411A through 411G. In opposing the reverse axis of the first middle doped piezoelectric layer 107, 407A through 407G, and the reverse axis of the top doped piezoelectric layer 111, 411A through 411G, the normal axis of the second middle doped piezoelectric layer 109, 409A through 409G, may cooperate for the piezoelectrically excitable resonance mode (e.g., main resonance mode) at the resonant frequency (e.g., main resonant frequency) of the example resonators. Similarly, the alternating axis arrangement of the bottom doped piezoelectric layer 105, 405A through 405G, and the first middle doped piezoelectric layer 107, 407A through 407G, and the second middle doped piezoelectric layer 109, 409A through 409G, and the top doped piezoelectric layer 111, 411A-411G, in the respective stack 104, 404A through 404G may cooperate for the piezoelectrically excitable resonance mode (e.g., main resonance mode) at the resonant frequency (e.g., main resonant frequency) of the example resonators. Despite differing in their alternating axis arrangement in the respective stack 104, 404A through 404G, the bottom doped piezoelectric layer 105, 405A through 405G and the first middle doped piezoelectric layer 107, 407A through 407G, and the second middle doped piezoelectric layer 109, 409A through 409G, and the top doped piezoelectric layer 111, 411A through 411G, may all be made of the same base piezoelectric material, e.g., Aluminum Nitride (AlN). Similarly, despite differing in their alternating axis arrangement in the respective stack 104, 404A through 404G, the bottom doped piezoelectric layer 105, 405A through 405G and the first middle doped piezoelectric layer 107, 407A through 407G, and the second middle doped piezoelectric layer 109, 409A through 409G, and the top doped piezoelectric layer 111, 411A through 411G, may all be made of the same doped piezoelectric material, e.g., doped Aluminum Nitride (AlN).

Respective layers of doped piezoelectric material in the stack 104, 404A through 404G, of FIG. 1A and FIGS. 4A through 4G may have respective layer thicknesses of about one half wavelength (e.g., about one half acoustic wavelength) of the main resonant frequency of the example resonators. For example, respective layers of doped piezoelectric material in the stack 104, 404A through 404G, of FIG. 1A and FIGS. 4A through 4G may have respective layer thicknesses so that (e.g., selected so that) the respective bulk acoustic wave resonators 100, 400A through 400G may have respective resonant frequencies that are in a Super High Frequency (SHF) band or an Extremely High Frequency (EHF) band (e.g., respective resonant frequencies that are in a Super High Frequency (SHF) band, e.g., respective resonant frequencies that are in an Extremely High Frequency (EHF) band.) For example, respective layers of doped piezoelectric material in the stack 104, 404A through 404G, of FIG. 1A and FIGS. 4A through 4G may have respective layer thicknesses so that (e.g., selected so that) the respective bulk acoustic wave resonators 100, 400A through 400G may have respective resonant frequencies that are in a millimeter wave band. For example, for a twenty-four gigahertz (e.g., 24 GHz) main resonant frequency of the example resonators, the bottom doped piezoelectric layer 105, 405A through 405G, may have a layer thickness corresponding to about one half of a wavelength (e.g., one half of an acoustic wavelength) of the main resonant frequency, and may be about one thousand and seven hundred Angstroms (1,700 A). Simulation shows that there may be an acoustic velocity reduction in doped piezoelectric material relative to undoped piezoelectric material. For example, Magnesium Hafnium doped Aluminum Nitride (e.g., Al(Mg0.5Hf0.5)0.25N) may have about 15% reduction in acoustic velocity relative to undoped Aluminum Nitride. Accordingly, the layer thickness corresponding to about one half of a wavelength (e.g., one half of an acoustic wavelength) for the doped Aluminum Nitride may be thinner than undoped Aluminum Nitride (e.g., about 15% thinner). Similarly, the first middle doped piezoelectric layer 107, 407A through 407G, may have a layer thickness corresponding the one half of the wavelength (e.g., one half of the acoustic wavelength) of the main resonant frequency; the second middle doped piezoelectric layer 109, 409A through 409G, may have a layer thickness corresponding the one half of the wavelength (e.g., one half of the acoustic wavelength) of the main resonant frequency; and the top doped piezoelectric layer 111, 411A through 411G, may have a layer thickness corresponding the one half of the wavelength (e.g., one half of the acoustic wavelength) of the main resonant frequency.

The example resonators 100, 400A through 400G, of FIG. 1A and FIGS. 4A through 4G may comprise: a bottom acoustic reflector 113, 413A through 413G, including an acoustically reflective bottom electrode stack of a plurality of bottom metal electrode layers; and a top acoustic reflector 115, 415A through 415G, including an acoustically reflective bottom electrode stack of a plurality of top metal electrode layers. Accordingly, the bottom acoustic reflector 113, 413A through 413G, may be a bottom multilayer acoustic reflector, and the top acoustic reflector 115, 415A through 415G, may be a top multilayer acoustic reflector. The doped piezoelectric layer stack 104, 404A through 404G, may be sandwiched between the plurality of bottom metal electrode layers of the bottom acoustic reflector 113, 413A through 413G, and the plurality of top metal electrode layers of the top acoustic reflector 115, 415A through 415G. The doped piezoelectric layer stack 104, 404A through 404G, may be electrically and acoustically coupled with the plurality of bottom metal electrode layers of the bottom acoustic reflector 113, 413A through 413G and the plurality of top metal electrode layers of the top acoustic reflector 115, 415A through 415G, to excite the piezoelectrically excitable resonance mode (e.g., main resonance mode) at the resonant frequency (e.g., main resonant frequency). For example, such excitation may be done by using the plurality of bottom metal electrode layers of the bottom acoustic reflector 113, 413A through 413G and the plurality of top metal electrode layers of the top acoustic reflector 115, 415A through 415G to apply an oscillating electric field having a frequency corresponding to the resonant frequency (e.g., main resonant frequency) of the doped piezoelectric layer stack 104, 404A through 404G, and of the example resonators 100, 400A through 400G.

For example, the bottom doped piezoelectric layer 105, 405A through 405G, may be electrically and acoustically coupled with the plurality of bottom metal electrode layers of the bottom acoustic reflector 113, 413A through 413G and the plurality of top metal electrode layers of the top acoustic reflector 115, 415A through 415G, to excite the piezoelectrically excitable resonance mode (e.g., main resonance mode) at the resonant frequency (e.g., main resonant frequency) of the bottom doped piezoelectric layer 105, 405A through 405G. Further, the bottom doped piezoelectric layer 105, 405A through 405G and the first middle doped piezoelectric layer 107, 407A through 407G, may be electrically and acoustically coupled with the plurality of bottom metal electrode layers of the bottom acoustic reflector 113, 413A through 413G, and the plurality of top metal electrode layers of the top acoustic reflector 115, 415A through 415G, to excite the piezoelectrically excitable resonance mode (e.g., main resonance mode) at the resonant frequency (e.g., main resonant frequency) of the bottom doped piezoelectric layer 105, 405A through 405G, acoustically coupled with the first middle doped piezoelectric layer 107, 407A through 407G. Additionally, the first middle doped piezoelectric layer 107, 407A-407G, may be sandwiched between the bottom doped piezoelectric layer 105, 405A through 405G and the second middle doped piezoelectric layer 109, 409A through 409G, and may be electrically and acoustically coupled with the plurality of bottom metal electrode layers of the bottom acoustic reflector 113, 413A through 413G, and the plurality of top metal electrode layers of the top acoustic reflector 115, 415A through 415G, to excite the piezoelectrically excitable resonance mode (e.g., main resonance mode) at the resonant frequency (e.g., main resonant frequency) of the first middle doped piezoelectric layer 107, 407A through 407G, sandwiched between the bottom doped piezoelectric layer 105, 405A through 405G, and the second middle doped piezoelectric layer 109, 409A through 409G.

The acoustically reflective bottom electrode stack of the plurality of bottom metal electrode layers of the bottom acoustic reflector 113, 413A through 413G, may have an alternating arrangement of low acoustic impedance metal layer and high acoustic impedance metal layer. For example, an initial bottom metal electrode layer 117, 417A through 417G, may comprise a relatively high acoustic impedance metal, for example, Tungsten having an acoustic impedance of about 100 MegaRayls, or for example, Molybdenum having an acoustic impedance of about 65 MegaRayls. The acoustically reflective bottom electrode stack of the plurality of bottom metal electrode layers of the bottom acoustic reflector 113, 413A through 413G may approximate a metal distributed Bragg acoustic reflector. The plurality of metal bottom electrode layers of the bottom acoustic reflector may be electrically coupled (e.g., electrically interconnected) with one another. The acoustically reflective bottom electrode stack of the plurality of bottom metal electrode layers may operate together as a multilayer (e.g., bilayer, e.g., multiple layer) bottom electrode for the bottom acoustic reflector 113, 413A through 413G.

Next in the alternating arrangement of low acoustic impedance metal layer and high acoustic impedance metal layer of the acoustically reflective bottom electrode stack, may be a first pair of bottom metal electrode layers 119, 419A through 419G and 121, 421A through 421G. A first member 119, 419A through 419G, of the first pair of bottom metal electrode layers may comprise a relatively low acoustic impedance metal, for example, Titanium having an acoustic impedance of about 27 MegaRayls, or for example, Aluminum having an acoustic impedance of about 18 MegaRayls. A second member 121, 421A through 421G, of the first pair of bottom metal electrode layers may comprise the relatively high acoustic impedance metal, for example, Tungsten or Molybdenum. Accordingly, the first pair of bottom metal electrode layers 119, 419A through 419G, and 121, 421A through 421G, of the bottom acoustic reflector 113, 413A through 413G, may be different metals, and may have respective acoustic impedances that are different from one another so as to provide a reflective acoustic impedance mismatch at the resonant frequency (e.g., main resonant frequency). Similarly, the initial bottom metal electrode layer 117, 417A through 417G, and the first member of the first pair of bottom metal electrode layers 119, 419A through 119G, of the bottom acoustic reflector 113, 413A through 413G, may be different metals, and may have respective acoustic impedances that are different from one another so as to provide a reflective acoustic impedance mismatch at the resonant frequency (e.g., main resonant frequency).

Next in the alternating arrangement of low acoustic impedance metal layer and high acoustic impedance metal layer of the acoustically reflective bottom electrode stack, a second pair of bottom metal electrode layers 123, 423A through 423G, and 125, 425A through 425G, may respectively comprise the relatively low acoustic impedance metal and the relatively high acoustic impedance metal. Accordingly, the initial bottom metal electrode layer 117, 417A through 417G, and members of the first and second pairs of bottom metal electrode layers 119, 419A through 419G, 121, 421A through 421G, 123, 423A through 423G, 125, 425A through 425G, may have respective acoustic impedances in the alternating arrangement to provide a corresponding plurality of reflective acoustic impedance mismatches.

Next in the alternating arrangement of low acoustic impedance metal layer and high acoustic impedance metal layer of the acoustically reflective bottom electrode stack, a third pair of bottom metal electrode layers 127, 427D, 129, 429D may respectively comprise the relatively low acoustic impedance metal and the relatively high acoustic impedance metal. Next in the alternating arrangement of low acoustic impedance metal layer and high acoustic impedance metal layer of the acoustically reflective bottom electrode stack, a fourth pair of bottom metal electrode layers 131, 431D and 133, 433D may respectively comprise the relatively low acoustic impedance metal and the relatively high acoustic impedance metal.

Respective thicknesses of the bottom metal electrode layers may be related to wavelength (e.g., acoustic wavelength) for the main resonant frequency of the example bulk acoustic wave resonators, 100, 400A through 400G. Further, various embodiments for resonators having relatively higher resonant frequency (higher main resonant frequency) may have relatively thinner bottom metal electrode thicknesses, e.g., scaled thinner with relatively higher resonant frequency (e.g., higher main resonant frequency). Similarly, various alternative embodiments for resonators having relatively lower resonant frequency (e.g., lower main resonant frequency) may have relatively thicker bottom metal electrode layer thicknesses, e.g., scaled thicker with relatively lower resonant frequency (e.g., lower main resonant frequency). For example, a layer thickness of the initial bottom metal electrode layer 117, 417A through 417G, may be about one eighth of a wavelength (e.g., one eighth of an acoustic wavelength) at the main resonant frequency of the example resonator. For example, if molybdenum is used as the high acoustic impedance metal and the main resonant frequency of the resonator is twenty-four gigahertz (e.g., 24 GHz), then using the one eighth of the wavelength (e.g., one eighth of the acoustic wavelength) provides the layer thickness of the initial bottom metal electrode layer 117, 417A through 417G, as about three hundred and thirty Angstroms (330 A). In the foregoing example, the one eighth of the wavelength (e.g., the one eighth of the acoustic wavelength) at the main resonant frequency was used for determining the layer thickness of the initial bottom metal electrode layer 117, 417A-417G, but it should be understood that this layer thickness may be varied to be thicker or thinner in various other alternative example embodiments.

Respective layer thicknesses, T01 through T08, shown in FIG. 1A for members of the pairs of bottom metal electrode layers may be about an odd multiple (e.g., 1×, 3×, etc.) of a quarter of a wavelength (e.g., one quarter of the acoustic wavelength) at the main resonant frequency of the example resonator. However, the foregoing may be varied. For example, members of the pairs of bottom metal electrode layers of the bottom acoustic reflector may have respective layer thickness that correspond to from about one eighth to about one half wavelength at the resonant frequency, or an odd multiple (e.g., 1×, 3×, etc.) thereof.

In an example, if Tungsten is used as the high acoustic impedance metal, and the main resonant frequency of the resonator is twenty-four gigahertz (e.g., 24 GHz), then using the one quarter of the wavelength (e.g., one quarter of the acoustic wavelength) provides the layer thickness of the high impedance metal electrode layer members of the pairs as about five hundred and forty Angstroms (540 A). For example, if Titanium is used as the low acoustic impedance metal, and the main resonant frequency of the resonator is twenty-four gigahertz (e.g., 24 GHz), then using the one quarter of the wavelength (e.g., one quarter of the acoustic wavelength) provides the layer thickness of the low impedance metal electrode layer members of the pairs as about six hundred and thirty Angstroms (630 A). Similarly, respective layer thicknesses for members of the pairs of bottom metal electrode layers shown in FIGS. 4A through 4G may likewise be about one quarter of the wavelength (e.g., one quarter of the acoustic wavelength) of the main resonant frequency of the example resonator, and these respective layer thicknesses may likewise be determined for members of the pairs of bottom metal electrode layers for the high and low acoustic impedance metals employed.

For example, the bottom doped piezoelectric layer 105, 405A through 405G, may be electrically and acoustically coupled with the initial bottom metal electrode layer 117, 417A through 417G, and pair(s) of bottom metal electrode layers (e.g., first pair of bottom metal electrode layers 119, 419A through 419G, 121, 421A through 421G, e.g., second pair of bottom metal electrode layers 123, 423A through 423G, 125, 425A through 425G, e.g., third pair of bottom metal electrode layers 127, 427D, 129, 429D, fourth pair of bottom metal electrode layers 131, 431D, 133, 433D), to excite the piezoelectrically excitable resonance mode (e.g., main resonance mode) at the resonant frequency (e.g., main resonant frequency) of the bottom doped piezoelectric layer 105, 405A through 405G. Further, the bottom doped piezoelectric layer 105, 405A through 405G and the first middle doped piezoelectric layer 107, 407A through 407G may be electrically and acoustically coupled with the initial bottom metal electrode layer 117, 417A through 417G and pair(s) of bottom metal electrode layers (e.g., first pair of bottom metal electrode layers 119, 419A through 419G, 121, 421A through 421G, e.g., second pair of bottom metal electrode layers 123, 423A through 423G, 125, 425A through 425G, e.g., third pair of bottom metal electrode layers 127, 427D, 129, 429D), to excite the piezoelectrically excitable resonance mode (e.g., main resonance mode) at the resonant frequency (e.g., main resonant frequency) of the bottom doped piezoelectric layer 105, 405A through 405G acoustically coupled with the first middle doped piezoelectric layer 107, 407A through 407G. Additionally, the first middle doped piezoelectric layer 107, 407A through 407G, may be sandwiched between the bottom doped piezoelectric layer 105, 405A through 405G, and the second middle doped piezoelectric layer 109, 409A through 409G, and may be electrically and acoustically coupled with initial bottom metal electrode layer 117, 417A through 417G, and pair(s) of bottom metal electrode layers (e.g., first pair of bottom metal electrode layers 119, 419A through 419G, 121, 421A through 421G, e.g., second pair of bottom metal electrode layers 123, 423A through 423G, 125, 425A through 425G, e.g., third pair of bottom metal electrode layers 127, 427D, 129, 429D), to excite the piezoelectrically excitable resonance mode (e.g., main resonance mode) at the resonant frequency (e.g., main resonant frequency) of the first middle doped piezoelectric layer 107, 407A through 407G, sandwiched between the bottom doped piezoelectric layer 105, 405A through 405G, and the second middle doped piezoelectric layer 109, 409A through 409G.

Another mesa structure 113, 413A through 413G, (e.g., second mesa structure 113, 413A through 413G), may comprise the bottom acoustic reflector 113, 413A through 413G. The another mesa structure 113, 413A through 413G, (e.g., second mesa structure 113, 413A through 413G), may comprise initial bottom metal electrode layer 117, 417A through 417G. The another mesa structure 113, 413A through 413G, (e.g., second mesa structure 113, 413A through 413G), may comprise one or more pair(s) of bottom metal electrode layers (e.g., first pair of bottom metal electrode layers 119, 419A through 419G, 121, 421A through 421G, e.g., second pair of bottom metal electrode layers 123, 423A through 423G, 125, 425A through 425G, e.g., third pair of bottom metal electrode layers 127, 427A, 427D, 129, 429D, e.g., fourth pair of bottom metal electrode layers 131, 431D, 133, 433D).

Similar to what has been discussed for the bottom electrode stack, likewise the top electrode stack of the plurality of top metal electrode layers of the top acoustic reflector 115, 415A through 415G, may have the alternating arrangement of low acoustic impedance metal layer and high acoustic impedance metal layer. For example, an initial top metal electrode layer 135, 435A through 435G, may comprise the relatively high acoustic impedance metal, for example, Tungsten or Molybdenum. The top electrode stack of the plurality of top metal electrode layers of the top acoustic reflector 115, 415A through 415G, may approximate a metal distributed Bragg acoustic reflector. The plurality of top metal electrode layers of the top acoustic reflector may be electrically coupled (e.g., electrically interconnected) with one another. The acoustically reflective top electrode stack of the plurality of top metal electrode layers may operate together as a multilayer (e.g., bilayer, e.g., multiple layer) top electrode for the top acoustic reflector 115, 415A through 415G. Next in the alternating arrangement of low acoustic impedance metal layer and high acoustic impedance metal layer of the acoustically reflective top electrode stack, may be a first pair of top metal electrode layers 137, 437A through 437G, and 139, 439A through 439G. A first member 137, 437A through 437G, of the first pair of top metal electrode layers may comprise the relatively low acoustic impedance metal, for example, Titanium or Aluminum. A second member 139, 439A through 439G, of the first pair of top metal electrode layers may comprise the relatively high acoustic impedance metal, for example, Tungsten or Molybdenum. Accordingly, the first pair of top metal electrode layers 137, 437A through 437G, 139, 439A through 439G, of the top acoustic reflector 115, 415A through 415G, may be different metals, and may have respective acoustic impedances that are different from one another so as to provide a reflective acoustic impedance mismatch at the resonant frequency (e.g., main resonant frequency). Similarly, the initial top metal electrode layer 135, 435A through 435G, and the first member of the first pair of top metal electrode layers 137, 437A through 437G, of the top acoustic reflector 115, 415A through 415G, may be different metals, and may have respective acoustic impedances that are different from one another so as to provide a reflective acoustic impedance mismatch at the resonant frequency (e.g., main resonant frequency).

Next in the alternating arrangement of low acoustic impedance metal layer and high acoustic impedance metal layer of the acoustically reflective top electrode stack, a second pair of top metal electrode layers 141, 441A through 441G, and 143, 443A through 443G, may respectively comprise the relatively low acoustic impedance metal and the relatively high acoustic impedance metal. Accordingly, the initial top metal electrode layer 135, 435A through 435G, and members of the first and second pairs of top metal electrode layers 137, 437A through 437G, 139, 439A through 439G, 141, 441A through 441G, 143, 443A through 443G, may have respective acoustic impedances in the alternating arrangement to provide a corresponding plurality of reflective acoustic impedance mismatches.

Next in the alternating arrangement of low acoustic impedance metal layer and high acoustic impedance metal layer of the acoustically reflective top electrode stack, a third pair of top metal electrode layers 145, 445A through 445C, and 147, 447A through 447C, may respectively comprise the relatively low acoustic impedance metal and the relatively high acoustic impedance metal. Next in the alternating arrangement of low acoustic impedance metal layer and high acoustic impedance metal layer of the acoustically reflective top electrode stack, a fourth pair of top metal electrode layers 149, 449A through 449C, 151, 451A through 451C, may respectively comprise the relatively low acoustic impedance metal and the relatively high acoustic impedance metal.

For example, the bottom doped piezoelectric layer 105, 405A through 405G, may be electrically and acoustically coupled with the initial top metal electrode layer 135, 435A through 435G, and the pair(s) of top metal electrode layers (e.g., first pair of top metal electrode layers 137, 437A through 437G, 139, 439A through 439G, e.g., second pair of top metal electrode layers 141, 441A through 441G, 143, 443A through 443G, e.g., third pair of top metal electrode layers 145, 445A through 445C, 147, 447A through 447C), to excite the piezoelectrically excitable resonance mode (e.g., main resonance mode) at the resonant frequency (e.g., main resonant frequency) of the bottom doped piezoelectric layer 105, 405A through 405G. Further, the bottom doped piezoelectric layer 105, 405A through 405G and the first middle doped piezoelectric layer 107, 407A through 407G may be electrically and acoustically coupled with the initial top metal electrode layer 135, 435A through 435G and pair(s) of top metal electrode layers (e.g., first pair of top metal electrode layers 137, 437A through 437G, 139, 439A through 439G, e.g., second pair of top metal electrode layers 141, 441A through 441G, 143, 443A through 443G, e.g., third pair of top metal electrode layers 145, 445A through 445C, 147, 447A through 447C), to excite the piezoelectrically excitable resonance mode (e.g., main resonance mode) at the resonant frequency (e.g., main resonant frequency) of the bottom doped piezoelectric layer 105, 405A through 405G acoustically coupled with the first middle doped piezoelectric layer 107, 407A through 407G. Additionally, the first middle doped piezoelectric layer 107, 407A through 407G, may be sandwiched between the bottom doped piezoelectric layer 105, 405A through 405G, and the second middle doped piezoelectric layer 109, 409A through 409G, and may be electrically and acoustically coupled with the initial top metal electrode layer 135, 435A through 435G, and the pair(s) of top metal electrode layers (e.g., first pair of top metal electrode layers 137, 437A through 437G, 139, 439A through 439G, e.g., second pair of top metal electrode layers 141, 441A through 441G, 143, 443A through 443G, e.g., third pair of top metal electrode layers 145, 445A through 445C, 147, 447A through 447C), to excite the piezoelectrically excitable resonance mode (e.g., main resonance mode) at the resonant frequency (e.g., main resonant frequency) of the first middle doped piezoelectric layer 107, 407A through 407G, sandwiched between the bottom doped piezoelectric layer 105, 405A through 405G, and the second middle doped piezoelectric layer 109, 409A through 409G.

Yet another mesa structure 115, 415A through 415G, (e.g., third mesa structure 115, 415A through 415G), may comprise the top acoustic reflector 115, 415A through 415G, or a portion of the top acoustic reflector 115, 415A through 415G. The yet another mesa structure 115, 415A through 415G, (e.g., third mesa structure 115, 415A through 415G), may comprise initial top metal electrode layer 135, 435A through 435G. The yet another mesa structure 115, 415A through 415C, (e.g., third mesa structure 115, 415A through 415C), may comprise one or more pair(s) of top metal electrode layers (e.g., first pair of top metal electrode layers 137, 437A through 437C, 139, 439A through 439C, e.g., second pair of top metal electrode layers 141, 441A through 441C, 143, 443A through 443C, e.g., third pair of top metal electrode layers 145, 445A through 445C, 147, 447A through 447C, e.g., fourth pair of top metal electrode layers 149, 449A through 449C, 151, 451A through 451C).

Like the respective layer thicknesses of the bottom metal electrode layers, respective thicknesses of the top metal electrode layers may likewise be related to wavelength (e.g., acoustic wavelength) for the main resonant frequency of the example bulk acoustic wave resonators, 100, 400A through 400G. Further, various embodiments for resonators having relatively higher main resonant frequency may have relatively thinner top metal electrode thicknesses, e.g., scaled thinner with relatively higher main resonant frequency. Similarly, various alternative embodiments for resonators having relatively lower main resonant frequency may have relatively thicker top metal electrode layer thicknesses, e.g., scaled thicker with relatively lower main resonant frequency. Like the layer thickness of the initial bottom metal, a layer thickness of the initial top metal electrode layer 135, 435A through 435G, may likewise be about one eighth of the wavelength (e.g., one eighth of the acoustic wavelength) of the main resonant frequency of the example resonator. For example, if molybdenum is used as the high acoustic impedance metal and the main resonant frequency of the resonator is twenty-four gigahertz (e.g., 24 GHz), then using the one eighth of the wavelength (e.g., one eighth of the acoustic wavelength) provides the layer thickness of the initial top metal electrode layer 135, 435A through 435G, as about three hundred and thirty Angstroms (330 A). In the foregoing example, the one eighth of the wavelength (e.g., one eighth of the acoustic wavelength) at the main resonant frequency was used for determining the layer thickness of the initial top metal electrode layer 135, 435A-435G, but it should be understood that this layer thickness may be varied to be thicker or thinner in various other alternative example embodiments. Respective layer thicknesses, T11 through T18, shown in FIG. 1A for members of the pairs of top metal electrode layers may be about an odd multiple (e.g., 1×, 3×, etc.) of a quarter of a wavelength (e.g., one quarter of an acoustic wavelength) of the main resonant frequency of the example resonator. Similarly, respective layer thicknesses for members of the pairs of top metal electrode layers shown in FIGS. 4A through 4G may likewise be about one quarter of a wavelength (e.g., one quarter of an acoustic wavelength) at the main resonant frequency of the example resonator multiplied by an odd multiplier (e.g., 1×, 3×, etc.), and these respective layer thicknesses may likewise be determined for members of the pairs of top metal electrode layers for the high and low acoustic impedance metals employed. However, the foregoing may be varied. For example, members of the pairs of top metal electrode layers of the top acoustic reflector may have respective layer thickness that correspond to from an odd multiple (e.g., 1×, 3×, etc.) of about one eighth to an odd multiple (e.g., 1×, 3×, etc.) of about one half wavelength at the resonant frequency.

The bottom acoustic reflector 113, 413A through 413G, may have a thickness dimension T23 extending along the stack of bottom electrode layers. For the example of the 24 GHz resonator, the thickness dimension T23 of the bottom acoustic reflector may be about five thousand Angstroms (5,000 A). The top acoustic reflector 115, 415A through 415G, may have a thickness dimension T25 extending along the stack of top electrode layers. For the example of the 24 GHz resonator, the thickness dimension T25 of the top acoustic reflector may be about five thousand Angstroms (5,000 A). The doped piezoelectric layer stack 104, 404A through 404G, may have a thickness dimension T27 extending along the doped piezoelectric layer stack 104, 404A through 404G. For the example of the 24 GHz resonator, the thickness dimension T27 of the doped piezoelectric layer stack may be about six thousand eight hundred Angstroms (6,800 A).

In the example resonators 100, 400A through 400G, of FIG. 1A and FIGS. 4A through 4G, a notional heavy dashed line is used in depicting an etched edge region 153, 453A through 453G, associated with the example resonators 100, 400A through 400G. Similarly, a laterally opposing etched edge region 154, 454A through 454G is arranged laterally opposing or opposite from the notional heavy dashed line depicting the etched edge region 153, 453A through 453G. The etched edge region may, but need not, assist with acoustic isolation of the resonators. The etched edge region may, but need not, help with avoiding acoustic losses for the resonators. The etched edge region 153, 453A through 453G, (and the laterally opposing etched edge region 154, 454A through 454G) may extend along the thickness dimension T27 of the doped piezoelectric layer stack 104, 404A through 404G. The etched edge region 153, 453A through 453G, may extend through (e.g., entirely through or partially through) the doped piezoelectric layer stack 104, 404A through 404G. Similarly, the laterally opposing etched edge region 154, 454A through 454G may extend through (e.g., entirely through or partially through) the doped piezoelectric layer stack 104, 404A through 404G. The etched edge region 153, 453A through 453G, (and the laterally opposing etched edge region 154, 454A through 454G) may extend through (e.g., entirely through or partially through) the bottom doped piezoelectric layer 105, 405A through 405G. The etched edge region 153, 453A through 453G, (and the laterally opposing etched edge region 154, 454A through 454G) may extend through (e.g., entirely through or partially through) the first middle doped piezoelectric layer 107, 407A through 407G. The etched edge region 153, 453A through 453G, (and the laterally opposing etched edge region 154, 454A through 454G) may extend through (e.g., entirely through or partially through) the second middle doped piezoelectric layer 109, 409A through 409G. The etched edge region 153, 453A through 453G, (and the laterally opposing etched edge region 154, 454A through 454G) may extend through (e.g., entirely through or partially through) the top doped piezoelectric layer 111, 411A through 411G.

The etched edge region 153, 453A through 453G, (and the laterally opposing etched edge region 154, 454A through 454G) may extend along the thickness dimension T23 of the bottom acoustic reflector 113, 413A through 413G. The etched edge region 153, 453A through 453G, (and the laterally opposing etched edge region 154, 454A through 454G) may extend through (e.g., entirely through or partially through) the bottom acoustic reflector 113, 413A through 413G. The etched edge region 153, 453A through 453G, (and the laterally opposing etched edge region 154, 454A through 454G) may extend through (e.g., entirely through or partially through) the initial bottom metal electrode layer 117, 417A through 417G. The etched edge region 153, 453A through 453G, (and the laterally opposing etched edge region 154, 454A through 454G) may extend through (e.g., entirely through or partially through) the first pair of bottom metal electrode layers, 119, 419A through 419G, 121, 421A through 421G. The etched edge region 153, 453A through 453G (and the laterally opposing etched edge region 154, 454A through 454G) may extend through (e.g., entirely through or partially through) the second pair of bottom metal electrode layers, 123, 423A through 423G, 125, 425A through 425G. The etched edge region 153, 453A through 453G (and the laterally opposing etched edge region 154, 454A through 454G) may extend through (e.g., entirely through or partially through) the third pair of bottom metal electrode layers, 127, 427D, 129, 429D. The etched edge region 153, 453A through 453G (and the laterally opposing etched edge region 154, 454A through 454G) may extend through (e.g., entirely through or partially through) the fourth pair of bottom metal electrode layers, 131, 431D, 133, 433D.

The etched edge region 153, 453A through 453G (and the laterally opposing etched edge region 154, 454A through 454G) may extend along the thickness dimension T25 of the top acoustic reflector 115, 415A through 415G. The etched edge region 153, 453A through 453G (and the laterally opposing etched edge region 154, 454A through 454G) may extend through (e.g., entirely through or partially through) the top acoustic reflector 115, 415A through 415G. The etched edge region 153, 453A through 453G (and the laterally opposing etched edge region 154, 454A through 454G) may extend through (e.g., entirely through or partially through) the initial top metal electrode layer 135, 435A through 435G. The etched edge region 153, 453A through 453G (and the laterally opposing etched edge region 154, 454A through 454G) may extend through (e.g., entirely through or partially through) the first pair of top metal electrode layers, 137, 437A through 437G, 139, 439A through 49G. The etched edge region 153, 453A through 453C (and the laterally opposing etched edge region 154, 454A through 454C) may extend through (e.g., entirely through or partially through) the second pair of top metal electrode layers, 141, 441A through 441C, 143, 443A through 443C. The etched edge region 153, 453A through 453C (and the laterally opposing etched edge region 154, 454A through 454C) may extend through (e.g., entirely through or partially through) the third pair of top metal electrode layers, 145, 445A through 445C, 147, 447A through 447C. The etched edge region 153, 453A through 453C (and the laterally opposing etched edge region 154, 454A through 454C) may extend through (e.g., entirely through or partially through) the fourth pair of top metal electrode layers, 149, 449A through 449C, 151, 451A through 451C.

As mentioned previously, mesa structure 104, 404A through 404G (e.g., first mesa structure 104, 404A through 404G) may comprise the respective stack 104, 404A through 404G, of the example four layers of doped piezoelectric material. The mesa structure 104, 404A through 404G (e.g., first mesa structure 104, 404A through 404G) may extend laterally between (e.g., may be formed between) etched edge region 153, 453A through 453G and laterally opposing etched edge region 154, 454A through 454G. As mentioned previously, another mesa structure 113, 413A through 413G, (e.g., second mesa structure 113, 413A through 413G), may comprise the bottom acoustic reflector 113, 413A through 413G. The another mesa structure 113, 413A through 413G, (e.g., second mesa structure 113, 413A through 413G) may extend laterally between (e.g., may be formed between) etched edge region 153, 453A through 453G and laterally opposing etched edge region 154, 454A through 454G. As mentioned previously, yet another mesa structure 115, 415A through 415G, (e.g., third mesa structure 115, 415A through 415G), may comprise the top acoustic reflector 115, 415A through 415G or a portion of the top acoustic reflector 115, 415A through 415G. The yet another mesa structure 115, 415A through 415G, (e.g., third mesa structure 115, 415A through 415G) may extend laterally between (e.g., may be formed between) etched edge region 153, 453A through 453G and laterally opposing etched edge region 154, 454A through 454G. In some example resonators 100, 400A, 400B, 400D through 400F, the second mesa structure corresponding to the bottom acoustic reflector 113, 413A, 413B, 413D through 413F may be laterally wider than the first mesa structure corresponding to the stack 104, 404A, 404B, 404D through 404F, of the example four layers of doped piezoelectric material. In some example resonators 100, 400A through 400C, the first mesa structure corresponding to the stack 104, 404A through 404C, of the example four layers of doped piezoelectric material may be laterally wider than the third mesa structure corresponding to the top acoustic reflector 115, 415A through 415C. In some example resonators 400D through 400G, the first mesa structure corresponding to the stack 404D through 404G, of the example four layers of doped piezoelectric material may be laterally wider than a portion of the third mesa structure corresponding to the top acoustic reflector 415D through 415G.

An optional mass load layer 155, 455A through 455G, may be added to the example resonators 100, 400A through 400G. For example, filters may include series connected resonator designs and shunt connected resonator designs that may include mass load layers. For example, for ladder filter designs, the shunt resonator may include a sufficient mass load layer so that the parallel resonant frequency (Fp) of the shunt resonator approximately matches the series resonant frequency (Fs) of the series resonator design. Thus the series resonator design (without the mass load layer) may be used for the shunt resonator design, but with the addition of the mass load layer 155, 455A through 455G, for the shunt resonator design. By including the mass load layer, the design of the shunt resonator may be approximately down-shifted, or reduced, in frequency relative to the series resonator by a relative amount approximately corresponding to the electromechanical coupling coefficient (Kt2) of the shunt resonator. For the example resonators 100, 400A through 400G, the optional mass load layer 155, 455A through 455G, may be arranged in the top acoustic reflector 115, 415A through 415G, above the first pair of top metal electrode layers. A metal may be used for the mass load. A dense metal such as Tungsten may be used for the mass load 155, 455A through 455G. An example thickness dimension of the optional mass load layer 155, 455A through 455G, may be about one hundred Angstroms (100 A).

However, it should be understood that the thickness dimension of the optional mass load layer 155, 455A through 455G, may be varied depending on how much mass loading is desired for a particular design and depending on which metal is used for the mass load layer. Since there may be less acoustic energy in the top acoustic reflector 115, 415A through 415G, at locations further away from the doped piezoelectric stack 104, 404A through 404G, there may be less acoustic energy interaction with the optional mass load layer, depending on the location of the mass load layer in the arrangement of the top acoustic reflector. Accordingly, in alternative arrangements where the mass load layer is further away from the doped piezoelectric stack 104, 404A through 404G, such alternative designs may use more mass loading (e.g., thicker mass load layer) to achieve the same effect as what is provided in more proximate mass load placement designs. Also, in other alternative arrangements the mass load layer may be arranged relatively closer to the doped piezoelectric stack 104, 404A through 404G. Such alternative designs may use less mass loading (e.g., thinner mass load layer). This may achieve the same or similar mass loading effect as what is provided in previously discussed mass load placement designs, in which the mass load is arranged less proximate to the doped piezoelectric stack 104, 404A through 404G. Similarly, since Titanium (Ti) or Aluminum (Al) is less dense than Tungsten (W) or Molybdenum (Mo), in alternative designs where Titanium or Aluminum is used for the mass load layer, a relatively thicker mass load layer of Titanium (Ti) or Aluminum (Al) is needed to produce the same mass load effect as a mass load layer of Tungsten (W) or Molybdenum (Mo) of a given mass load layer thickness. Moreover, in alternative arrangements both shunt and series resonators may be additionally mass-loaded with considerably thinner mass loading layers (e.g., having thickness of about one tenth of the thickness of a main mass loading layer) in order to achieve specific filter design goals, as may be appreciated by one skilled in the art.

The example resonators 100, 400A through 400G, of FIG. 1A and FIGS. 4A through 4G may include a plurality of lateral features 157, 457A through 457G (e.g., patterned layer 157, 457A through 457G, e.g., step mass features 157, 457A through 457G), sandwiched between two top metal electrode layers (e.g., between the second member 139, 439A through 439G, of the first pair of top metal electrode layers and the first member 141, 441A through 441G, of the second pair of top metal electrode layers) of the top acoustic reflector 115, 415A through 415G. As shown in the figures, the plurality of lateral features 157, 457A through 457G, of patterned layer 157, 457A through 457G may comprise step features 157, 457A through 457G (e.g., step mass features 157, 457A through 457G). As shown in the figures, the plurality of lateral features 157, 457A through 457G, may be arranged proximate to lateral extremities (e.g., proximate to a lateral perimeter) of the top acoustic reflector 115, 415A through 415G. At least one of the lateral features 157, 457A through 457G, may be arranged proximate to where the etched edge region 153, 453A through 453G, extends through the top acoustic reflector 115, 415A through 415G.

After the lateral features 157, 457A through 457G, are formed, they may function as a step feature template, so that subsequent top metal electrode layers formed on top of the lateral features 157, 457A through 457G, may retain step patterns imposed by step features of the lateral features 157, 457A through 457G. For example, the second pair of top metal electrode layers 141, 441A through 441G, 143, 443A through 443G, the third pair of top metal electrode layers 145, 445A through 445C, 147, 447A through 447C, and the fourth pair of top metal electrodes 149, 449A through 449C, 151, 451A through 451C, may retain step patterns imposed by step features of the lateral features 157, 457A through 457G. The plurality of lateral features 157, 457A through 457G, may add a layer of mass loading. The plurality of lateral features 157, 457A through 457G, may be made of a patterned metal layer (e.g., a patterned layer of Tungsten (W), Molybdenum (Mo), Titanium (Ti), or Aluminum (Al)). In alternative examples, the plurality of lateral features 157, 457A through 457G, may be made of a patterned dielectric layer (e.g., a patterned layer of Silicon Nitride (SiN), Silicon Dioxide (SiO2) or Silicon Carbide (SiC)). The plurality of lateral features 157, 457A through 457G, may, but need not, limit parasitic lateral acoustic modes (e.g., facilitate suppression of spurious modes) of the example resonators 100, 400A through 400G. Thickness of the patterned layer of the lateral features 157, 457A through 457G, (e.g., thickness of the patterned layers 157, 457A through 457G) may be adjusted, e.g., determined as desired. For example, for the 24 GHz resonator, thickness may be adjusted within a range from about fifty Angstroms (50 A) to about five hundred Angstroms (500 A). Lateral step width of the lateral features 157, 457A through 457G (e.g., width of the step mass features 157, 457A through 457G) may be adjusted down, for example, from about two microns (2 um). The foregoing may be adjusted to balance a design goal of limiting parasitic lateral acoustic modes (e.g., facilitating suppression of spurious modes) of the example resonators 100, 400A through 400G as well as increasing average quality factor above the series resonance frequency against other design considerations e.g., maintaining desired average quality factor below the series resonance frequency.

In the example bulk acoustic wave resonator 100 shown in FIG. 1A, the patterned layer 157 may comprise Tungsten (W) (e.g., the step mass feature 157 of the patterned layer may comprise Tungsten (W)). A suitable thickness of the patterned layer 157 (e.g., thickness of the step mass feature 157) and lateral width of features of the patterned layer 157 may vary based on various design parameters e.g., material selected for the patterned layer 157, e.g., the desired resonant frequency of the given resonant design, e.g., effectiveness in facilitating spurious mode suppression. For an example 24 GHz design of the bulk acoustic wave resonator 100 shown in FIG. 1A in which the patterned layer comprises Tungsten (W), a suitable thickness of the patterned layer 157 (e.g., thickness of the step mass feature 157) may be 200 Angstroms and lateral width of features of the patterned layer 157 (e.g., lateral width of the step mass feature 157) may be 0.8 microns, may facilitate suppression of the average strength of the spurious modes in the passband by approximately fifty percent (50%), as estimated by simulation relative to similar designs without the benefit of patterned layer 157.

The example resonators 100, 400A through 400G, of FIG. 1A and FIGS. 4A through 4G may include one or more (e.g., one or a plurality of) interposer layers sandwiched between doped piezoelectric layers of the stack 104, 404A through 404G. For example, a first interposer layer 159, 459A through 459G may be sandwiched between the bottom doped piezoelectric layer 105, 405A through 405G, and the first middle doped piezoelectric layer 107, 407A through 407G. For example, a second interposer layer 161, 461A through 461G, may be sandwiched between the first middle doped piezoelectric layer 107, 407A through 407G, and the second middle doped piezoelectric layer 109, 409A through 409G. For example, a third interposer layer 163, 463A through 463G, may be sandwiched between the second middle doped piezoelectric layer 109, 409A through 409G, and the top doped piezoelectric layer 111, 411A through 411G.

One or more (e.g., one or a plurality of) interposer layers may be metal interposer layers. The metal interposer layers may be relatively high acoustic impedance metal interposer layers (e.g., using relatively high acoustic impedance metals such as Tungsten (W) or Molybdenum (Mo)). Such metal interposer layers may (but need not) flatten stress distribution across adjacent doped piezoelectric layers, and may (but need not) raise effective electromechanical coupling coefficient (Kt2) of adjacent doped piezoelectric layers.

Alternatively or additionally, one or more (e.g., one or a plurality of) interposer layers may be dielectric interposer layers. The dielectric of the dielectric interposer layers may be a dielectric that has a positive acoustic velocity temperature coefficient, so acoustic velocity increases with increasing temperature of the dielectric. The dielectric of the dielectric interposer layers may be, for example, silicon dioxide. Dielectric interposer layers may, but need not, facilitate compensating for frequency response shifts with increasing temperature. Most materials (e.g., metals, e.g., dielectrics) generally have a negative acoustic velocity temperature coefficient, so acoustic velocity decreases with increasing temperature of such materials. Accordingly, increasing device temperature generally causes response of resonators and filters to shift downward in frequency. Including dielectric (e.g., silicon dioxide) that instead has a positive acoustic velocity temperature coefficient may facilitate countering or compensating (e.g., temperature compensating) this downward shift in frequency with increasing temperature. Alternatively or additionally, one or more (e.g., one or a plurality of) interposer layers may comprise metal and dielectric for respective interposer layers. For example, high acoustic impedance metal layer such as Tungsten (W) or Molybdenum (Mo) may (but need not) raise effective electromechanical coupling coefficient (Kt2). Subsequently deposited amorphous dielectric layer such as Silicon Dioxide (SiO2) may (but need not) facilitate compensating temperature dependent frequency shifts. Alternatively or additionally, one or more (e.g., one or a plurality of) interposer layers may comprise different metals for respective interposer layers. For example, high acoustic impedance metal layer such as Tungsten (W) or Molybdenum (Mo) may (but need not) raise effective electromechanical coupling coefficient (Kt2) while subsequently deposited metal layer with hexagonal symmetry such as Titanium (Ti) may (but need not) facilitate higher crystallographic quality of subsequently deposited doped piezoelectric layer. Alternatively or additionally, one or more (e.g., one or a plurality of) interposer layers may comprise different dielectrics for respective interposer layers. For example, high acoustic impedance dielectric layer such as Hafnium Dioxide (HfO2) may (but need not) raise effective electromechanical coupling coefficient (Kt2). Subsequently deposited amorphous dielectric layer such as Silicon Dioxide (SiO2) may (but need not) facilitate compensating for frequency dependent frequency shifts.

In addition to the foregoing application of metal interposer layers to raise effective electromechanical coupling coefficient (Kt2) of adjacent doped piezoelectric layers, and the application of dielectric interposer layers to facilitate compensating for frequency response shifts with increasing temperature, interposer layers may, but need not, increase quality factor (Q-factor) and/or suppress irregular spectral response patterns characterized by sharp reductions in Q-factor known as "rattles". Q-factor of a resonator is a figure of merit in which increased Q-factor indicates a lower rate of energy loss per cycle relative to the stored energy of the resonator. Increased Q-factor in resonators used in filters results in lower insertion loss and sharper roll-off in filters. The irregular spectral response patterns characterized by sharp reductions in Q-factor known as "rattles" may cause ripples in filter pass bands.

Metal and/or dielectric interposer layer of suitable thicknesses and acoustic material properties (e.g., velocity, density) may be placed at appropriate places in the stack 104, 404A through 404G, of doped piezoelectric layers, for example, proximate to the nulls of acoustic energy distribution in the stacks (e.g., between interfaces of doped piezoelectric layers of opposing axis orientation). Finite Element Modeling (FEM) simulations and varying parameters in fabrication prior to subsequent testing may help to optimize interposer layer designs for the stack. Thickness of interposer layers may, but need not, be adjusted, e.g., determined as desired, to influence increased Q-factor and/or rattle suppression. It is theorized that if the interposer layer is too thin there is no substantial effect. Thus minimum thickness for the interposer layer may be about one monolayer, or about five Angstroms (5 A). Alternatively, if the interposer layer is too thick, rattle strength may increase rather than being suppressed. Accordingly, an upper limit of interposer thickness may be about five-hundred Angstroms (500 A) for a twenty-four Gigahertz (24 GHz) resonator design, with limiting thickness scaling inversely with frequency for alternative resonator designs. It is theorized that below a series resonant frequency of resonators, Fs, Q-factor may not be systematically and significantly affected by including a single interposer layer. However, it is theorized that there may, but need not, be significant increases in Q-factor, for example from about two thousand (2,000) to about three thousand (3,000), for inclusion of two or more interposer layers.

In the example resonators 100, 400A through 400C, of FIG. 1A and FIGS. 4A through 4C, a planarization layer 165, 465A through 465C may be included. A suitable material may be used for planarization layer 165, 465A through 465C, for example Silicon Dioxide (SiO2), Hafnium Dioxide (HfO2), polyimide, or BenzoCyclobutene (BCB). An isolation layer 167, 467A through 467C, may also be included and arranged over the planarization layer 165, 465A-465C. A suitable low dielectric constant (low-k), low acoustic impedance (low-Za) material may be used for the isolation layer 167, 467A through 467C, for example polyimide, or BenzoCyclobutene (BCB).

In the example resonators 100, 400A through 400G, of FIG. 1A and FIGS. 4A through 4G, a bottom electrical interconnect 169, 469A through 469G, may be included to interconnect electrically with (e.g., electrically contact with) the bottom acoustic reflector 113, 413A through 413G, stack of the plurality of bottom metal electrode layers. A top electrical interconnect 171, 471A through 471G, may be included to interconnect electrically with the top acoustic reflector 115, 415A through 415G, stack of the plurality of top metal electrode layers. A suitable material may be used for the bottom electrical interconnect 169, 469A through 469G, and the top electrical interconnect 171, 471A through 471G, for example, gold (Au). Top electrical interconnect 171, 471A through 471G may be substantially acoustically isolated from the stack 104, 404A through 404G of the example four layers of piezoelectric material by the top multilayer metal acoustic reflector electrode 115, 415A through 415G. Top electrical interconnect 171, 471A through 471G may have dimensions selected so that the top electrical interconnect 171, 471A through 471G approximates a fifty ohm electrical transmission line at the main resonant frequency of the bulk acoustic wave resonator 100, 400A through 400G. Top electrical interconnect 171, 471A through 471G may have a thickness that is substantially thicker than a thickness of a pair of top metal electrode layers of the top multilayer metal acoustic reflector electrode 115, 415A through 415G (e.g., thicker than thickness of the first pair of top metal electrode layers 137, 437A through 437G, 139, 439A through 439G). Top electrical interconnect 171, 471A through 471G may have a thickness within a range from about one hundred Angstroms (100 A) to about five micrometers (5 um). For example, top electrical interconnect 171, 471A through 471G may have a thickness of about two thousand Angstroms (2000A).

Figure 1B:
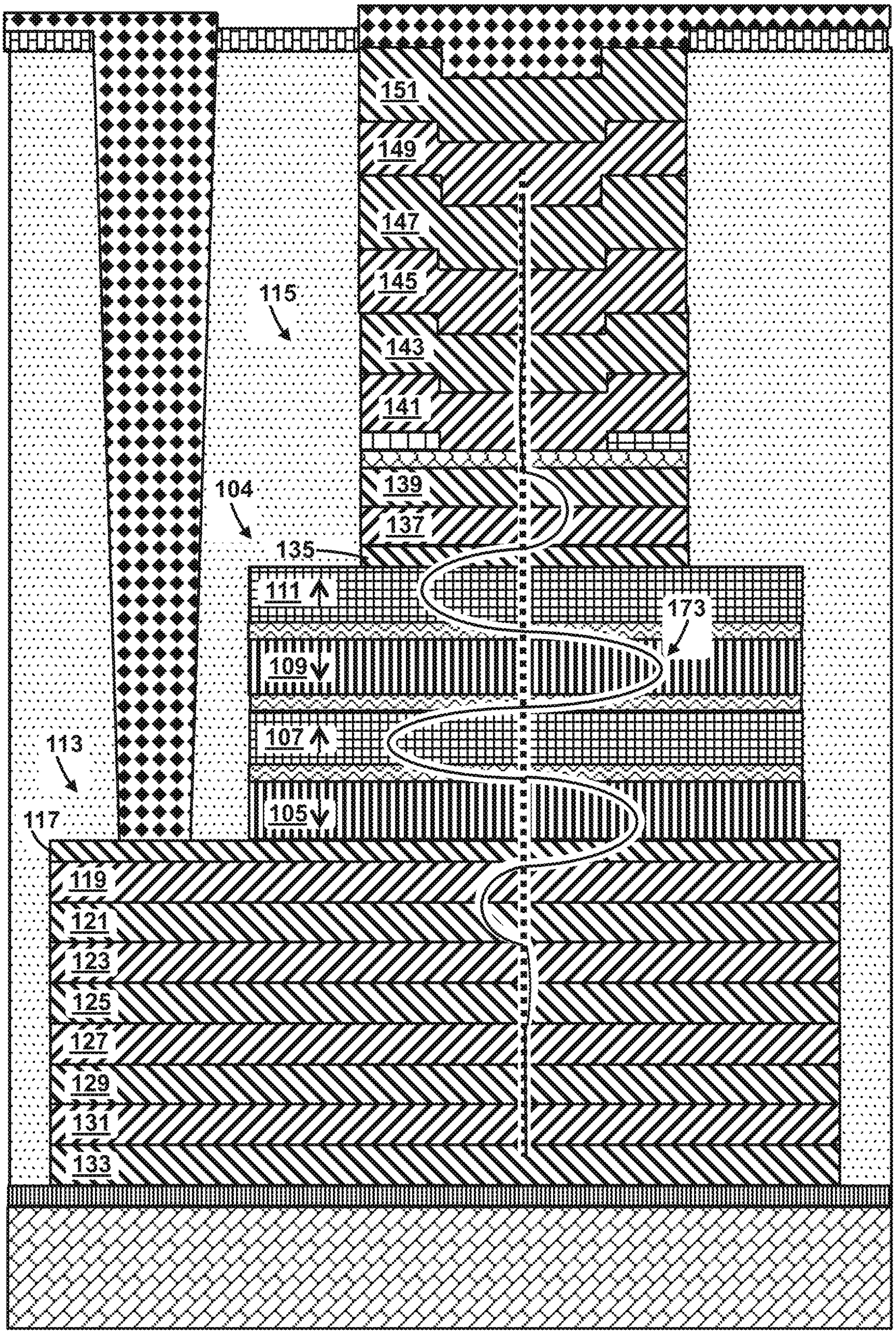
FIG. 1B is a simplified view of FIG. 1A that illustrates acoustic stress profile during electrical operation of the bulk acoustic wave resonator structure shown in FIG. 1A.

FIG. 1B is a simplified view of FIG. 1A that illustrates an example of acoustic stress distribution during electrical operation of the bulk acoustic wave resonator structure shown in FIG. 1A. A notional curved line schematically depicts vertical (Tzz) stress distribution 173 through stack 104 of the example four doped piezoelectric layers, 105, 107, 109, 111. The stress 173 is excited by the oscillating electric field applied via the top acoustic reflector 115 stack of the plurality of top metal electrode layers 135, 137, 139, 141, 143, 145, 147, 149, 151, and the bottom acoustic reflector 113 stack of the plurality of bottom metal electrode layers 117, 119, 121, 123, 125, 127, 129, 131, 133. The stress 173 has maximum values inside the stack 104 of doped piezoelectric layers, while exponentially tapering off within the top acoustic reflector 115 and the bottom acoustic reflector 113. Notably, acoustic energy confined in the resonator structure 100 is proportional to stress magnitude.

As discussed previously herein, the example four doped piezoelectric layers, 105, 107, 109, 111 in the stack 104 may have an alternating axis arrangement in the stack 104. For example the bottom doped piezoelectric layer 105 may have the normal axis orientation, which is depicted in FIG. 1B using the downward directed arrow. Next in the alternating axis arrangement of the stack 104, the first middle doped piezoelectric layer 107 may have the reverse axis orientation, which is depicted in FIG. 1B using the upward directed arrow. Next in the alternating axis arrangement of the stack 104, the second middle doped piezoelectric layer 109 may have the normal axis orientation, which is depicted in FIG. 1B using the downward directed arrow. Next in the alternating axis arrangement of the stack 104, the top doped piezoelectric layer 111 may have the reverse axis orientation, which is depicted in FIG. 1B using the upward directed arrow. For the alternating axis arrangement of the stack 104, stress 173 excited by the applied oscillating electric field causes normal axis doped piezoelectric layers (e.g., bottom and second middle doped piezoelectric layers 105, 109) to be in compression, while reverse axis doped piezoelectric layers (e.g., first middle and top doped piezoelectric layers 107, 111) to be in extension. Accordingly, FIG. 1B shows peaks of stress 173 on the right side of the heavy dashed line to depict compression in normal axis doped piezoelectric layers (e.g., bottom and second middle doped piezoelectric layers 105, 109), while peaks of stress 173 are shown on the left side of the heavy dashed line to depict extension in reverse axis doped piezoelectric layers (e.g., first middle and top doped piezoelectric layers 107, 111).

Figure 1C:
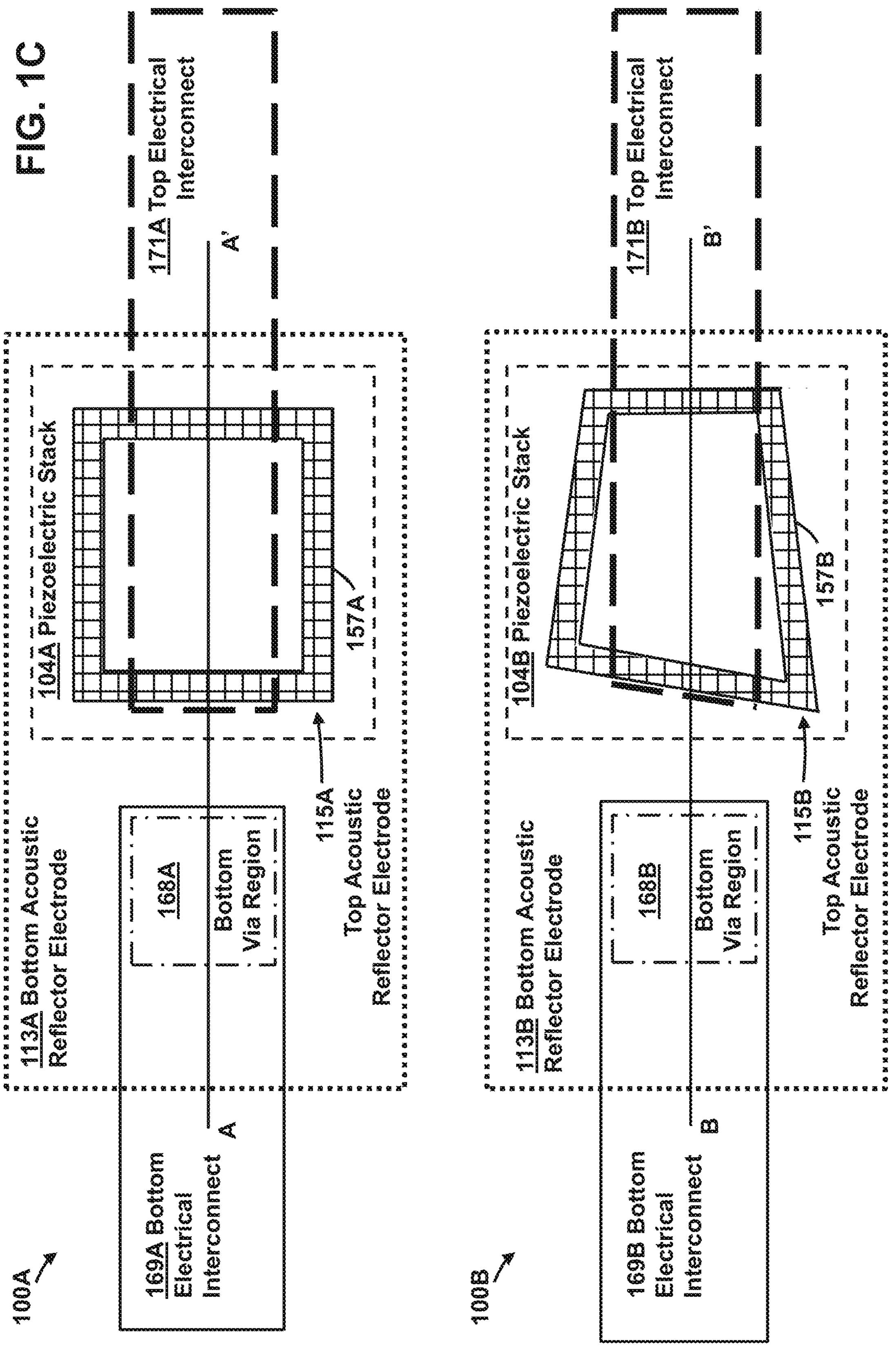
FIG. 1C shows a simplified top plan view of a bulk acoustic wave resonator structure corresponding to the cross sectional view of FIG. 1A, and also shows another simplified top plan view of an alternative bulk acoustic wave resonator structure.

FIG. 1C shows a simplified top plan view of a bulk acoustic wave resonator structure 100A corresponding to the cross sectional view of FIG. 1A, and also shows another simplified top plan view of an alternative bulk acoustic wave resonator structure 100B. The bulk acoustic wave resonator structure 100A includes the stack 104A of four layers of piezoelectric material e.g., having the alternating piezoelectric axis arrangement of the four layers of piezoelectric material. The stack 104A of piezoelectric layers may be sandwiched between the bottom acoustic reflector electrode 113A and the top acoustic reflector electrode 115A. The bottom acoustic reflector electrode may comprise the stack of the plurality of bottom metal electrode layers of the bottom acoustic reflector electrode 113A, e.g., having the alternating arrangement of low acoustic impedance bottom metal electrode layers and high acoustic impedance bottom metal layers. Similarly, the top acoustic reflector electrode 115A may comprise the stack of the plurality of top metal electrode layers of the top acoustic reflector electrode 115A, e.g., having the alternating arrangement of low acoustic impedance top metal electrode layers and high acoustic impedance top metal electrode layers. The top acoustic reflector electrode 115A may include a patterned layer 157A. The patterned layer 157A may approximate a frame shape (e.g., rectangular frame shape) proximate to a perimeter (e.g., rectangular perimeter) of top acoustic reflector electrode 115A as shown in simplified top plan view in FIG. 1C. This patterned layer 157A, e.g., approximating the rectangular frame shape in the simplified top plan view in FIG. 1C, corresponds to the patterned layer 157 shown in simplified cross sectional view in FIG. 1A. Top electrical interconnect 171A extends over (e.g., electrically contacts) top acoustic reflector electrode 115A. Bottom electrical interconnect 169A extends over (e.g., electrically contacts) bottom acoustic reflector electrode 113A through bottom via region 168A.

FIG. 1C also shows another simplified top plan view of an alternative bulk acoustic wave resonator structure 100B. Similarly, the bulk acoustic wave resonator structure 100B includes the stack 104B of four layers of piezoelectric material e.g., having the alternating piezoelectric axis arrangement of the four layers of piezoelectric material. The stack 104B of piezoelectric layers may be sandwiched between the bottom acoustic reflector electrode 113B and the top acoustic reflector electrode 115B. The bottom acoustic reflector electrode may comprise the stack of the plurality of bottom metal electrode layers of the bottom acoustic reflector electrode 113B, e.g., having the alternating arrangement of low acoustic impedance bottom metal electrode layers and high acoustic impedance bottom metal layers. Similarly, the top acoustic reflector electrode 115B may comprise the stack of the plurality of top metal electrode layers of the top acoustic reflector electrode 115B, e.g., having the alternating arrangement of low acoustic impedance top metal electrode layers and high acoustic impedance top metal electrode layers. The top acoustic reflector electrode 115B may include a patterned layer 157B. The patterned layer 157B may approximate a frame shape (e.g., apodized frame shape) proximate to a perimeter (e.g., apodized perimeter) of top acoustic reflector electrode 115B as shown in simplified top plan view in FIG. 1C. The apodized frame shape may be a frame shape in which substantially opposing extremities are not parallel to one another. This patterned layer 157B, e.g., approximating the apodized frame shape in the simplified top plan view in FIG. 1C, is an alternative embodiment corresponding to the patterned layer 157 shown in simplified cross sectional view in FIG. 1A. Top electrical interconnect 171B extends over (e.g., electrically contacts) top acoustic reflector electrode 115B. Bottom electrical interconnect 169B extends over (e.g., electrically contacts) bottom acoustic reflector electrode 113B through bottom via region 168B.

Figure 1E:
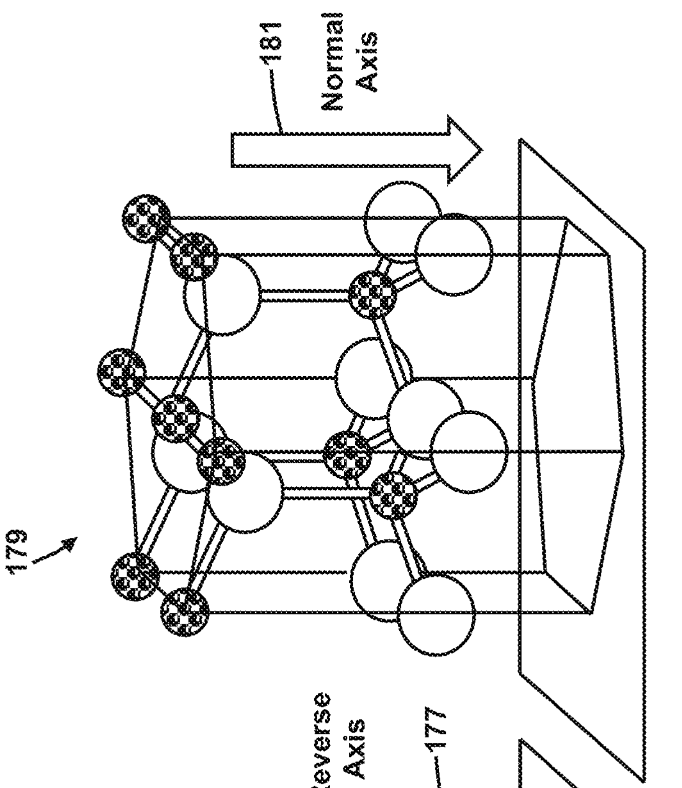
FIG. 1E is a perspective view of an illustrative model of a crystal structure of AlN for use in doped piezoelectric material of layers in FIG. 1A having normal axis orientation of positive polarization.
Figure 1D:
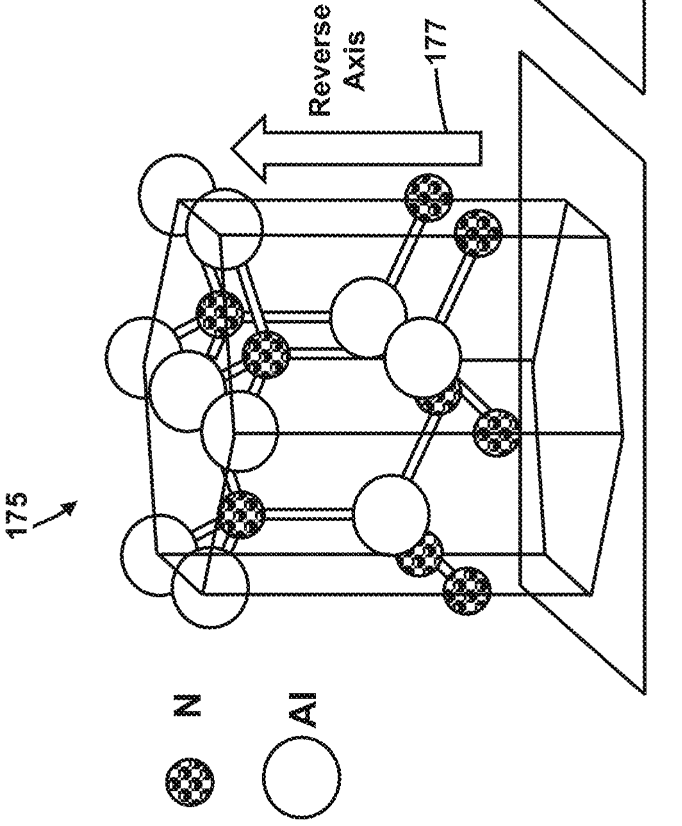
FIG. 1D is a perspective view of an illustrative model of a crystal structure of AlN for use in doped piezoelectric material of layers in FIG. 1A having reverse axis orientation of negative polarization.

In FIGS. 1D and 1E, Nitrogen (N) atoms are depicted with a hatching style, while Aluminum (Al) atoms are depicted without a hatching style. FIG. 1D is a perspective view of an illustrative model of a reverse axis crystal structure 175 of Aluminum Nitride, AlN, for use in doped piezoelectric material of layers in FIG. 1A, e.g., having reverse axis orientation of negative polarization. For example, first middle and top doped piezoelectric layers 107, 111 discussed previously herein with respect to FIGS. 1A and 1B are reverse axis doped piezoelectric layers. By convention, when the first layer of normal axis crystal structure 175 is a Nitrogen, N, layer and second layer in an upward direction (in the depicted orientation) is an Aluminum, Al, layer, the Aluminum Nitride piezoelectric material including the reverse axis crystal structure 175 is said to have crystallographic c-axis negative polarization, or reverse axis orientation as indicated by the upward pointing arrow 177. For example, polycrystalline thin film Aluminum Nitride, AlN, (or doped polycrystalline thin film Aluminum Nitride, AlN,) may be grown in the crystallographic c-axis negative polarization, or reverse axis, orientation perpendicular relative to the substrate surface using reactive magnetron sputtering of an aluminum target in a nitrogen atmosphere, and by introducing oxygen into the gas atmosphere of the reaction chamber during fabrication at the position where the flip to the reverse axis is desired. This may be done along with reactive magnetron co-sputtering of one or more doping targets. An inert gas, for example, Argon may also be included in a sputtering gas atmosphere, along with the nitrogen and oxygen.

For example, a predetermined amount of oxygen containing gas may be added to the gas atmosphere over a short predetermined period of time or for the entire time the reverse axis doped piezoelectric layer is being deposited. The oxygen containing gas may be diatomic oxygen containing gas, such as oxygen (O2). Proportionate amounts of the Nitrogen gas (N2) and the inert gas may flow, while the predetermined amount of oxygen containing gas flows into the gas atmosphere over the predetermined period of time. For example, N2 and Ar gas may flow into the reaction chamber in approximately a 3:1 ratio of N2 to Ar, as oxygen gas also flows into the reaction chamber. For example, the predetermined amount of oxygen containing gas added to the gas atmosphere may be in a range from about a thousandth of a percent (0.001%) to about ten percent (10%), of the entire gas flow. The entire gas flow may be a sum of the gas flows of argon, nitrogen and oxygen, and the predetermined period of time during which the predetermined amount of oxygen containing gas is added to the gas atmosphere may be in a range from about a quarter (0.25) second to a length of time needed to create an entire layer, for example. For example, based on mass-flows, the oxygen composition of the gas atmosphere may be about 2 percent when the oxygen is briefly injected. This may result in an aluminum oxynitride (ALON) portion of the final monolithic doped piezoelectric layer, integrated in the Aluminum Nitride, AlN, material, having a thickness in a range of about 5 nm to about 20 nm, which may be relatively oxygen rich and very thin. Alternatively, the entire reverse axis doped piezoelectric layer may include aluminum oxynitride.

FIG. 1E is a perspective view of an illustrative model of a normal axis crystal structure 179 of Aluminum Nitride, AlN, for use in doped piezoelectric material of layers in FIG. 1A, e.g., having normal axis orientation of positive polarization. For example, bottom and second middle doped piezoelectric layers 105, 109 discussed previously herein with respect to FIGS. 1A and 1B are normal axis doped piezoelectric layers. By convention, when the first layer of the reverse axis crystal structure 179 is an Al layer and second layer in an upward direction (in the depicted orientation) is an N layer, the piezoelectric material including the reverse axis crystal structure 179 is said to have a c-axis positive polarization, or normal axis orientation as indicated by the downward pointing arrow 181. For example, polycrystalline thin film Aluminum Nitride, AlN. (and polycrystalline thin film doped Aluminum Nitride, AlN) may be grown in the crystallographic c-axis positive polarization, or normal axis, orientation perpendicular relative to the substrate surface by using reactive magnetron sputtering of an Aluminum target in a nitrogen atmosphere. This may be done along with reactive magnetron co-sputtering of one or more doping targets. Accordingly, the polycrysaline thin film Aluminum Nitride, AlN having normal axis or reverse axis may be doped.

Figure 2A:
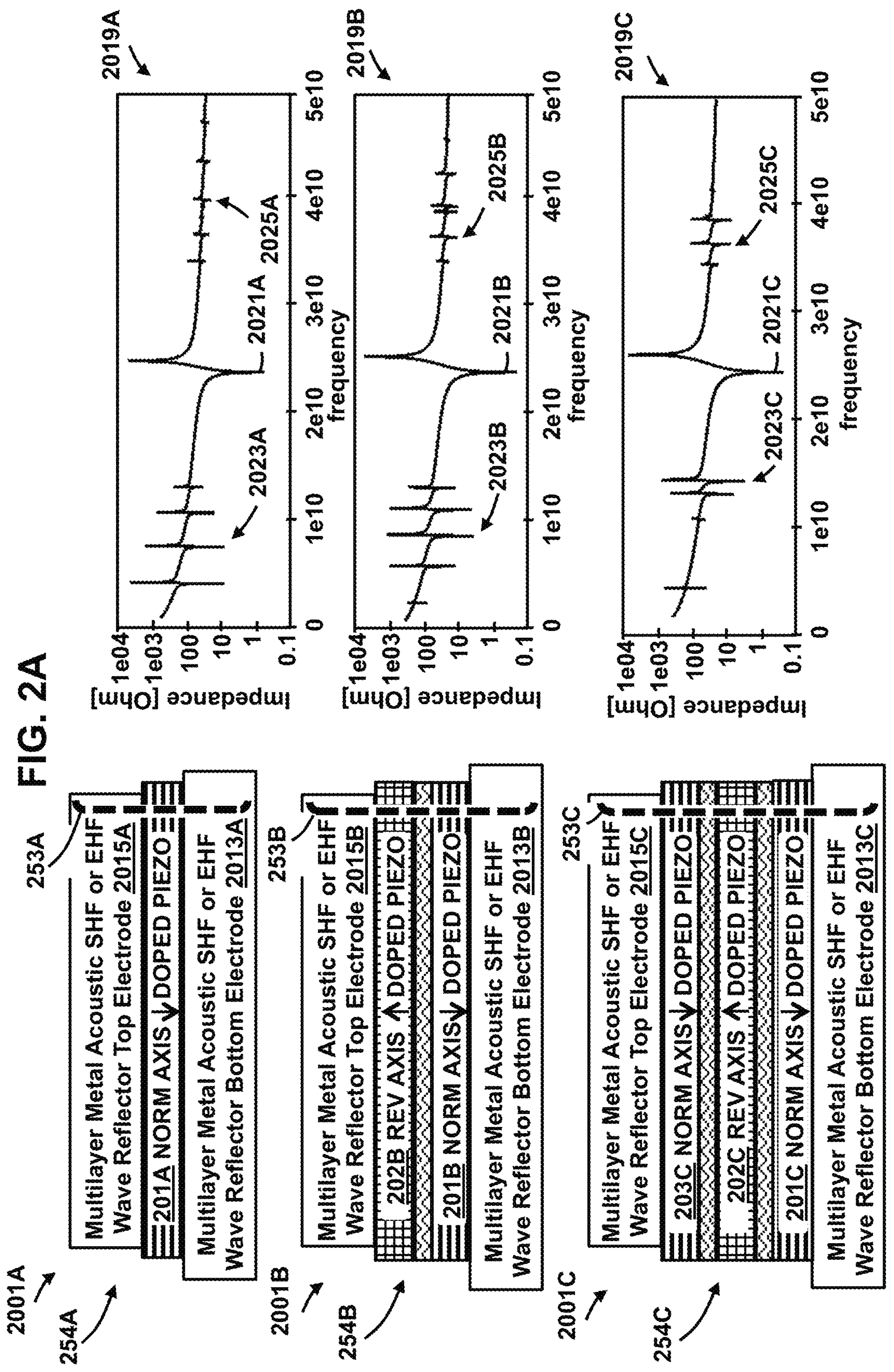
FIGS. 2A and 2B show a further simplified view of a bulk acoustic wave resonator similar to the bulk acoustic wave resonator structure shown in FIG. 1A along with its corresponding impedance versus frequency response during its electrical operation, as well as alternative bulk acoustic wave resonator structures with differing numbers of alternating axis doped piezoelectric layers, and their respective corresponding impedance versus frequency response during electrical operation, as predicted by simulation.
Figure 2B:
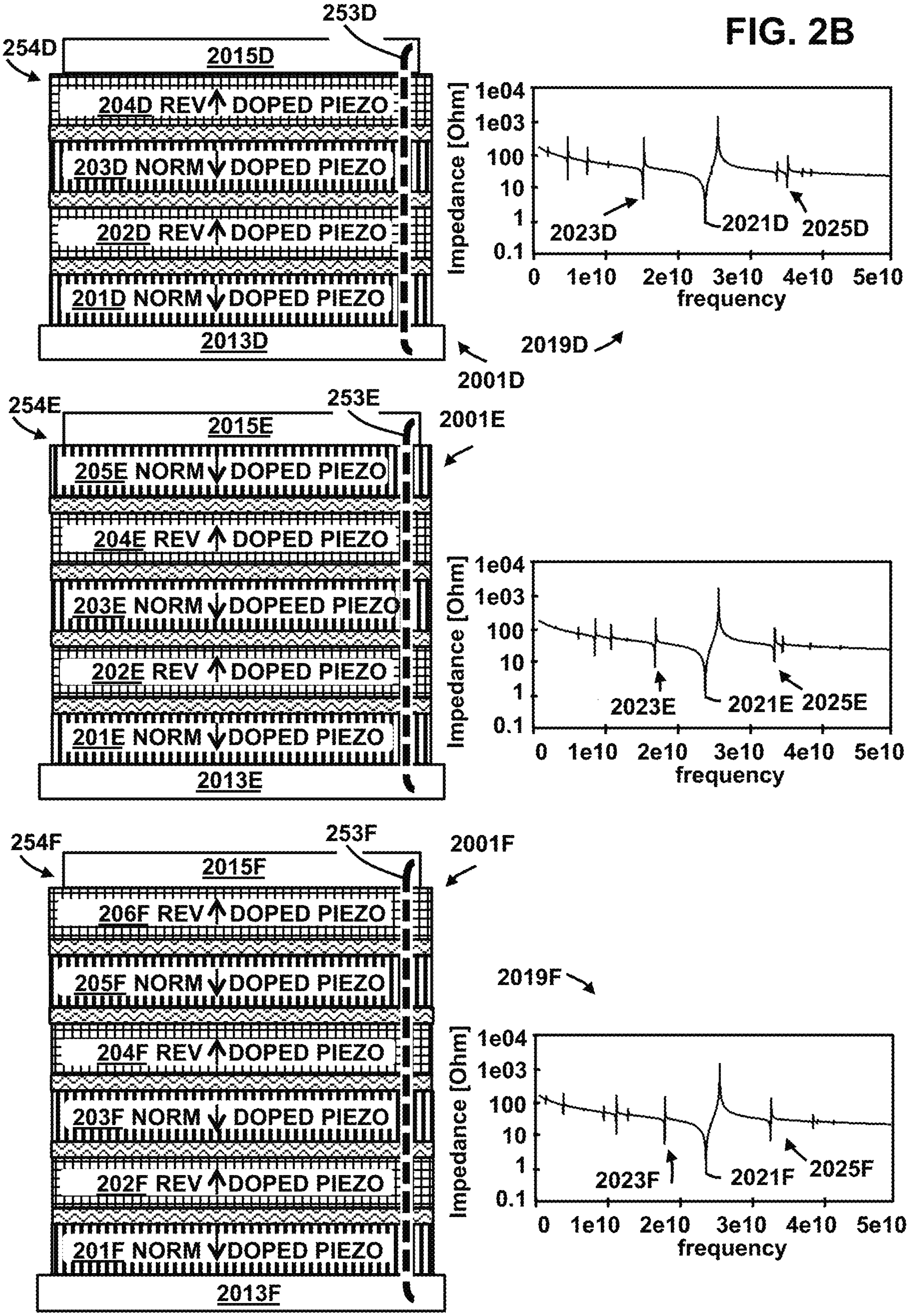
Figure 2C:
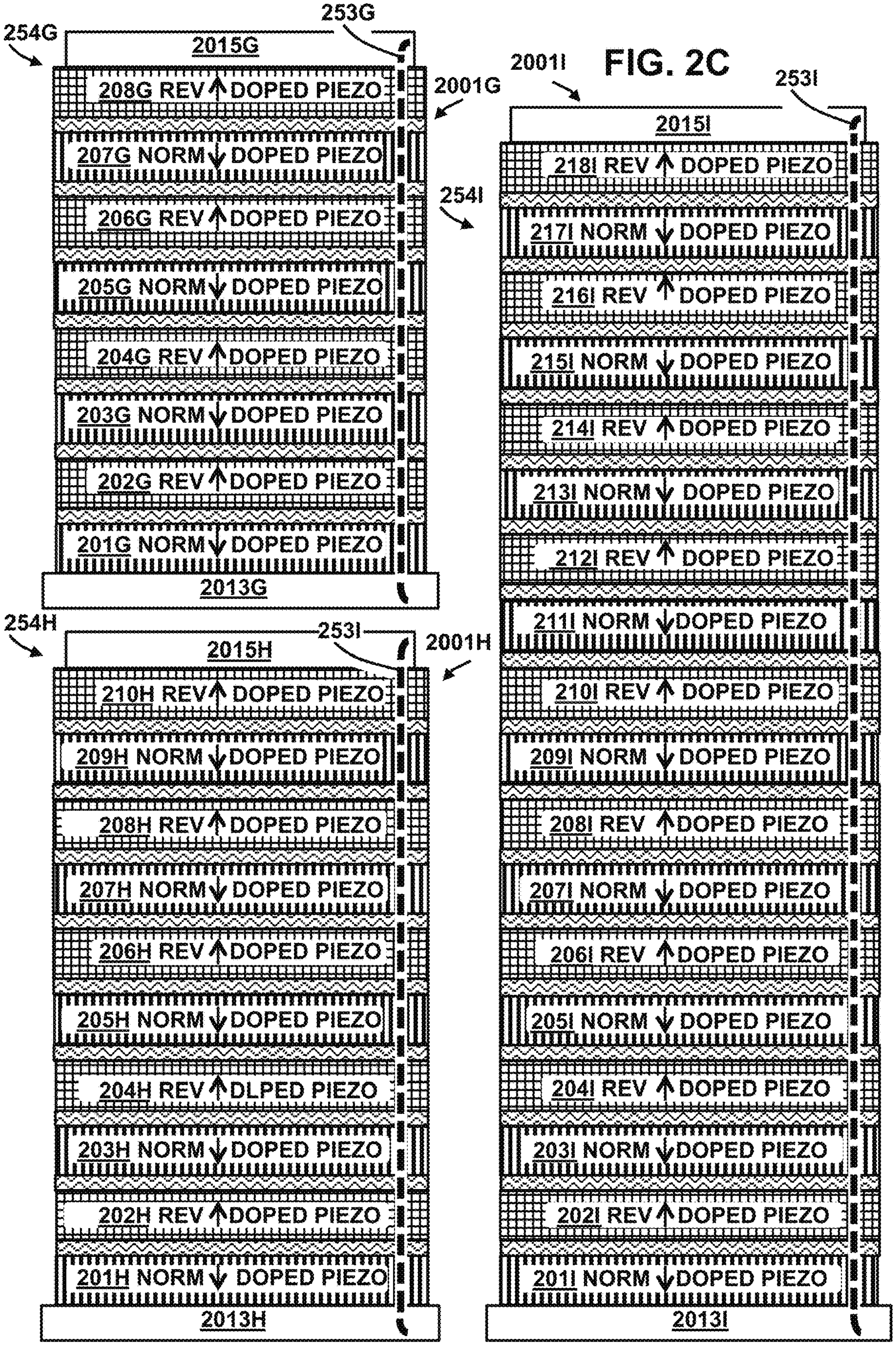
FIG. 2C shows additional alternative bulk acoustic wave resonator structures with additional numbers of alternating axis doped piezoelectric layers.

FIGS. 2A and 2B show a further simplified view of a bulk acoustic wave resonator similar to the bulk acoustic wave resonator structure shown in FIG. 1A along with its corresponding impedance versus frequency response during its electrical operation, as well as alternative bulk acoustic wave resonator structures with differing numbers of alternating axis doped piezoelectric layers, and their respective corresponding impedance versus frequency response during electrical operation. FIG. 2C shows additional alternative bulk acoustic wave resonator structures with additional numbers of alternating axis doped piezoelectric layers. Bulk acoustic wave resonators 2001A through 2001I may, but need not be, bulk acoustic millimeter wave resonators 2001A through 2001I, operable with a main resonance mode having a main resonant frequency that is a millimeter wave frequency (e.g., twenty-four Gigahertz, 24 GHz) in a millimeter wave frequency band. As defined herein, millimeter wave means a wave having a frequency within a range extending from eight Gigahertz (8 GHz) to three hundred Gigahertz (300 GHz), and millimeter wave band means a frequency band spanning this millimeter wave frequency range from eight Gigahertz (8 GHz) to three hundred Gigahertz (300 GHz). Bulk acoustic wave resonators 2001A through 2001I may, but need not be, bulk acoustic Super High Frequency (SHF) wave resonators 2001A through 2001I or bulk acoustic Extremely High Frequency (EHF) wave resonators 2001A through 2001I, as the terms Super High Frequency (SHF) and Extremely High Frequency (EHF) are defined by the International Telecommunications Union (ITU). For example, bulk acoustic wave resonators 2001A through 2001I may be bulk acoustic Super High Frequency (SHF) wave resonators 2001A through 2001I operable with a main resonance mode having a main resonant frequency that is a Super High Frequency (SHF) (e.g., twenty-four Gigahertz, 24 GHz) in a Super High Frequency (SHF) wave frequency band. As discussed previously herein, piezoelectric layer thicknesses may be selected to determine the main resonant frequency of bulk acoustic Super High Frequency (SHF) wave resonators 2001A through 2001I in the Super High Frequency (SHF) wave band (e.g., twenty-four Gigahertz, 24 GHz main resonant frequency). Similarly, layer thicknesses of Super High Frequency (SHF) reflector layers (e.g., layer thickness of multilayer metal acoustic SHF wave reflector bottom electrodes 2013A through 2013I, e.g., layer thickness of multilayer metal acoustic SHF wave reflector top electrodes 2015A through 2015I) may be selected to determine peak acoustic reflectivity of such SHF reflectors at a frequency, e.g., peak reflectivity resonant frequency, within the Super High Frequency (SHF) wave band (e.g., a twenty-four Gigahertz, 24 GHz peak reflectivity resonant frequency). Alternatively, bulk acoustic wave resonators 2001A through 2001I may be bulk acoustic Extremely High Frequency (EHF) wave resonators 2001A through 2001I operable with a main resonance mode having a main resonant frequency that is an Extremely High Frequency (EHF) wave band (e.g., thirty-nine Gigahertz, 39 GHz main resonant frequency) in an Extremely High Frequency (EHF) wave frequency band. As discussed previously herein, piezoelectric layer thicknesses may be selected to determine the main resonant frequency of bulk acoustic Extremely High Frequency (EHF) wave resonators 2001A through 2001I in the Extremely High Frequency (EHF) wave band (e.g., thirty-nine Gigahertz, 39 GHz main resonant frequency). Similarly, layer thicknesses of Extremely High Frequency (EHF) reflector layers (e.g., layer thickness of multilayer metal acoustic EHF wave reflector bottom electrodes 2013A through 2013I, e.g., layer thickness of multilayer metal acoustic EHF wave reflector top electrodes 2015A through 2015I) may be selected to determine peak acoustic reflectivity of such EHF reflectors at a frequency, e.g., peak reflectivity resonant frequency, within the Extremely High Frequency (EHF) wave band (e.g., a thirty-nine Gigahertz, 39 GHz peak reflectivity resonant frequency). The general structures of the multilayer metal acoustic reflector top electrode and the multilayer metal acoustic reflector bottom electrode have already been discussed previously herein with respect of FIGS. 1A and 1B. As already discussed, these structures are directed to respective pairs of metal electrode layers, in which a first member of the pair has a relatively low acoustic impedance (relative to acoustic impedance of an other member of the pair), in which the other member of the pair has a relatively high acoustic impedance (relative to acoustic impedance of the first member of the pair), and in which the respective pairs of metal electrode layers have layer thicknesses corresponding to one quarter wavelength (e.g., one quarter acoustic wavelength) at a main resonant frequency of the resonator. Accordingly, it should be understood that the bulk acoustic SHF or EHF wave resonators 2001A, 2001B, 2000C shown in FIG. 2A include respective multilayer metal acoustic SHF or EHF wave reflector top electrodes 2015A, 2015B, 2015C and multilayer metal acoustic SHF or EHF wave reflector bottom electrodes 2013A, 2013B, 2013C, in which the respective pairs of metal electrode layers have layer thicknesses corresponding to a quarter wavelength (e.g., one quarter of an acoustic wavelength) at a SHF or EHF wave main resonant frequency of the respective bulk acoustic SHF or EHF wave resonator 2001A, 2001B, 2001C.

Shown in FIG. 2A is a bulk acoustic SHF or EHF wave resonator 2001A including a normal axis doped piezoelectric layer 201A sandwiched between multilayer metal acoustic SHF or EHF wave reflector top electrode 2015A and multilayer metal acoustic SHF or EHF wave reflector bottom electrode 2013A. Also shown in FIG. 2A is a bulk acoustic SHF or EHF wave resonator 2001B including a normal axis doped piezoelectric layer 201B and a reverse axis doped piezoelectric layer 202B arranged in a two doped piezoelectric layer alternating stack arrangement sandwiched between multilayer metal acoustic SHF or EHF wave reflector top electrode 2015B and multilayer metal acoustic SHF or EHF wave reflector bottom electrode 2013B. A bulk acoustic SHF or EHF wave resonator 2001C includes a normal axis doped piezoelectric layer 201C, a reverse axis doped piezoelectric layer 202C, and another normal axis doped piezoelectric layer 203C arranged in a three doped piezoelectric layer alternating stack arrangement sandwiched between multilayer metal acoustic SHF or EHF wave reflector top electrode 2015C and multilayer metal acoustic SHF or EHF wave reflector bottom electrode 2013C.

Included in FIG. 2B is bulk acoustic SHF or EHF wave resonator 2001D in a further simplified view similar to the bulk acoustic wave resonator structure shown in FIGS. 1A and 1B and including a normal axis doped piezoelectric layer 201D, a reverse axis doped piezoelectric layer 202D, and another normal axis doped piezoelectric layer 203D, and another reverse axis doped piezoelectric layer 204D arranged in a four doped piezoelectric layer alternating stack arrangement sandwiched between multilayer metal acoustic SHF or EHF wave reflector top electrode 2015D and multilayer metal acoustic SHF or EHF wave reflector bottom electrode 2013D. A bulk acoustic SHF or EHF wave resonator 2001E includes a normal axis doped piezoelectric layer 201E, a reverse axis doped piezoelectric layer 202E, another normal axis doped piezoelectric layer 203E, another reverse axis doped piezoelectric layer 204E, and yet another normal axis doped piezoelectric layer 205E arranged in a five doped piezoelectric layer alternating stack arrangement sandwiched between multilayer metal acoustic SHF or EHF wave reflector top electrode 2015E and multilayer metal acoustic SHF or EHF wave reflector bottom electrode 2013E. A bulk acoustic SHF or EHF wave resonator 2001F includes a normal axis doped piezoelectric layer 201F, a reverse axis doped piezoelectric layer 202F, another normal axis doped piezoelectric layer 203F, another reverse axis doped piezoelectric layer 204F, yet another normal axis doped piezoelectric layer 205F, and yet another reverse axis doped piezoelectric layer 206F arranged in a six doped piezoelectric layer alternating stack arrangement sandwiched between multilayer metal acoustic SHF or EHF wave reflector top electrode 2015F and multilayer metal acoustic SHF or EHF wave reflector bottom electrode 2013F.

In FIG. 2A, shown directly to the right of the bulk acoustic SHF or EHF wave resonator 2001A including the normal axis doped piezoelectric layer 201A, is a corresponding diagram 2019A depicting its impedance versus frequency response during its electrical operation, as predicted by simulation. The diagram 2019A depicts the main resonant peak 2021A of the main resonant mode of the bulk acoustic SHF or EHF wave resonator 2001A at its main resonant frequency (e.g., its 24 GHz series resonant frequency). The diagram 2019A also depicts the satellite resonance peaks 2023A, 2025A of the satellite resonant modes of the bulk acoustic SHF or EHF wave resonator 2001A at satellite frequencies above and below the main resonant frequency 2021A (e.g., above and below the 24 GHz series resonant frequency). Relatively speaking, the main resonant mode corresponding to the main resonance peak 2021A is the strongest resonant mode because it is stronger than all other resonant modes of the resonator 2001A, (e.g., stronger than the satellite modes corresponding to relatively lesser satellite resonance peaks 2023A, 2025A).

Similarly, in FIGS. 2A and 2B, shown directly to the right of the bulk acoustic SHF or EHF wave resonators 2001B through 2001F are respective corresponding diagrams 2019B through 2019F depicting corresponding impedance versus frequency response during electrical operation, as predicted by simulation. The diagrams 2019B through 2019F depict respective main resonant peaks 2021B through 2021F of respective corresponding main resonant modes of bulk acoustic SHF or EHF wave resonators 2001B through 2001F at respective corresponding main resonant frequencies (e.g., respective 24 GHz series resonant frequencies). The diagrams 2019B through 2019F also depict respective satellite resonance peaks 2023B through 2023F, 2025B through 2025F of respective corresponding satellite resonant modes of the bulk acoustic SHF or EHF wave resonators 2001B through 2001F at respective corresponding satellite frequencies above and below the respective corresponding main resonant frequencies 2021B through 2021F (e.g., above and below the corresponding respective 24 GHz series resonant frequencies). Relatively speaking, for the corresponding respective main resonant modes, its corresponding respective main resonance peak 2021B through 2021F is the strongest for its bulk acoustic SHF or EHF wave resonators 2001B through 2001F (e.g., stronger than the corresponding respective satellite modes and corresponding respective lesser satellite resonance peaks 2023B, 2025B).

For the bulk acoustic SHF or EHF wave resonator 2001F having the alternating axis stack of six doped piezoelectric layers, simulation of the 24 GHz design estimated an average passband quality factor of approximately one thousand and seven hundred (1,700). Scaling this 24 Ghz, six doped piezoelectric layer design to a 37 Ghz, six piezoelectric layer design, may have an average passband quality factor of approximately one thousand and three hundred (1,300) as estimated by simulation. Scaling this 24 Ghz, six piezoelectric layer design to a 77 Ghz, six piezoelectric layer design, may have an average passband quality factor of approximately seven hundred (730) as estimated by simulation. The International Telecommunication Union (ITU) defines the super high frequency band as extending between three Gigahertz (3 GHz) and thirty Gigahertz (30 GHz). The ITU extremely high frequency band is defined as extending between thirty Gigahertz (30 GHz) and three hundred Gigahertz (300 GHz). The 24 GHz design of the example bulk acoustic SHF or EHF wave resonator 2001F having the alternating axis stack of the six doped piezoelectric layers is an example of an ITU super high frequency resonator. It is disclosed herein that proportional scaling of layer thickness may provide alternative frequency resonators to the disclosed 24 GHz design, e.g., proportional layer thickness upscaling may provide 37 GHz and 77 GHz designs. The scaled 37 GHz and 77 GHz designs of the example bulk acoustic SHF or EHF wave resonator 2001F having the alternating axis stack of the six doped piezoelectric layers are examples of ITU extremely high frequency resonators.

As mentioned previously, FIG. 2C shows additional alternative bulk acoustic wave resonator structures with additional numbers of alternating axis doped piezoelectric layers. A bulk acoustic SHF or EHF wave resonator 2001G includes four normal axis doped piezoelectric layers 201G, 203G, 205G, 207G, and four reverse axis doped piezoelectric layers 202G, 204G, 206G, 208G arranged in an eight doped piezoelectric layer alternating stack arrangement sandwiched between multilayer metal acoustic SHF or EHF wave reflector top electrode 2015G and multilayer metal acoustic SHF or EHF wave reflector bottom electrode 2013G. A bulk acoustic SHF or EHF wave resonator 2001H includes five normal axis doped piezoelectric layers 201H, 203H, 205H, 207H, 209H and five reverse axis doped piezoelectric layers 202H, 204H, 206H, 208H, 210H arranged in a ten doped piezoelectric layer alternating stack arrangement sandwiched between multilayer metal acoustic SHF or EHF wave reflector top electrode 2015H and multilayer metal acoustic SHF or EHF wave reflector bottom electrode 2013H. A bulk acoustic SHF or EHF wave resonator 2001I includes nine normal axis doped piezoelectric layers 201I, 203I, 205I, 207I, 209I, 211I, 213I, 215I, 217I and nine reverse axis doped piezoelectric layers 202I, 204I, 206I, 208I, 210I, 212I, 214I, 216I, 218I arranged in an eighteen doped piezoelectric layer alternating stack arrangement sandwiched between multilayer metal acoustic SHF or EHF wave reflector top electrode 2015I and multilayer metal acoustic SHF or EHF wave reflector bottom electrode 2013I.

For the bulk acoustic SHF or EHF wave resonator 2001I having the alternating axis stack of eighteen doped piezoelectric layers, simulation of the 24 GHz design estimates an average passband quality factor of approximately two thousand seven hundred (2,700). Scaling this 24 Ghz, eighteen doped piezoelectric layer design to a 37 Ghz, eighteen doped piezoelectric layer design, may have an average passband quality factor of approximately two thousand (2,000) as estimated by simulation. Scaling this 24 Ghz, eighteen doped piezoelectric layer design to a 77 Ghz, eighteen doped piezoelectric layer design, may have an average passband quality factor of approximately one thousand one hundred and thirty (1,130) as estimated by simulation.

In the example resonators, 2001A through 2001I, of FIGS. 2A through 2C, a notional heavy dashed line is used in depicting respective etched edge region, 253A through 253I, associated with the example resonators, 2001A through 2001I. Similarly, in the example resonators, 2001A through 2001I, of FIGS. 2A through 2C, a laterally opposed etched edge region 254A through 254I may be arranged laterally opposite from etched edge region, 253A through 253I. The respective etched edge region may, but need not, assist with acoustic isolation of the resonators, 2001A through 2001I. The respective etched edge region may, but need not, help with avoiding acoustic losses for the resonators, 2001A through 2001I. The respective etched edge region, 253A through 253I, (and the laterally opposed etched edge region 254A through 254I) may extend along the thickness dimension of the respective doped piezoelectric layer stack. The respective etched edge region, 253A through 253I, (and the laterally opposed etched edge region 254A through 254I) may extend through (e.g., entirely through or partially through) the respective doped piezoelectric layer stack. The respective etched edge region, 253A through 253I may extend through (e.g., entirely through or partially through) the respective first doped piezoelectric layer, 201A through 201I. The respective etched edge region, 253B through 253I, (and the laterally opposed etched edge region 254B through 254I) may extend through (e.g., entirely through or partially through) the respective second doped piezoelectric layer, 202B through 202I. The respective etched edge region, 253C through 253I, (and the laterally opposed etched edge region 254C through 254I) may extend through (e.g., entirely through or partially through) the respective third doped piezoelectric layer, 203C through 203I. The respective etched edge region, 253D through 253I, (and the laterally opposed etched edge region 254D through 254I) may extend through (e.g., entirely through or partially through) the respective fourth doped piezoelectric layer, 204D through 204I. The respective etched edge region, 253E through 253I, (and the laterally opposed etched edge region 254E through 254I) may extend through (e.g., entirely through or partially through) the respective additional doped piezoelectric layers of the resonators, 2001E through 2001I. The respective etched edge region, 253A through 253I, (and the laterally opposed etched edge region 254A through 254I) may extend along the thickness dimension of the respective multilayer metal acoustic SHF or EHF wave reflector bottom electrode, 2013A through 2013I, of the resonators, 2001A through 2001I. The respective etched edge region, 253A through 253I, (and the laterally opposed etched edge region 254A through 254I) may extend through (e.g., entirely through or partially through) the respective multilayer metal acoustic SHF or EHF wave reflector bottom electrode, 2013A through 2013I. The respective etched edge region, 253A through 253I, (and the laterally opposed etched edge region 254A through 254I) may extend along the thickness dimension of the respective multilayer metal acoustic SHF or EHF wave reflector top electrode, 2015A through 2015I of the resonators, 2001A through 2001I. The etched edge region, 253A through 253I, (and the laterally opposed etched edge region 254A through 254I) may extend through (e.g., entirely through or partially through) the respective multilayer metal acoustic SHF or EHF wave reflector top electrode, 2015A through 2015I.

As shown in FIGS. 2A through 2C, first mesa structures corresponding to the respective stacks of doped piezoelectric material layers may extend laterally between (e.g., may be formed between) etched edge regions 253A through 253I and laterally opposing etched edge region 254A through 254I. Second mesa structures corresponding to multilayer metal acoustic SHF or EHF wave reflector bottom electrode 2013A through 2013I may extend laterally between (e.g., may be formed between) etched edge regions 153A through 153I and laterally opposing etched edge region 154A through 154I. Third mesa structures corresponding to multilayer metal acoustic SHF or EHF wave reflector top electrode 2015A through 2015I may extend laterally between (e.g., may be formed between) etched edge regions 153A through 153I and laterally opposing etched edge region 154A through 154I.

In accordance with the teachings herein, various bulk acoustic SHF or EHF wave resonators may include: a seven doped piezoelectric layer alternating axis stack arrangement; a nine doped piezoelectric layer alternating axis stack arrangement; an eleven doped piezoelectric layer alternating axis stack arrangement; a twelve doped piezoelectric layer alternating axis stack arrangement; a thirteen doped piezoelectric layer alternating axis stack arrangement; a fourteen doped piezoelectric layer alternating axis stack arrangement; a fifteen doped piezoelectric layer alternating axis stack arrangement; a sixteen doped piezoelectric layer alternating axis stack arrangement; and a seventeen doped piezoelectric layer alternating axis stack arrangement; and that these stack arrangements may be sandwiched between respective multilayer metal acoustic SHF or EHF wave reflector top electrodes and respective multilayer metal acoustic SHF or EHF wave reflector bottom electrodes. Mass load layers and lateral features (e.g., step features) as discussed previously herein with respect to FIG. 1A are not explicitly shown in the simplified diagrams of the various resonators shown in FIGS. 2A, 2B and 2C. However, such mass load layers may be included, and such lateral features may be included, and may be arranged between, for example, top metal electrode layers of the respective top acoustic reflectors of the resonators shown in FIGS. 2A, 2B and 2C. Further, such mass load layers may be included, and such lateral features may be included, and may be arranged between, for example, top metal electrode layers of the respective top acoustic reflectors in the various resonators having the alternating axis stack arrangements of various numbers of doped piezoelectric layers, as described in this disclosure.

In SHF examples, thicknesses of doped piezoelectric layers (e.g., thicknesses of the normal axis doped piezoelectric layer 2005A through 2005I, e.g., thicknesses of the reverse axis doped piezoelectric layer 2007A through 2007I) may be selected to determine the main resonant frequency of doped bulk acoustic Super High Frequency (SHF) wave resonator 2001A through 2001I in the Super High Frequency (SHF) wave band (e.g., approximately twenty-four Gigahertz, approximately 24 GHz main resonant frequency). Similarly, in SHF examples, layer thicknesses of Super High Frequency (SHF) acoustic reflector electrode layers (e.g., member layer thicknesses of Super High frequency (SHF) bottom acoustic reflector electrode 2013A through 2013I, e.g., member layer thickness of Super High frequency (SHF) top acoustic reflector electrode 2015A through 2015I) may be selected to determine peak acoustic reflectivity of such SHF acoustic reflector electrodes at a frequency, e.g., peak reflectivity resonant frequency, within the Super High Frequency (SHF) wave band (e.g., approximately twenty-four Gigahertz, approximately 24 GHz peak reflectivity resonant frequency). The Super High Frequency (SHF) wave band may include: 1) peak reflectivity resonant frequency (e.g., approximately twenty-four Gigahertz, approximately 24 GHz peak reflectivity resonant frequency) of the Super High Frequency (SHF) acoustic reflector electrode layers; and 2) the main resonant frequency of doped bulk acoustic the Super High Frequency (SHF) wave resonator 2001A through 2001I (e.g., approximately twenty-four Gigahertz, approximately 24 GHz main resonant frequency).

In EHF examples, thicknesses of doped piezoelectric layers (e.g., thicknesses of the normal axis doped piezoelectric layer 2005A through 2005I, e.g., thicknesses of the reverse axis doped piezoelectric layer 2007A through 2007I)

may be selected to determine the main resonant frequency of doped bulk acoustic Extremely High Frequency (EHF) wave resonator 2001A through 2001I in the Extremely High Frequency (EHF) wave band (e.g., 39 GHz main resonant frequency, e.g., 77 GHz main resonant frequency). Similarly, in EHF examples, layer thicknesses of Extremely High Frequency (EHF) acoustic reflector electrode layers (e.g., member layer thicknesses of Super High frequency (SHF) bottom acoustic reflector electrode 2013A through 2013I, e.g., member layer thickness of Super High frequency (SHF) top acoustic reflector electrode 2015A through 2015I) may be selected to determine peak acoustic reflectivity of such EHF acoustic reflector electrodes at a frequency, e.g., peak reflectivity resonant frequency, within the Extremely High Frequency (EHF) wave band (e.g., 39 GHz peak reflectivity resonant frequency, e.g., 77 GHz peak reflectivity resonant frequency). The Extremely High Frequency (EHF) wave band may include: 1) peak reflectivity resonant frequency (e.g., 39 GHz peak reflectivity resonant frequency, e.g., 77 GHz peak reflectivity resonant frequency) of the Extremely High Frequency (EHF) acoustic reflector electrode layers; and 2) the main resonant frequency of doped bulk acoustic the Extremely High Frequency (EHF) wave resonator 2001A through 2001I (e.g., 39 GHz main resonant frequency, e.g., 77 GHz main resonant frequency).

For example, relatively low acoustic impedance titanium (Ti) metal and relatively high acoustic impedance Molybdenum (Mo) metal may be alternated for member layers of the bottom acoustic reflector electrode 2013A through 2013I, and for member layers of top acoustic reflector electrode 2015A through 2015I. Accordingly, these member layers may be different metals from one another having respective acoustic impedances that are different from one another so as to provide a reflective acoustic impedance mismatch at the resonant frequency of the resonator. For example, a first member may have an acoustic impedance, and a second member may have a relatively higher acoustic impedance that is at least about twice (e.g., twice) as high as the acoustic impedance of the first member.

Thicknesses of member layers of the acoustic reflector electrodes may be related to resonator resonant frequency. Member layers of the acoustic reflector electrodes may be made thinner as resonators are made to extend to higher resonant frequencies, and as acoustic reflector electrodes are made to extend to higher peak reflectivity resonant frequencies. In accordance with teachings of this disclosure, to compensate for this member layer thinning, number of member layers of the acoustic reflector electrodes may be increased in designs extending to higher resonant frequencies, to facilitate thermal conductivity through acoustic reflector electrodes, and to facilitate electrical conductivity through acoustic reflectivity at higher resonant frequencies. Operation of the example doped bulk acoustic wave resonators 2001A through 2001I at a resonant Super High Frequency (SHF) or resonant Extremely High Frequency (EHF) may generate heat to be removed from doped bulk acoustic wave resonators 2001A through 2001I through the acoustic reflector electrodes. The acoustic reflector electrodes (e.g., Super High Frequency (SHF) bottom acoustic reflector electrode 2013A through 2013I, e.g., Super High Frequency (SHF) top acoustic reflector electrode 2015A through 2015I, e.g., Extremely High Frequency (EHF) bottom acoustic reflector electrode 2013A through 2013I, e.g., Extremely High Frequency (EHF) top acoustic reflector electrode 2015A through 2015I) may have thermal resistance of three thousand degrees Kelvin per Watt or less at the given frequency (e.g., at the resonant frequency of the doped BAW resonator in the Super High Frequency (SHF) band or the Extremely High Frequency (EHF) band, e.g., at the peak reflectivity resonant frequency of the acoustic reflector electrode in the Super High Frequency (SHF) band or the Extremely High Frequency (EHF) band). For example, a sufficient number of member layers may be employed to provide for this thermal resistance at the given frequency (e.g., at the resonant frequency of the doped BAW resonator in the Super High Frequency (SHF) band or the Extremely High Frequency (EHF) band, e.g., at the peak reflectivity resonant frequency of the acoustic reflector electrode in the Super High Frequency (SHF) band or the Extremely High Frequency (EHF) band).

Further, quality factor (Q factor) is a figure of merit for doped bulk acoustic wave resonators that may be related, in part, to acoustic reflector electrode conductivity. In accordance with the teachings of this disclosure, without an offsetting compensation that increases number of member layers, member layer thinning with increasing frequency may otherwise diminish acoustic reflector electrode conductivity, and may otherwise diminish quality factor (Q factor) of doped bulk acoustic wave resonators. In accordance with the teachings of this disclosure, number of member layers of the acoustic reflector electrodes may be increased in designs extending to higher resonant frequencies, to facilitate electrical conductivity through acoustic reflector electrodes. The acoustic reflector electrodes (e.g., Super High Frequency (SHF) bottom acoustic reflector electrode 2013A through 2013I, e.g., Super High Frequency (SHF) top acoustic reflector electrode 2015A through 2015I, e.g., Extremely High Frequency (EHF) bottom acoustic reflector electrode 2013A through 2013I, e.g., Extremely High Frequency (EHF) top acoustic reflector electrode 2015A through 2015I) may have sheet resistance of less than one Ohm per square at the given frequency (e.g., at the resonant frequency of the doped BAW resonator in the Super High Frequency band or the Extremely High Frequency band, e.g., at the peak reflectivity resonant frequency of the acoustic reflector electrode in the Super High Frequency band or the Extremely High Frequency band). For example, a sufficient number of member layers may be employed to provide for this sheet resistance at the given frequency (e.g., at the resonant frequency of the doped BAW resonator in the Super High Frequency band or the Extremely High Frequency band, e.g., at the peak reflectivity resonant frequency of the acoustic reflector electrode in the Super High Frequency band or the Extremely High Frequency band). This may, but need not, facilitate enhancing quality factor (Q factor) to a quality factor (Q factor) that may be above a desired one thousand (1000).

Figure 2D:
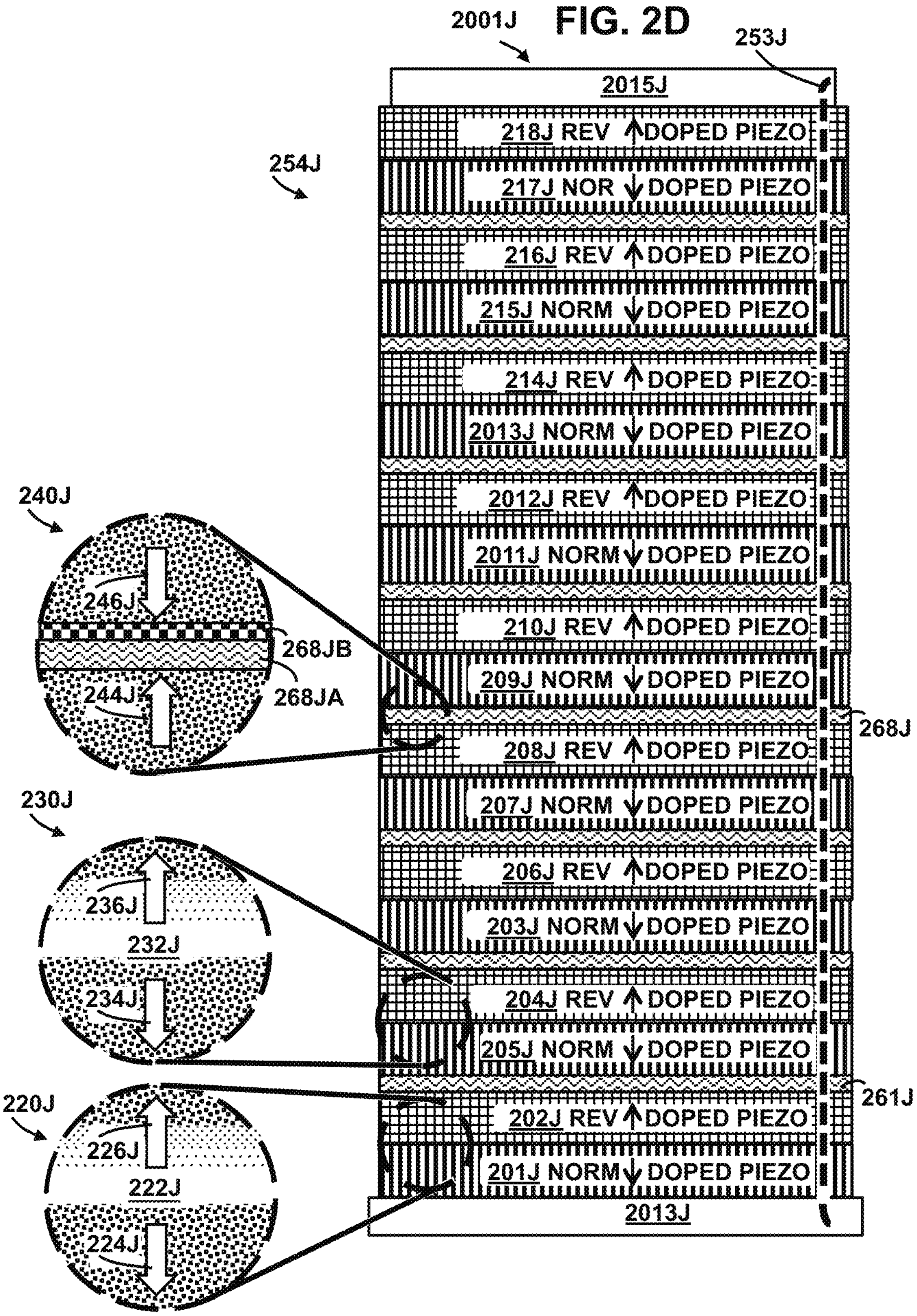
FIGS. 2D and 2E show more additional alternative bulk acoustic wave resonator structures.

Further, it should be understood that interposer layers as discussed previously herein with respect to FIG. 1A are explicitly shown in the simplified diagrams of the various resonators shown in FIGS. 2A, 2B and 2C. Such interposers may be included and interposed between adjacent doped piezoelectric layers in the various resonators shown in FIGS. 2A, 2B and 2C, and further may be included and interposed between adjacent doped piezoelectric layers in the various resonators having the alternating axis stack arrangements of various numbers of doped piezoelectric layers, as described in this disclosure. In some other alternative bulk acoustic wave resonator structures, fewer interposer layers may be employed. For example, FIG. 2D shows another alternative bulk acoustic wave resonator structure 2001J, similar to bulk acoustic wave resonator structure 2001I shown in FIG. 2C, but with differences. For example, relatively fewer interposer layers may be included in the alternative bulk acoustic wave resonator structure 2001J shown in FIG. 2D. For example, FIG. 2D shows a first interposer layer 261J interposed between second layer of (reverse axis) doped piezoelectric material 202J and third layer of (normal axis) doped piezoelectric material 203J, but without an interposer layer interposed between first layer of (normal axis) doped piezoelectric material 201J and second layer of (reverse axis) doped piezoelectric material 202J. As shown in FIG. 2D in a first detailed view 220J, without an interposer layer interposed between first layer of doped piezoelectric material 201J and second layer of doped piezoelectric material 202J, the first and second doped piezoelectric layer 201J, 202J may be a doped monolithic layer 222J of doped piezoelectric material (e.g., doped Aluminum Nitride (AlN)) having first and second regions 224J, 226J. Dopant in first and second regions 224J, 226J is depicted in detailed view 220J by hatching. Varied concentration of dopant in first and second regions 224J, 226J is depicted in detailed view 220J by varied relative darkness of hatching. First region 224J may be fully doped, e.g., an ungraded doped region, as depicted in detailed view 220J by the full concentration of relatively dark hatching. Second region 226J may be a graded doped region, as depicted in detailed view 220J by no hatching present in a central, virtually undoped region of doped monolithic layer 222J. Detailed view 220J shows gradual increasing of concentration of dopant (e.g., graded doping, e.g., darkening of hatching) extending away from the undoped central region into the graded doped second region 226, until the extremity of the graded doped second region 226 has the full dopant concentration, as depicted by the relatively dark hatching. By controlling dopant sputtering (e.g., by deactivating the dopant sputtering) during deposition of the central region of doped monolithic layer 222J, the central region may be free of dopant, as depicted in detailed view 220J by no hatching being present in the central region. Additionally, doping in second region 226J may be graded to provide the second graded doped region 226 by controlling dopant sputtering (e.g., by gradually activating power driving the dopant sputtering, e.g., by gradually controlling power driving the dopant sputtering).

For example, the different concentrations of dopant through the thickness of the film may be realized by adjusting the sputter power on the dopant target or targets from zero (e.g., target is off and no power (not energized) is on the target) to a level 1 power, e.g., giving a preselected "X1" amount of dopant in the film. Sputtering power may be increased from the level 1 power, e.g., giving a preselected "X1" amount of dopant in the film, to a relatively greater preselected level 2 power that is greater than a level 1 power to give "X2" amount of dopant in the film with the "X2" amount in the film that is greater than the "X1" in the film. Similarly, a level 3 power that is greater than the level 2 power can be used to sputter the dopant constituents. This will result in a "X3" amount of dopant in the film that is greater than the "X2" amount of dopant in the film. One skilled in the art can appreciate that this procedure can be continued with each successive power level will result in more dopant incorporated into the piezoelectric film.

The undoped central region of doped monolithic layer 222J of doped piezoelectric material (e.g., doped Aluminum Nitride (AlN)) between first and second regions 224J, 226J may be oxygen rich. The first region 224J of doped monolithic layer 222J (e.g., bottom region 224J of doped monolithic layer 222J) has a first piezoelectric axis orientation (e.g., normal axis orientation) as representatively illustrated in detailed view 220J using a downward pointing arrow at first region 224J, (e.g., bottom region 224J). This first piezoelectric axis orientation (e.g., normal axis orientation, e.g., downward pointing arrow) at first region 224J of doped monolithic layer 222J (e.g., bottom region 224J of doped monolithic layer 222J) corresponds to the first piezoelectric axis orientation (e.g., normal axis orientation, e.g., downward pointing arrow) of first doped piezoelectric layer 201J. The second region 226J of doped monolithic layer 222J (e.g., top region 226J of doped monolithic layer 222J) has a second piezoelectric axis orientation (e.g., reverse axis orientation) as representatively illustrated in detailed view 220J using an upward pointing arrow at second region 226J, (e.g., top region 226J). This second piezoelectric axis orientation (e.g., reverse axis orientation, e.g., upward pointing arrow) at second region 226J of doped monolithic layer 222J (e.g., top region 226J of doped monolithic layer 222J) may be formed to oppose the first piezoelectric axis orientation (e.g., normal axis orientation, e.g., downward pointing arrow) at first region 224J of doped monolithic layer 222J (e.g., bottom region 224J of doped monolithic layer 222J) by adding gas (e.g., oxygen) to flip the axis while sputtering the second region 226J of doped monolithic layer 222J (e.g., top region 226J of doped monolithic layer 222J) onto the first region 224J of doped monolithic layer 222J (e.g., bottom region 224J of doped monolithic layer 222J). The second piezoelectric axis orientation (e.g., reverse axis orientation, e.g., upward pointing arrow) at second region 226J of doped monolithic layer 222J (e.g., top region 226J of doped monolithic layer 222J) corresponds to the second piezoelectric axis orientation (e.g., reverse axis orientation, e.g., upward pointing arrow) of second doped piezoelectric layer 202J. In view of the foregoing, it should be understood that doping of the second layer of doped piezoelectric material 202J may be graded doping. This may facilitate fabrication of the second layer 202J of reverse axis doped piezoelectric material (e.g., having the reverse piezoelectric axis orientation that opposes the normal piezoelectric axis orientation of the first layer of doped piezoelectric material 201J). Similarly, as shown in FIG. 2D in a second detailed view 230J, without an interposer layer interposed between third layer of doped piezoelectric material 203J and fourth layer of doped piezoelectric material 204J, the third and fourth doped piezoelectric layer 203J, 204J may be an additional doped monolithic layer 232J of doped piezoelectric material (e.g., doped Aluminum Nitride (AlN)) having first and second regions 234J, 236J. Dopant in first and second regions 234J, 236J is depicted in detailed view 230J by hatching. Varied concentration of dopant in first and second regions 234J, 236J is depicted in detailed view 230J by varied density or darkness of hatching. First region 234J may be fully doped, e.g., an ungraded doped region, as depicted in detailed view 230J by the full concentration of density or darkness of hatching. Second region 236J may be a graded doped region, as depicted in detailed view 230J by no hatching present in a central virtually undoped region of doped monolithic layer 232J. Detailed view 230J shows gradual increasing of concentration of dopant (e.g., increasing density or darkness of hatching) extending away from the undoped central region into the graded doped second region 236, until the extremity of the graded doped second region 236 has the full dopant concentration, as depicted by the full concentration of density or darkness of hatching. By controlling dopant sputtering (e.g., by deactivating the dopant sputtering) during deposition of the central region of doped monolithic layer 232J, the central region may be free of dopant, as depicted in detailed view 230J by no hatching being present in the central region. Additionally, doping in second region 236J may be graded to provide the second graded doped region 236 by controlling dopant sputtering (e.g., by gradually activating the dopant sputtering). The undoped central region of additional doped monolithic layer 232J of doped piezoelectric material (e.g., doped Aluminum Nitride (AlN)) between first and second regions 234J, 236J may be oxygen rich. The first region 234J of additional doped monolithic layer 232J (e.g., bottom region 234J of additional doped monolithic layer 232J) has the first piezoelectric axis orientation (e.g., normal axis orientation) as representatively illustrated in second detailed view 230J using the downward pointing arrow at first region 234J, (e.g., bottom region 224J). This first piezoelectric axis orientation (e.g., normal axis orientation, e.g., downward pointing arrow) at first region 234J of additional doped monolithic layer 232J (e.g., bottom region 234J of additional doped monolithic layer 232J) corresponds to the first piezoelectric axis orientation (e.g., normal axis orientation, e.g., downward pointing arrow) of third doped piezoelectric layer 203J. The second region 236J of additional doped monolithic layer 232J (e.g., top region 236J of additional doped monolithic layer 232J) has the second piezoelectric axis orientation (e.g., reverse axis orientation) as representatively illustrated in second detailed view 230J using the upward pointing arrow at second region 236J, (e.g., top region 236J). This second piezoelectric axis orientation (e.g., reverse axis orientation, e.g., upward pointing arrow) at second region 236J of additional doped monolithic layer 232J (e.g., top region 236J of additional doped monolithic layer 232J) may be formed to oppose the first piezoelectric axis orientation (e.g., normal axis orientation, e.g., downward pointing arrow) at first region 234J of additional doped monolithic layer 232J (e.g., bottom region 234J of additional doped monolithic layer 232J) by adding gas (e.g., oxygen) to flip the axis while sputtering the second region 236J of additional doped monolithic layer 232J (e.g., top region 236J of additional doped monolithic layer 232J) onto the first region 234J of additional doped monolithic layer 232J (e.g., bottom region 234J of additional doped monolithic layer 232J). The second piezoelectric axis orientation (e.g., reverse axis orientation, e.g., upward pointing arrow) at second region 236J of additional doped monolithic layer 232J (e.g., top region 236J of additional doped monolithic layer 232J) corresponds to the second piezoelectric axis orientation (e.g., reverse axis orientation, e.g., upward pointing arrow) of fourth doped piezoelectric layer 204J. In view of the foregoing, it should be understood that doping of the fourth layer of doped piezoelectric material 204J may be graded doping. This may facilitate fabrication of the fourth layer 204J of reverse axis doped piezoelectric material (e.g., having the reverse piezoelectric axis orientation that opposes the normal piezoelectric axis orientation of the third layer of doped piezoelectric material 203J).

Similar to what was just discussed, without an interposer layer interposed between fifth layer of doped piezoelectric material 205J and sixth layer of doped piezoelectric material 206J, the fifth and sixth doped piezoelectric layer 205J, 206J may be another additional doped monolithic layer of doped piezoelectric material (e.g., doped Aluminum Nitride (AlN)) having first and second regions. More generally, for example in FIG. 2D, where N is an odd positive integer, without an interposer layer interposed between Nth layer of doped piezoelectric material and (N+1)th layer of doped piezoelectric material, the Nth and (N+1)th doped piezoelectric layer may be an (N+1)/2th doped monolithic layer of doped piezoelectric material (e.g., doped Aluminum Nitride (AlN)) having first and second regions. Accordingly, without an interposer layer interposed between seventeenth layer of doped piezoelectric material 217J and eighteenth layer of doped piezoelectric material 218J, the seventeenth and eighteenth doped piezoelectric layer 217J, 218J may be ninth doped monolithic layer of doped piezoelectric material (e.g., doped Aluminum Nitride (AlN)) having first and second regions.

The first interposer layer 261J is shown in FIG. 2D as interposing between a first pair of opposing axis doped piezoelectric layers 201J, 202J, and a second pair of opposing axis doped piezoelectric layers 203J, 204J. More generally, for example, where M is a positive integer, an Mth interposer layer is shown in FIG. 2D as interposing between an Mth pair of opposing axis doped piezoelectric layers and an (M+1)th pair of opposing axis doped piezoelectric layers. Accordingly, an eighth interposer layer is shown in FIG. 2D as interposing between an eighth pair of opposing axis doped piezoelectric layers 215J, 216J, and a ninth pair of opposing axis doped piezoelectric layers 217J, 218J. FIG. 2D shows an eighteen doped piezoelectric layer alternating axis stack arrangement sandwiched between multilayer metal acoustic SHF or EHF wave reflector top electrode 2015J and multilayer metal acoustic SHF or EHF wave reflector bottom electrode 2013J. Etched edge region 253J (and laterally opposing etched edge region 254J) may extend through (e.g., entirely through, e.g., partially through) the eighteen doped piezoelectric layer alternating axis stack arrangement and its interposer layers, and may extend through (e.g., entirely through, e.g., partially through) multilayer metal acoustic SHF or EHF wave reflector top electrode 2015J, and may extend through (e.g., entirely through, e.g., partially through) multilayer metal acoustic SHF or EHF wave reflector bottom electrode 2013J. As shown in FIG. 2D, a first mesa structure corresponding to the stack of eighteen doped piezoelectric material layers may extend laterally between (e.g., may be formed between) etched edge region 253J and laterally opposing etched edge region 254J. A second mesa structure corresponding to multilayer metal acoustic SHF or EHF wave reflector bottom electrode 2013J may extend laterally between (e.g., may be formed between) etched edge region 153J and laterally opposing etched edge region 154J. Third mesa structure corresponding to multilayer metal acoustic SHF or EHF wave reflector top electrode 2015J may extend laterally between (e.g., may be formed between) etched edge region 153J and laterally opposing etched edge region 154J.

As mentioned previously herein, one or more (e.g., one or a plurality of) interposer layers may be metal interposer layers. Alternatively or additionally, one or more (e.g., one or a plurality of) interposer layers may be dielectric interposer layers. Interposer layers may be metal and/or dielectric interposer layers. Alternatively or additionally, one or more (e.g., one or a plurality of) interposer layers may comprise metal and dielectric for respective interposer layers. For example, high acoustic impedance metal layer such as Tungsten (W) or Molybdenum (Mo) may (but need not) raise effective electromechanical coupling coefficient (Kt2). Subsequently deposited amorphous dielectric layer such as Silicon Dioxide (SiO2) may (but need not) facilitate compensating for temperature dependent frequency shifts. Alternatively or additionally, one or more (e.g., one or a plurality of) interposer layers may be formed of different metal layers. For example, high acoustic impedance metal layer such as Tungsten (W) or Molybdenum (Mo) may (but need not) raise effective electromechanical coupling coefficient (Kt2) while subsequently deposited metal layer with hexagonal symmetry such as Titanium (Ti) may (but need not) facilitate higher crystallographic quality of subsequently deposited doped piezoelectric layer. Alternatively or additionally, one or more (e.g., one or a plurality of) interposer layers may be formed of different dielectric layers. For example, high acoustic impedance dielectric layer such as Hafnium Dioxide (HfO2) may (but need not) raise effective electromechanical coupling coefficient (Kt2) while subsequently deposited amorphous dielectric layer such as Silicon Dioxide (SiO2) may (but need not) facilitate compensating for frequency dependent frequency shifts. For example, in FIG. 2D one or more of the interposer layers (e.g., interposer layer 268J) may comprise metal and dielectric for respective interposer layers. For example, detailed view 240J of interposer 268J shows interposer 268J as comprising metal sublayer 268JB over dielectric sublayer 268JA. For interposer 268J, example thickness of metal sublayer 268JB may be approximately two hundred Angstroms (200 A). For interposer 268J, example thickness of dielectric sublayer 268JA may be approximately two hundred Angstroms (200 A). The second piezoelectric axis orientation (e.g., reverse axis orientation, e.g., upward pointing arrow) at region 244J (e.g., bottom region 244J) corresponds to the second piezoelectric axis orientation (e.g., reverse axis orientation, e.g., upward pointing arrow) of eighth piezoelectric layer 208J. The first piezoelectric axis orientation (e.g., normal axis orientation, e.g., downward pointing arrow) at region 246J (e.g., top region 246J) corresponds to the first piezoelectric axis orientation (e.g., normal orientation, e.g., downward pointing arrow) of ninth piezoelectric layer 209J.

Figure 2E:
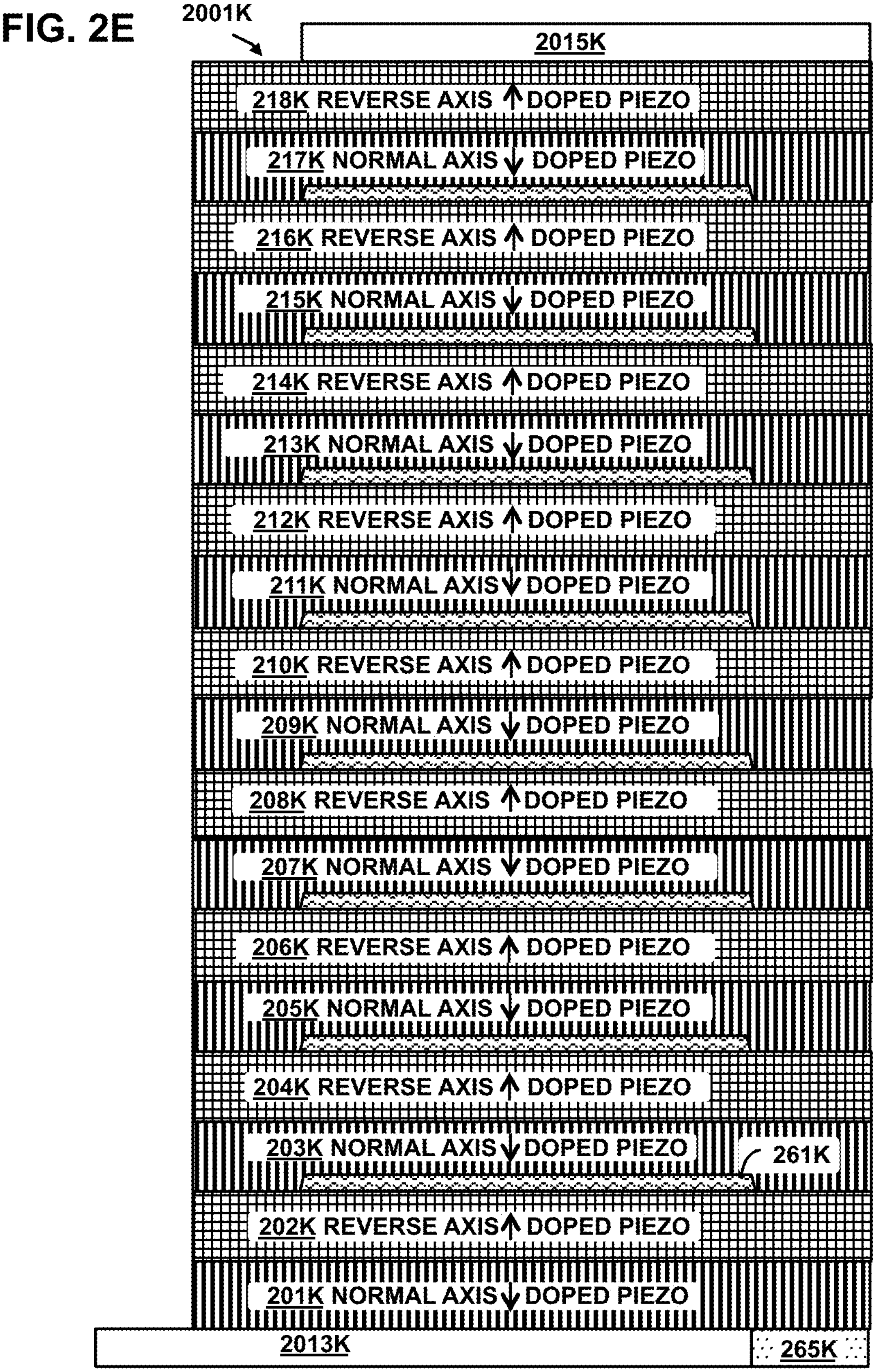

As discussed, interposer layers shown in FIG. 1A, and as explicitly shown in the simplified diagrams of the various resonators shown in FIGS. 2A, 2B, 2C and 2D may be included and interposed between adjacent doped piezoelectric layers in the various resonators. Such interposer layers may laterally extend within the mesa structure of the stack of doped piezoelectric layers a full lateral extent of the stack, e.g., between the etched edge region of the stack and the opposing etched edge region of the stack. However, in some other alternative bulk acoustic wave resonator structures, interposer layers may be patterned during fabrication of the interposer layers (e.g., patterned using masking and selective etching techniques during fabrication of the interposer layers). Such patterned interposer layers need not extend a full lateral extent of the stack (e.g., need not laterally extend to any etched edge regions of the stack.) For example, FIG. 2E shows another alternative bulk acoustic wave resonator structure 2001K, similar to bulk acoustic wave resonator structure 2001J shown in FIG. 2D, but with differences. For example, in the alternative bulk acoustic wave resonator structure 2001K shown in FIG. 2E, patterned interposer layers (e.g., first patterned interposer layer 261K) may be interposed between sequential pairs of opposing axis doped piezoelectric layers (e.g., first patterned interposer layer 295K may be interposed between a first pair of opposing axis doped piezoelectric layers 201K, 202K, and a second pair of opposing axis doped piezoelectric layers 203K, 204K).

FIG. 2E shows an eighteen doped piezoelectric layer alternating axis stack arrangement having an active region of the bulk acoustic wave resonator structure 2001K sandwiched between overlap of multilayer metal acoustic SHF or EHF wave reflector top electrode 2015IK and multilayer metal acoustic SHF or EHF wave reflector bottom electrode 2013K. In FIG. 2E, patterned interposer layers (e.g., first patterned interposer layer 261K) may be patterned to have extent limited to the active region of the bulk acoustic wave resonator structure 2001K sandwiched between overlap of multilayer metal acoustic SHF or EHF wave reflector top electrode 2015K and multilayer metal acoustic SHF or EHF wave reflector bottom electrode 2013K. A planarization layer 256K at a limited extent of multilayer metal acoustic SHF or EHF wave reflector bottom electrode 2013K may facilitate fabrication of the eighteen doped piezoelectric layer alternating axis stack arrangement (e.g., stack of eighteen doped piezoelectric layers 201K through 218K).

Patterning of interposer layers may be done in various combinations. For example, some interposer layers need not be patterned (e.g., may be unpatterned) within lateral extent of the stack of doped piezoelectric layers (e.g., some interposer layers may extend to full lateral extent of the stack of doped piezoelectric layers). For example, first interposer layer 261J shown in FIG. 2D need not be patterned (e.g., may be unpatterned) within lateral extent of the stack of doped piezoelectric layers (e.g., first interposer layer 261J may extend to full lateral extent of the stack of doped piezoelectric layers). For example, in FIG. 2D interposer layers interposed between adjacent sequential pairs of normal axis and reverse axis doped piezoelectric layers need not be patterned (e.g., may be unpatterned) within lateral extent of the stack of doped piezoelectric layers (e.g., interposer layers interposed between sequential pairs of normal axis and reverse axis doped piezoelectric layers may extend to full lateral extent of the stack of doped piezoelectric layers). For example in FIG. 2D, first interposer layer 261J interposed between first sequential pair of normal axis and reverse axis doped piezoelectric layers 201J, 202J and adjacent second sequential pair of normal axis and reverse axis doped piezoelectric layers 203J, 204J need not be patterned within lateral extent of the stack of doped piezoelectric layers (e.g., first interposer layer 261J may extend to full lateral extent of the stack of doped piezoelectric layers). In contrast to these unpatterned interposer layers (e.g., in contrast to unpatterned interposer layer 261J) as shown in FIG. 2D, in FIG. 2E patterned interposer layers (e.g., first patterned interposer layer 261K) may be patterned, for example, to have extent limited to the active region of the bulk acoustic wave resonator structure 2001K shown in FIG. 2E.

Figure 2F:
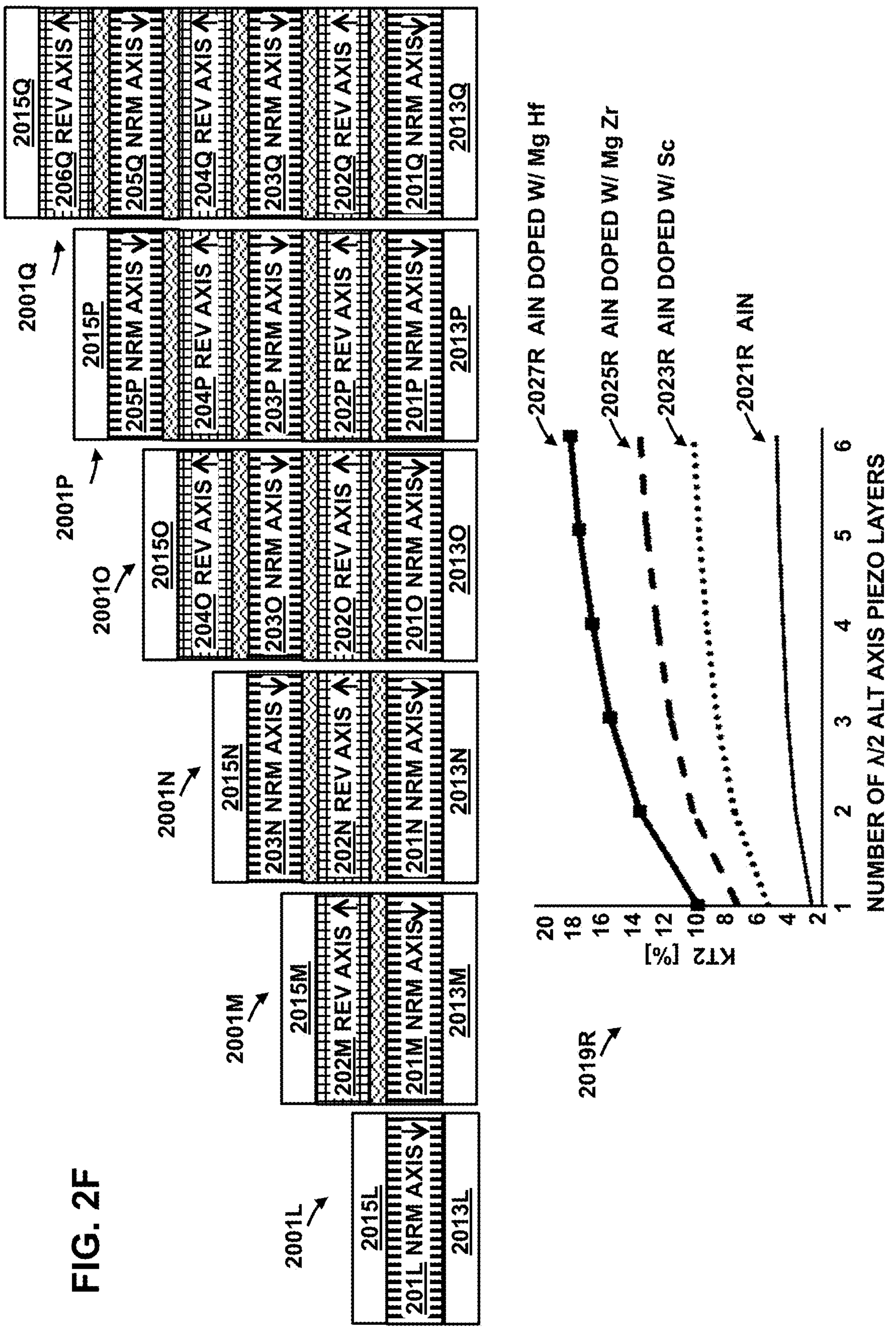
FIG. 2F shows six different simplified example resonators and a diagram showing electromechanical coupling coefficient predicted by simulation for different dopants for the six different resonators.

FIG. 2F shows six different simplified example resonators 2001L through 2001Q and a diagram 2019R showing electromechanical coupling predicted by simulation for different dopants for the six different resonators 2001L through 2001Q. The six different resonators 2001L through 2001Q have respective one to six half wavelength piezoelectric layers in an alternating axis stack arrangement sandwiched between respective multilayer metal acoustic SHF or EHF wave reflector bottom electrodes 2013L through 2013Q and respective multilayer metal acoustic SHF or EHF wave reflector top electrode 2015L through 2015Q. First example resonator 2001L includes a single normal axis piezoelectric layer 201L. Second example resonator 2001M includes an alternating axis stack arrangement of a first normal axis piezoelectric layer 201M and a second reverse axis piezoelectric layer 202M. Third example resonator 2001N includes an alternating axis stack arrangement of a first normal axis piezoelectric layer 201N, a second reverse axis piezoelectric layer 202N, and a third normal axis piezoelectric layer 203N. Fourth example resonator 2001O includes an alternating axis stack arrangement of a first normal axis piezoelectric layer 201O, a second reverse axis piezoelectric layer 202O, a third normal axis piezoelectric layer 203O and a fourth reverse axis piezoelectric layer 204O. Fifth example resonator 2001P includes an alternating axis stack arrangement of a first normal axis piezoelectric layer 201P, a second reverse axis piezoelectric layer 202P, a third normal axis piezoelectric layer 203P, a fourth reverse axis piezoelectric layer 204P, and a fifth normal axis piezoelectric layer 205P. Sixth example resonator 2001Q includes an alternating axis stack arrangement of a first normal axis piezoelectric layer 201Q, a second reverse axis piezoelectric layer 202Q, a third normal axis piezoelectric layer 203Q, a fourth reverse axis piezoelectric layer 204Q, a fifth normal axis piezoelectric layer 205Q, and a sixth reverse axis piezoelectric layer 206Q. The six example resonators shown in FIG. 2F may include interposer layers, as discussed in detail previously herein. For the sake of comparison, diagram 2019R shows electromechanical coupling coefficient (KT2%) predicted by simulation for the six example resonators 2001L through 2001Q, for different dopings in the piezoelectric layers of the example resonators 2001L through 2001Q. As shown in the diagram 2019R, a first trace 2021R depicts undoped Aluminum Nitride (AlN), a second trace 2023R depicts Aluminum Nitride doped with Scandium (e.g., AlSc0.25N), a third trace 2025R depicts Aluminum Nitride doped with Magnesium Zirconium (e.g., Al(Mg0.5Zr0.5)0.25N)), a fourth trace 2027R depicts Aluminum Nitride doped with Magnesium Hafnium (e.g., Al(Mg0.5Hf0.5)0.25N)) employed in the piezoelectric layers of the example resonators 2001L through 2001Q. For example, as shown in trace 2021R of the diagram 2019R, for the single piezoelectric layer 201L of undoped Aluminum Nitride in example single piezoelectric layer resonator 2001L, the electromechanical coupling coefficient (KT2%) predicted by simulation may be about 2%. For example, as shown in trace 2027R of the diagram 2019R, for the six piezoelectric layers 201Q through 206Q of Aluminum Nitride doped with Magnesium Hafnium (e.g., Al(Mg0.5Hf0.5)0.25N) in example six piezoelectric layer resonator 2001Q, the electromechanical coupling coefficient (KT2%) predicted by simulation may be about 18%. It is theorized that electromechanical coupling coefficient (KT2%) may be enhanced for the six piezoelectric layer alternating axis stack resonator 2001Q, at least in part because considerably more acoustic energy may be confined in the alternating axis stack of the six piezoelectric layers 201Q through 2006Q rather than in multilayer metal acoustic SHF or EHF wave reflector bottom electrode 2013Q and in multilayer metal acoustic SHF or EHF wave reflector top electrode 2015Q. Relative to the alternating axis stack of the six piezoelectric layer resonator 2001Q, it is theorized that electromechanical coupling coefficient (KT2%) may be diminished for the single piezoelectric layer resonator 2001L, at least in part because relatively less acoustic energy may be confined in the single piezoelectric layer 201L, and relatively more acoustic energy in multilayer metal acoustic SHF or EHF wave reflector bottom electrode 2013L and in multilayer metal acoustic SHF or EHF wave reflector top electrode 2015L. Accordingly, in light of the foregoing, it is theorized that not only may electromechanical coupling coefficient (KT2%) be enhanced with choice of dopant, but electromechanical coupling coefficient (KT2%) may be further enhanced by increasing number of piezoelectric layers in the alternating axis stack arrangement, e.g., from the single piezoelectric layer 201L in resonator 2001L to the six piezoelectric layers 201Q through 206Q in resonator 2001Q. The piezoelectric layer doping (e.g., doping of the third piezoelectric layer) and the number of piezoelectric layers can facilitate determining a selected electromechanical coupling of the acoustic resonator (e.g., bulk acoustic millimeter wave resonator).

Figure 2G:
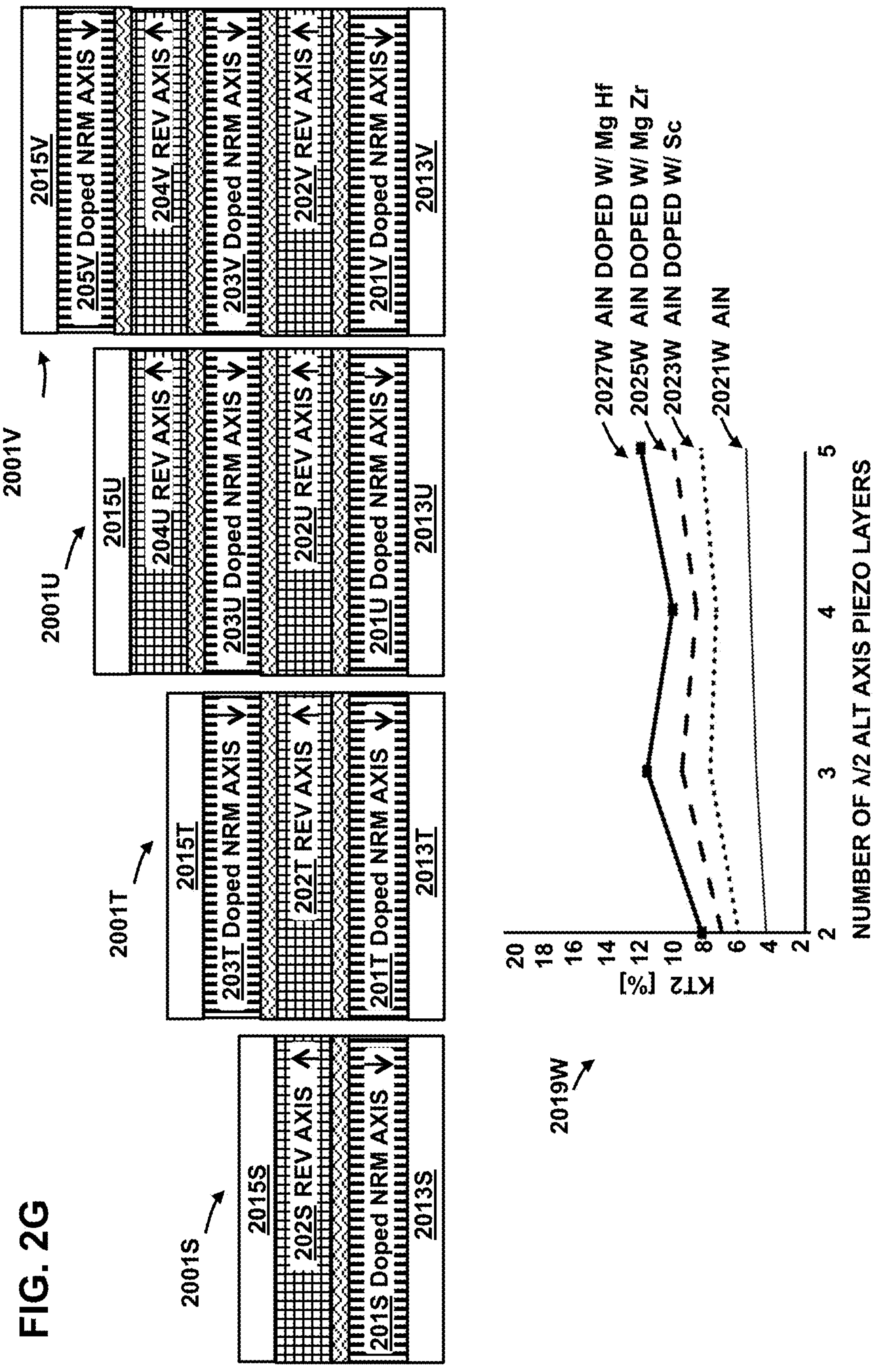
FIG. 2G shows another four different simplified example resonators and a diagram showing electromechanical coupling coefficient predicted by simulation for different dopants for the four different resonators.

FIG. 2G shows another four different simplified example resonators 2001S through 2001V and a diagram 2019W showing electromechanical coupling predicted by simulation for different dopants for the four different resonators 2001V and a diagram 2019W. Whereas, all piezoelectric layers of the six different simplified example resonators 2001L through 2001Q of FIG. 2F are doped, not all layers are doped for the four different simplified example resonators 2001S through 2001V of FIG. 2G. For example, the bulk acoustic wave resonators 2001S through 2001V of FIG. 2G may include bottom normal axis doped piezoelectric layers 201S through 201V and may include second reverse axis (e.g., undoped) piezoelectric layers 202S through 202V. Similarly, the bulk acoustic wave resonators 2001T through 2001V of FIG. 2G may include third normal axis doped piezoelectric layers 203T through 203V. The bulk acoustic wave resonators 2001U and 2001V of FIG. 2G may include fourth reverse axis (e.g., undoped) piezoelectric layers 204U and 204V. The bulk acoustic wave resonator 2001V of FIG. 2G may include a fifth normal axis doped piezoelectric layer 205V. According, FIG. 2G shows a two piezoelectric layer bulk acoustic wave resonator 2001S, a three piezoelectric layer bulk acoustic wave resonator 2001T, a four piezoelectric layer bulk acoustic wave resonator 2001U, and a five piezoelectric layer bulk acoustic wave resonator 2001V, with respective alternating piezoelectric axis, and with respective alternating doped and undoped layers. The four example resonators 2001S through 2001V shown in FIG. 2G may include interposer layers, as discussed in detail previously herein. Respective piezoelectric layer stacks of example bulk acoustic wave resonators 2001S through 2001V may be respectively sandwiched between respective multilayer metal acoustic SHF or EHF wave reflector bottom electrode 2013S through 2013V and respective multilayer metal acoustic SHF or EHF wave reflector top electrode 2015S through 2015V.

For the sake of comparison, diagram 2019W shows electromechanical coupling coefficient (KT2%) predicted by simulation for the four example resonators 2001S through 2001V, for different dopings in the normal axis piezoelectric layers of the example resonators 2001S through 2001V, while leaving reverse axis piezoelectric layers undoped. As shown in the diagram 2019W, a first trace 2021W depicts undoped normal axis Aluminum Nitride (AlN), a second trace 2023W depicts normal axis Aluminum Nitride doped with Scandium (e.g., AlSc0.25N), a third trace 2025W depicts normal axis Aluminum Nitride doped with Magnesium Zirconium (e.g., Al(Mg0.5Zr0.5)0.25N)), a fourth trace 2027W depicts normal axis Aluminum Nitride doped with Magnesium Hafnium (e.g., Al(Mg0.5Hf0.5)0.25N)) employed in the normal piezoelectric layers of the example resonators 2001S through 2001V. For example, as shown in trace 2021W of the diagram 2019W, for the single normal axis piezoelectric layer 201S of undoped Aluminum Nitride and single reverse axis piezoelectric layer 202S of undoped Aluminum Nitride in example two piezoelectric layer resonator 2001S, the electromechanical coupling coefficient (KT2%) predicted by simulation may be about 4%. For example, as shown in trace 2027W of the diagram 2019W, for the three normal axis doped piezoelectric layers 201V, 203V, 205V of Aluminum Nitride doped with Magnesium Hafnium (e.g., Al(Mg0.5Hf0.5)0.25N) along with two reverse axis undoped piezoelectric layers 202V, 204V in example five piezoelectric layer resonator 2001V, the electromechanical coupling coefficient (KT2%) predicted by simulation may be about 13%. It is theorized that electromechanical coupling coefficient (KT2%) may be enhanced for the five piezoelectric layer alternating axis stack resonator 2001V (with doped normal axis layers and undoped reverse axis layers), at least in part because considerably more acoustic energy may be confined in the alternating axis stack of the five piezoelectric layers 201V through 205V rather than in multilayer metal acoustic SHF or EHF wave reflector bottom electrode 2013V and in multilayer metal acoustic SHF or EHF wave reflector top electrode 2015V. Relative to the alternating axis stack of the five piezoelectric layer resonator 2001V, it is theorized that electromechanical coupling coefficient (KT2%) may be diminished for the two piezoelectric layer resonator 2001S, at least in part because relatively less acoustic energy may be confined in the two piezoelectric layers 201S, 202S, and relatively more acoustic energy in multilayer metal acoustic SHF or EHF wave reflector bottom electrode 2013S and in multilayer metal acoustic SHF or EHF wave reflector top electrode 2015S. Accordingly, in light of the foregoing, it is theorized that not only may electromechanical coupling coefficient (KT2%) be enhanced with choice of dopant, but electromechanical coupling coefficient (KT2%) may be further enhanced by increasing number of doped piezoelectric layers in the alternating axis stack arrangement, e.g., from the single doped piezoelectric layer 201S in resonator 2001S to the three doped piezoelectric layers 201V, 203V, 205V in resonator 2001V. Further, electromechanical coupling coefficient (KT2%) may be increased by reducing number of undoped piezoelectric layers in the alternating axis stack arrangement. For example, resonator 2001T and 2001U both have the same number of normal axis doped piezoelectric layers (e.g., resonator 2001T has two normal axis doped piezoelectric layers 201T, 203T, and resonator 2001U has two normal axis doped piezoelectric layers 201U, 203U). It should be noted that electromechanical coupling coefficient (KT2%) may be increased in resonator 2001T relative to 2001U, since resonator 2001T has a reduced number of undoped piezoelectric layers in the alternating axis stack arrangement (e.g., one reverse axis undoped piezoelectric layer 202T) relative to number of undoped piezoelectric layers in the alternating axis stack arrangement of resonator 2001U (e.g., two reverse axis undoped piezoelectric layers 202U, 2024U). Resonators 2001T, 2001V having an odd number of piezoelectric layers may have higher electromechanical coupling coefficient (KT2%) than resonators 2001S, 2001U having an even number of piezoelectric layers.

It is theorized that in resonators having doped and undoped piezoelectric layers, there may be averaging of electromechanical coupling coefficient (KT2%) among doped piezoelectric layers having relatively higher electromechanical coupling coefficient (KT2%) and undoped piezoelectric layers having relatively lower electromechanical coupling coefficient (KT2%). Accordingly, electromechanical coupling coefficient (KT2%) may be adjusted, e.g., determined as desired, by selecting number of doped piezoelectric layers and number of undoped piezoelectric layers. The piezoelectric layer doping (e.g., doping of the third piezoelectric layer) and the number of piezoelectric layers can facilitate determining a selected electromechanical coupling of the acoustic resonator (e.g., bulk acoustic millimeter wave resonator).

Figure 3A:
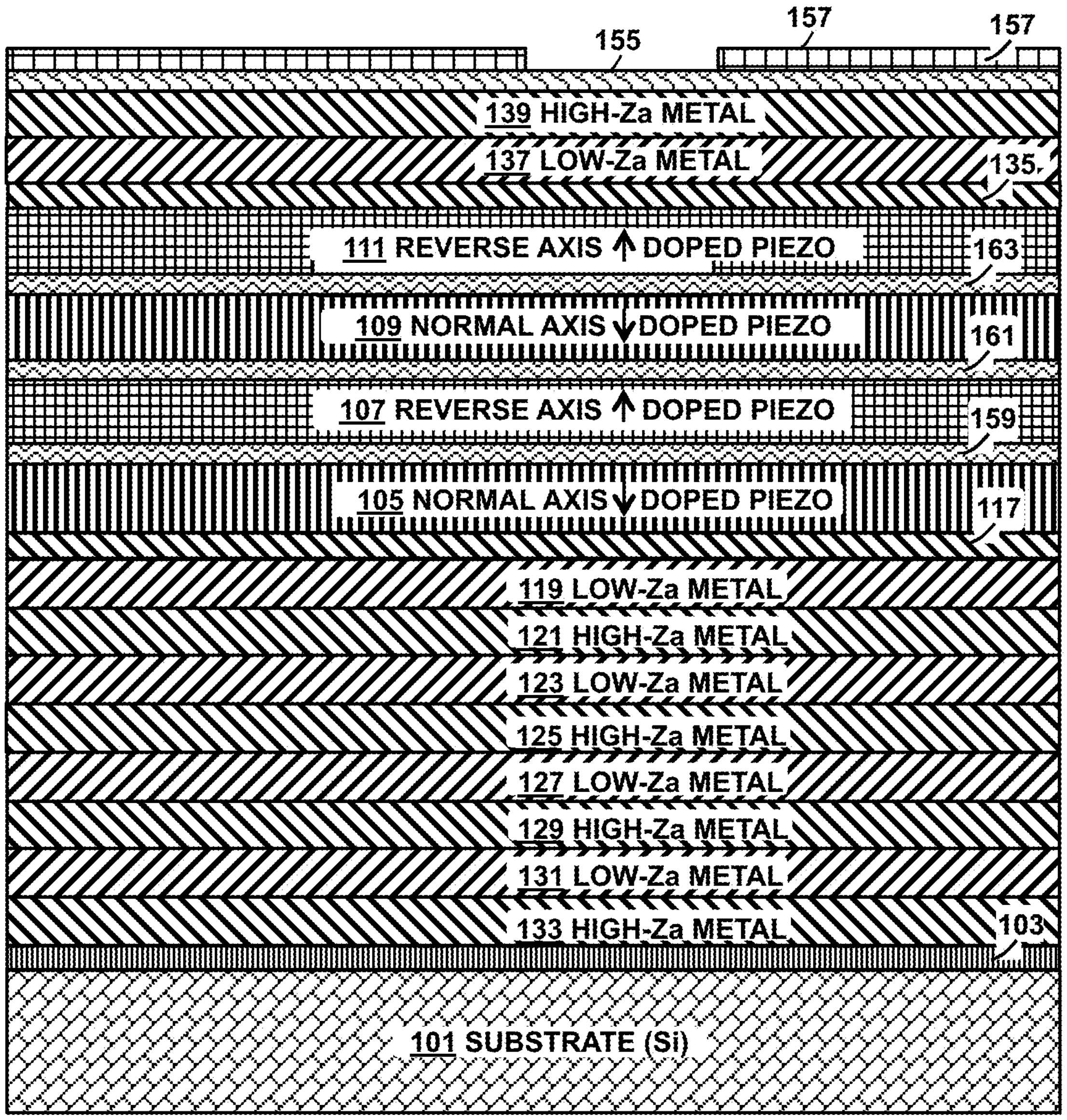
FIGS. 3A through 3E illustrate example integrated circuit structures used to form the example bulk acoustic wave resonator structure of FIG. 1A.

FIGS. 3A through 3E illustrate example integrated circuit structures used to form the example bulk acoustic wave resonator structure of FIG. 1A. As shown in FIG. 3A, magnetron sputtering may sequentially deposit layers on silicon substrate 101. Initially, a seed layer 103 of suitable material (e.g., aluminum nitride (AlN), e.g., silicon dioxide ($SiO_2$), e.g., aluminum oxide ($Al_2O_3$), e.g., silicon nitride ($Si_3N_4$), e.g., amorphous silicon (a-Si), e.g., silicon carbide (SiC)) may be deposited, for example, by sputtering from a respective target (e.g., from an aluminum, silicon, or silicon carbide target). The seed layer may have a layer thickness in a range from approximately one hundred Angstroms (100 A) to approximately one micron (1 um). Next, successive pairs of alternating layers of high acoustic impedance metal and low acoustic impedance metal may be deposited by alternating sputtering from targets of high acoustic impedance metal and low acoustic impedance metal. For example, sputtering targets of high acoustic impedance metal such as Molybdenum or Tungsten may be used for sputtering the high acoustic impedance metal layers, and sputtering targets of low acoustic impedance metal such as Aluminum or Titanium may be used for sputtering the low acoustic impedance metal layers. For example, the fourth pair of bottom metal electrode layers, 133, 131, may be deposited by sputtering the high acoustic impedance metal for a first bottom metal electrode layer 133 of the pair on the seed layer 103, and then sputtering the low acoustic impedance metal for a second bottom metal electrode layer 131 of the pair on the first layer 133 of the pair. Similarly, the third pair of bottom metal electrode layers, 129, 127, may then be deposited by sequentially sputtering from the high acoustic impedance metal target and the low acoustic impedance metal target. Similarly, the second pair of bottom metal electrodes 125, 123, may then be deposited by sequentially sputtering from the high acoustic impedance metal target and the low acoustic impedance metal target. Similarly, the first pair of bottom metal electrodes 121, 119, may then be deposited by sequentially sputtering from the high acoustic impedance metal target and the low acoustic impedance metal target. Respective layer thicknesses of bottom metal electrode layers of the first, second, third and fourth pairs 119, 121, 123, 125, 127, 129, 131, 133 may correspond to approximately a quarter wavelength (e.g., a quarter of an acoustic wavelength) of the resonant frequency at the resonator (e.g., respective layer thickness of about six hundred Angstroms (600 A) for the example 24 GHz resonator.) Initial bottom electrode layer 119 may then be deposited by sputtering from the high acoustic impedance metal target. Thickness of the initial bottom electrode layer may be, for example, about an eighth wavelength (e.g., an eighth of an acoustic wavelength) of the resonant frequency of the resonator (e.g., layer thickness of about three hundred Angstroms (300 A) for the example 24 GHz resonator.)

A stack of four layers of doped piezoelectric material, for example, four layers of Aluminum Nitride (AlN) having the wurtzite structure may be doped and may be deposited by sputtering. For example, bottom doped piezoelectric layer 105, first middle doped piezoelectric layer 107, second middle doped piezoelectric layer 109, and top doped piezoelectric layer 111 may be deposited by sputtering. The four layers of doped piezoelectric material in the stack 104, may have the alternating axis arrangement in the respective stack 104. For example the bottom doped piezoelectric layer 105 may be sputter deposited to have the normal axis orientation, which is depicted in FIG. 3A using the downward directed arrow. The first middle doped piezoelectric layer 107 may be sputter deposited to have the reverse axis orientation, which is depicted in the FIG. 3A using the upward directed arrow. The second middle doped piezoelectric layer 109 may have the normal axis orientation, which is depicted in the FIG. 3A using the downward directed arrow. The top doped piezoelectric layer may have the reverse axis orientation, which is depicted in the FIG. 3A using the upward directed arrow. As mentioned previously herein, polycrystalline thin film AlN may be grown in the crystallographic c-axis negative polarization, or normal axis orientation perpendicular relative to the substrate surface using reactive magnetron sputtering of the Aluminum target in the nitrogen atmosphere. As was discussed in greater detail previously herein, changing sputtering conditions, for example by adding oxygen, may reverse the axis to a crystallographic c-axis positive polarization, or reverse axis, orientation perpendicular relative to the substrate surface. Further, the polycrysaline thin film AlN having normal axis or reverse axis may be doped.

The polycrysaline thin film AlN having normal axis or reverse axis as described herein may be doped, for example, by co-sputtering one or more dopant targets along with an Aluminum target. For example, a Scandium target may be co-sputtered with an Aluminum target under suitable conditions by reactive magnetron sputtering using a gas composition of argon and nitrogen. Scandium and Aluminum can be combined in a single alloy target as well as being co-sputtered separately. Deposition rate of the constituent species may depend, in large degree, on the sputtering power applied to the individual sputtering targets, for example, in this case the Aluminum target and the Scandium target. By adjusting the sputtering power of each target, the flux of aluminum and Scandium species directed towards the substrate can be controlled so that the desired amount of Scandium and Aluminum in the piezoelectric nitride film can be realized. The foregoing may be employed to deposit Scandium doped Aluminum Nitride in a selected Scandium concentration within a range from a fraction of a percent to thirty percent, for example AlSc0.25N.

For example, Magnesium and Zirconium targets (or a single combined Magnesium and Zirconium target) may be co-sputtered with an Aluminum target under suitable conditions by reactive magnetron sputtering using a gas composition of argon and nitrogen. By adjusting the sputtering power of each target, the flux of Aluminum, Magnesium and Zirconium species directed towards the substrate can be controlled so that the desired amount of Magnesium, Zirconium and Aluminum in the piezoelectric nitride film can be realized. The foregoing may be employed to deposit Magnesium and Zirconium doped Aluminum Nitride in selected concentrations of Magnesium and Zirconium, for example twenty percent or less of Magnesium and twenty percent or less of Zirconium, for example Al(Mg0.5Zr0.5) 0.25N). Further, a combined three element target (e.g., Al, Mg and Zr) may be employed.

For example, Magnesium and Hafnium targets (or a single combined Magnesium and Hafnium target) may be co-sputtered with an Aluminum target under suitable conditions by reactive magnetron sputtering using a gas composition of Argon and Nitrogen. By adjusting the sputtering power of each target, the flux of Aluminum, Magnesium and Hafnium species directed towards the substrate can be controlled so that the desired amount of Magnesium, Hafnium and Aluminum in the piezoelectric nitride film can be realized. The foregoing may be employed to deposit Magnesium and Hafnium doped Aluminum Nitride in selected concentrations of Magnesium and Hafnium, for example twenty percent or less of Magnesium and twenty percent or less of Hafnium, for example e.g., Al(Mg0.5Hf0.5)0.25N. Further, a combined three element target (e.g., Al, Mg and HF) may be employed.

For example, Magnesium and Niobium targets (or a single combined Magnesium and Niobium target) may be co-sputtered with an Aluminum target under suitable conditions by reactive magnetron sputtering using a gas composition of Argon and Nitrogen. By adjusting the sputtering power of each target, the flux of Aluminum, Magnesium and Niobium species directed towards the substrate can be controlled so that the desired amount of Magnesium, Niobium and Aluminum in the piezoelectric nitride film can be realized. The foregoing may be employed to deposit Magnesium and Niobium doped Aluminum Nitride in selected concentrations of Magnesium and Niobium, for example forty percent or less of Magnesium and twenty percent or less of Niobium, for example e.g., Al(Mg0.67Nb0.33)0.6N. Further, a combined three element target (e.g., Al, Mg and Nb) may be employed.

To synthesize aluminum nitride having multiple dopants, in this case magnesium and hafnium, the technique of sputtering and MOCVD can be used. Other techniques can be used and sputtering and chemical vapor deposition are used as representative, but not limiting, embodiments of the synthesis step.

Magnetron sputtering utilizes a target, for example a metal target, placed in a vacuum chamber, with a pattern of magnets, called a magnetron positioned behind the target outside of the vacuum chamber. The magnets induce a magnetic field above the target that serves to focus and confine the species in the plasma and allow for a more intense and efficient plasma. It is these species that sputter from the target surface. For example, in the case of the Magnesium and Hafnium doped Aluminum Nitride, an alloy target of Aluminum, Magnesium and Hafnium can be formed by combining these three elements, in the necessary percentages, forming the target and then utilizing the target for sputtering. The amounts of Magnesium and Hafnium in the alloy target may be approximately the same percentage as the percentage desired in the doped aluminum nitride thin film. Aluminum nitride, deposited by sputtering, may be made by utilizing an argon/nitrogen gas mixture that is admitted into the vacuum chamber in a 3:1 to 4:1 nitrogen to argon gas ratio. Using a throttle valve in front of the vacuum pump or by adjusting the total flow rate, the pressure of the chamber may be maintained at 10 mTorr or below during the deposition. The total power is highly deposition system dependent and can range from 500 W to more than 10 kW. Typically one might deposit at 2 to 5 kW of power. Substrate temperature can range from room temperature (25 C) to 400 C. During the sputtering process, the Aluminum, Magnesium and Hafnium are sputtered from the target and condense on the substrate surface positioned facing the sputtering target. The Magnesium and Hafnium occupy lattice sites normally occupied by aluminum atoms and, in this way, "substitute" for the aluminum atoms.

An alternative sputtering method is to use individual sputtering targets. For example, a target of Aluminum, a target of Magnesium and a target of Hafnium may be sputtered at the same time in the process known as co-sputtering. Deposition conditions are the same as described above for the alloy target. One unique difference is that the sputter power for each target may be individually controlled so that the amount of each element (Aluminum, Hafnium or Magnesium) incorporated into the Aluminum Nitride film can be varied. For example using higher sputtering powers results in more incorporation of that particular specie. By varying and adjusting the deposition powers one can tailor the deposited Aluminum Nitride film to have a range of Magnesium and Hafnium doping composition (e.g, graded composition). One such example is to start the Aluminum Nitride deposition by sputtering only Aluminum Nitride (i.e. no sputtering from the Magnesium and Hafnium targets). As the aluminum nitride deposition progresses, the power to the Magnesium and Hafnium targets is slowly increased resulting in a gradually increasing addition of Magnesium and Hafnium into the Aluminum Nitride film. Once the target composition is reached in the depositing film, the remaining portion of the film can be deposited at these power settings on the Magnesium, Hafnium and Aluminum targets. Although Magnesium and Hafnium dopants were just now discussed, the foregoing is likewise applicable to sputtering of other dopants discussed previously herein. Further, the foregoing graded doping may be applicable to sputter deposition of reverse axis doped piezoelectric Aluminum Nitride, discussed previously herein, as well as normal axis doped piezoelectric Aluminum Nitride. Graded doping may facilitate deposition of reverse axis doped piezoelectric Aluminum Nitride. Evidence shows that doping may increase electromechanical coupling coefficient (KT2) of sputtered normal axis doped Aluminum Nitride piezoelectric layers. Further, it is theorized that doping may likewise increase electromechanical coupling coefficient (KT2) of sputtered reverse axis doped Aluminum Nitride piezoelectric layers.

Interposer layers may be sputtered between sputtering of doped piezoelectric layers, so as to be sandwiched between doped piezoelectric layers of the stack. For example, first interposer layer 159, may sputtered between sputtering of bottom doped piezoelectric layer 105, and the first middle doped piezoelectric layer 107, so as to be sandwiched between the bottom doped piezoelectric layer 105, and the first middle doped piezoelectric layer 107. For example, second interposer layer 161 may be sputtered between sputtering first middle doped piezoelectric layer 107 and the second middle doped piezoelectric layer 109 so as to be sandwiched between the first middle doped piezoelectric layer 107, and the second middle doped piezoelectric layer 109. For example, third interposer layer 163, may be sputtered between sputtering of second middle doped piezoelectric layer 109 and the top doped piezoelectric layer 111 so as to be sandwiched between the second middle doped piezoelectric layer 109 and the top doped piezoelectric layer 111.

As discussed previously, one or more of the interposer layers (e.g., interposer layers 159, 161, 163) may be metal interposer layers, e.g., high acoustic impedance metal interposer layers, e.g., Molybdenum metal interposer layers. These may be deposited by sputtering from a metal target. As discussed previously, one or more of the interposer layers (e.g., interposer layers 159, 161, 163) may be dielectric interposer layers, e.g., silicon dioxide interposer layers. These may be deposited by reactive sputtering from a Silicon target in an oxygen atmosphere. Alternatively or additionally, one or more (e.g., one or a plurality of) interposer layers may be formed of different metal layers. For example, high acoustic impedance metal layer such as Tungsten (W) or Molybdenum (Mo) may (but need not) raise effective electromechanical coupling coefficient (Kt2) while subsequently deposited metal layer with hexagonal symmetry such as Titanium (Ti) may (but need not) facilitate higher crystallographic quality of subsequently deposited doped piezoelectric layer. Alternatively or additionally, one or more (e.g., one or a plurality of) interposer layers may be formed of different dielectric layers. For example, high acoustic impedance dielectric layer such as Hafnium Dioxide (HfO2) may (but need not) raise effective electromechanical coupling coefficient (Kt2) while subsequently deposited amorphous dielectric layer such as Silicon Dioxide (SiO2) may (but need not) facilitate compensating for temperature dependent frequency shifts. Alternatively or additionally, one or more (e.g., one or a plurality of) interposer layers (e.g., interposer layers 159, 161, 163) may be may comprise metal and dielectric for respective interposer layers. For example, high acoustic impedance metal layer such as Tungsten (W) or Molybdenum (Mo) may (but need not) raise effective electromechanical coupling coefficient (Kt2) while subsequently deposited amorphous dielectric layer such as Silicon Dioxide (SiO2) may (but need not) facilitate compensating for temperature dependent frequency shifts. Sputtering thickness of interposer layers may be as discussed previously herein. Interposer layers may facilitate sputter deposition of piezoelectric layers. For example, initial sputter deposition of second interposer layer 166 on reverse axis first middle piezoelectric layer 107 may facilitate subsequent sputter deposition of normal axis second middle piezoelectric layer 109.

Initial top electrode layer 135 may be deposited on the top doped piezoelectric layer 111 by sputtering from the high acoustic impedance metal target. Thickness of the initial top electrode layer may be, for example, about an eighth wavelength (e.g., an eighth of an acoustic wavelength) of the resonant frequency of the resonator (e.g., layer thickness of about three hundred Angstroms (300 A) for the example 24 GHz resonator.) The first pair of top metal electrode layers, 137, 139, may then be deposited by sputtering the low acoustic impedance metal for a first top metal electrode layer 137 of the pair, and then sputtering the high acoustic impedance metal for a second top metal electrode layer 139 of the pair on the first layer 137 of the pair. Layer thicknesses of top metal electrode layers of the first pair 137, 139 may correspond to approximately a quarter wavelength (e.g., a quarter acoustic wavelength) of the resonant frequency of the resonator (e.g., respective layer thickness of about six hundred Angstroms (600 A) for the example 24 GHz resonator.) The optional mass load layer 155 may be sputtered from a high acoustic impedance metal target onto the second top metal electrode layer 139 of the pair. Thickness of the optional mass load layer may be as discussed previously herein. The mass load layer 155 may be an additional mass layer to increase electrode layer mass, so as to facilitate the preselected frequency compensation down in frequency (e.g., compensate to decrease resonant frequency). Alternatively, the mass load layer 155 may be a mass load reduction layer, e.g., ion milled mass load reduction layer 155, to decrease electrode layer mass, so as to facilitate the preselected frequency compensation up in frequency (e.g., compensate to increase resonant frequency). Accordingly, in such case, in FIG. 3A mass load reduction layer 155 may representatively illustrate, for example, an ion milled region of the second member 139 of the first pair of electrodes 137, 139 (e.g., ion milled region of high acoustic impedance metal electrode 139) or, for example, an atomic layer etching of the second member 139 of the first pair of electrodes 137, 139 (e.g., atomic layer etched region of high acoustic impedance metal electrode 139).

The plurality of lateral features 157 (e.g., patterned layer 157) may be formed by sputtering a layer of additional mass loading having a layer thickness as discussed previously herein. The plurality of lateral features 157 (e.g., patterned layer 157) may be made by patterning the layer of additional mass loading after it is deposited by sputtering. The patterning may done by photolithographic masking, layer etching, and mask removal. Initial sputtering may be sputtering of a metal layer of additional mass loading from a metal target (e.g., a target of Tungsten (W), Molybdenum (Mo), Titanium (Ti) or Aluminum (Al)). In alternative examples, the plurality of lateral features 157 may be made of a patterned dielectric layer (e.g., a patterned layer of Silicon Nitride (SiN), Silicon Dioxide (SiO2) or Silicon Carbide (SiC)). For example Silicon Nitride, and Silicon Dioxide may be deposited by reactive magnetron sputtering from a silicon target in an appropriate atmosphere, for example Nitrogen, Oxygen or Carbon Dioxide. Silicon Carbide may be sputtered from a Silicon Carbide target.

Figure 3B:
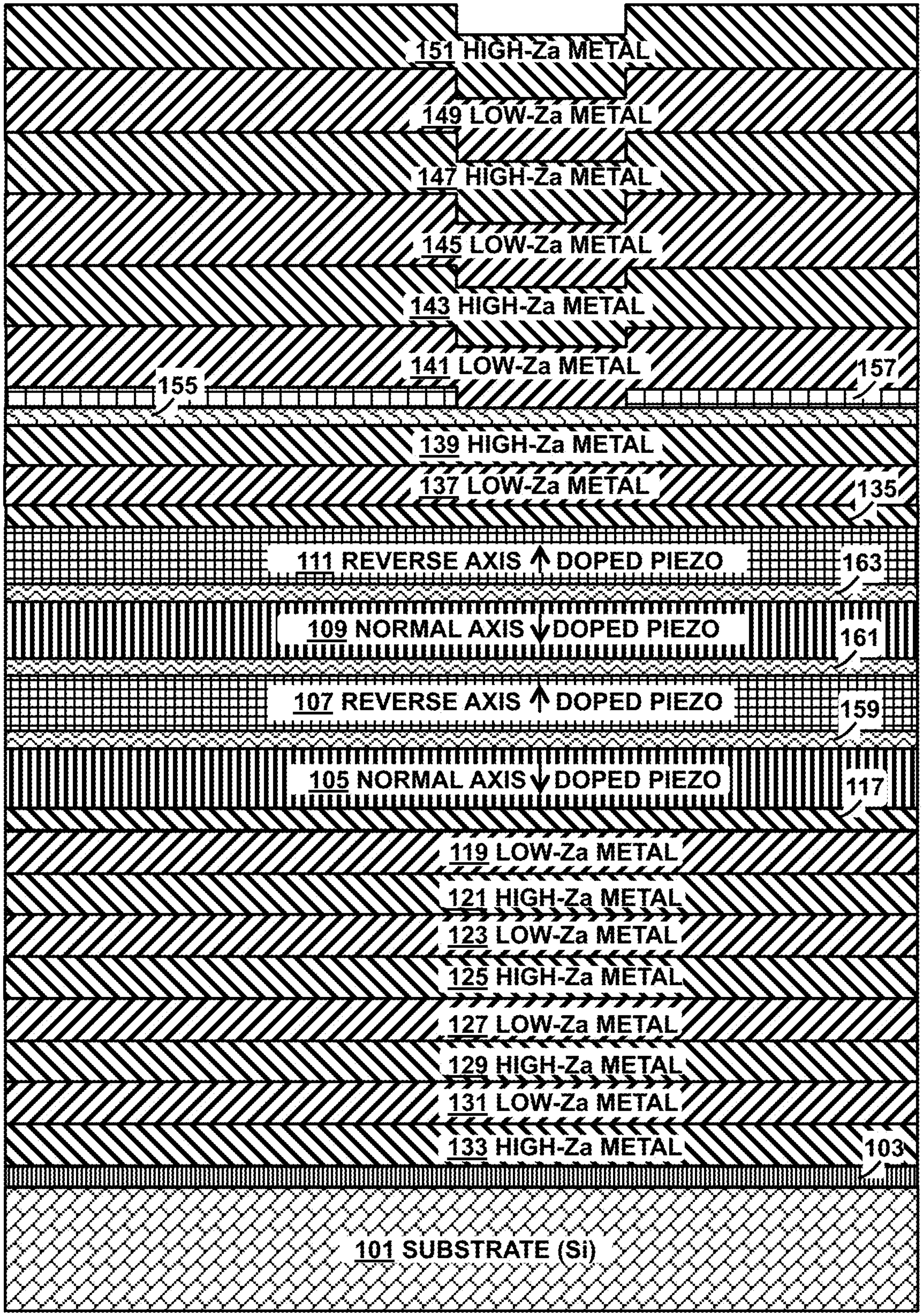

Once the plurality of lateral features 157 (e.g., patterned layer 157) have been patterned as shown in FIG. 3A, sputter deposition of successive additional pairs of alternating layers of high acoustic impedance metal and low acoustic impedance metal may continue as shown in FIG. 3B by alternating sputtering from targets of high acoustic impedance metal and low acoustic impedance metal. For example, sputtering targets of high acoustic impedance metal such as Molybdenum or Tungsten may be used for sputtering the high acoustic impedance metal layers, and sputtering targets of low acoustic impedance metal such as Aluminum or Titanium may be used for sputtering the low acoustic impedance metal layers. For example, the second pair of top metal electrode layers, 141, 143, may be deposited by sputtering the low acoustic impedance metal for a first bottom metal electrode layer 141 of the pair on the plurality of lateral features 157, and then sputtering the high acoustic impedance metal for a second top metal electrode layer 143 of the pair on the first layer 141 of the pair. Similarly, the third pair of top metal electrode layers, 145, 147, may then be deposited by sequentially sputtering from the low acoustic impedance metal target and the high acoustic impedance metal target. Similarly, the fourth pair of top metal electrodes 149, 151, may then be deposited by sequentially sputtering from the low acoustic impedance metal target and the high acoustic impedance metal target. Respective layer thicknesses of top metal electrode layers of the first, second, third and fourth pairs 137, 139, 141, 143, 145, 147, 149, 151 may correspond to approximately a quarter wavelength (e.g., a quarter acoustic wavelength) at the resonant frequency of the resonator (e.g., respective layer thickness of about six hundred Angstroms (600 A) for the example 24 GHz resonator.)

As mentioned previously, and as shown in FIG. 3B, after the lateral features 157 are formed (e.g., patterned layer 157), they may function as a step feature template, so that subsequent top metal electrode layers formed on top of the lateral features 157 may retain step patterns imposed by step features of the lateral features 157. For example, the second pair of top metal electrode layers 141, 143, the third pair of top metal electrode layers 145, 147, and the fourth pair of top metal electrodes 149, 151, may retain step patterns imposed by step features of the lateral features 157.

Figure 3C:
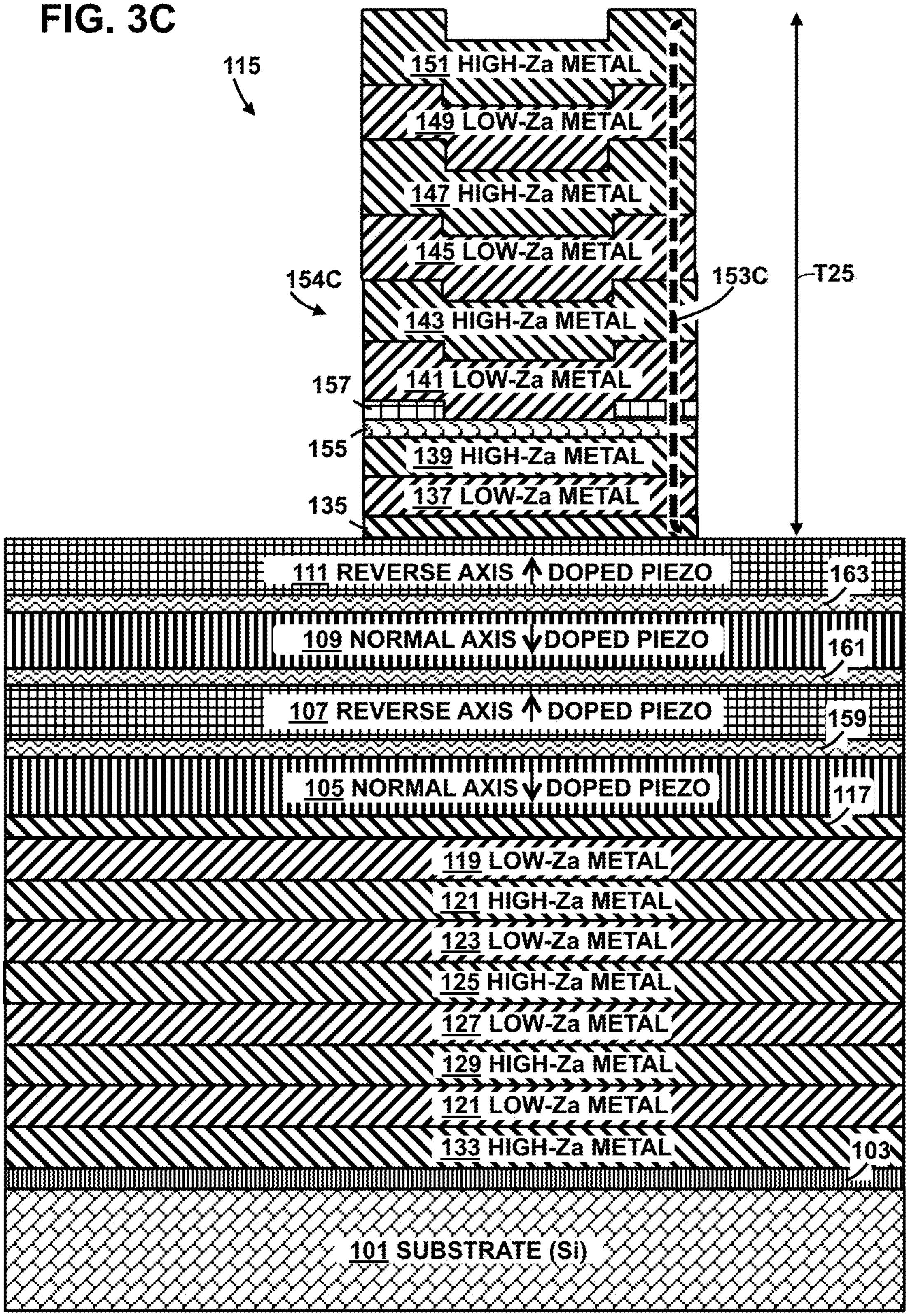

After depositing layers of the fourth pair of top metal electrodes 149, 151 as shown in FIG. 3B, suitable photolithographic masking and etching may be used to form a first portion of etched edge region 153C for the top acoustic reflector 115 as shown in FIG. 3C. A notional heavy dashed line is used in FIG. 3C depicting the first portion of etched edge region 153C associated with the top acoustic reflector 115. The first portion of etched edge region 153C may extend along the thickness dimension T25 of the top acoustic reflector 115. The first portion etched edge region 153C may extend through (e.g., entirely through or partially through) the top acoustic reflector 115. The first portion of the etched edge region 153C may extend through (e.g., entirely through or partially through) the initial top metal electrode layer 135. The first portion of the etched edge region 153C may extend through (e.g., entirely through or partially through) the first pair of top metal electrode layers 137, 139. The first portion of the etched edge region 153C may extend through (e.g., entirely through or partially through) the optional mass load layer 155. The first portion of the etched edge region 153C may extend through (e.g., entirely through or partially through) at least one of the lateral features 157 (e.g., through patterned layer 157). The first portion of etched edge region 153C may extend through (e.g., entirely through or partially through) the second pair of top metal electrode layers, 141,143. The first portion etched edge region 153C may extend through (e.g., entirely through or partially through) the third pair of top metal electrode layers, 145, 147. The first portion of etched edge region 153C may extend through (e.g., entirely through or partially through) the fourth pair of top metal electrode layers, 149, 151. Just as suitable photolithographic masking and etching may be used to form the first portion of etched edge region 153C at a lateral extremity the top acoustic reflector 115 as shown in FIG. 3C, such suitable photolithographic masking and etching may likewise be used to form another first portion of a laterally opposing etched edge region 154C at an opposing lateral extremity the top acoustic reflector 115, e.g., arranged laterally opposing or opposite from the first portion of etched edge region 153C, as shown in FIG. 3C. The another first portion of the laterally opposing etched edge region 154C may extend through (e.g., entirely through or partially through) the opposing lateral extremity of the top acoustic reflector 115, e.g., arranged laterally opposing or opposite from the first portion of etched edge region 153C, as shown in FIG. 3C. The mesa structure (e.g., third mesa structure) corresponding to the top acoustic reflector 115 may extend laterally between (e.g., may be formed between) etched edge region 153C and laterally opposing etched edge region 154C. Dry etching may be used, e.g., reactive ion etching may be used to etch the materials of the top acoustic reflector. Chlorine based reactive ion etch may be used to etch Aluminum, in cases where Aluminum is used in the top acoustic reflector. Fluorine based reactive ion etch may be used to etch Tungsten (W), Molybdenum (Mo), Titanium (Ti), Silicon Nitride (SiN), Silicon Dioxide (SiO2) and/or Silicon Carbide (SiC) in cases where these materials are used in the top acoustic reflector.

Figure 3D:
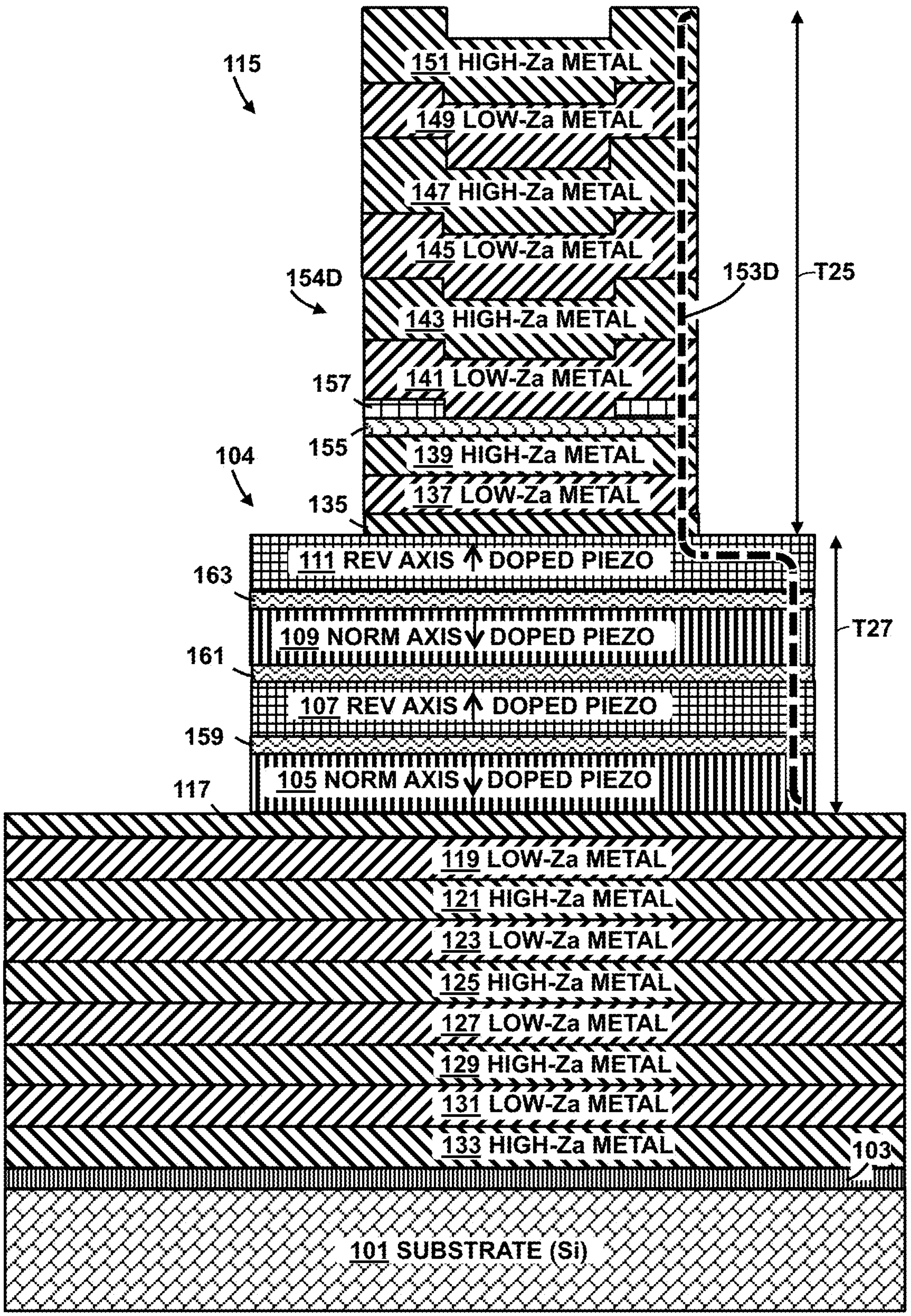

After etching to form the first portion of etched edge region 153C for top acoustic reflector 115 as shown in FIG. 3C, additional suitable photolithographic masking and etching may be used to form elongated portion of etched edge region 153D for top acoustic reflector 115 and for the stack 104 of four doped piezoelectric layers 105, 107, 109, 111 as shown in FIG. 3D. A notional heavy dashed line is used in FIG. 3D depicting the elongated portion of etched edge region 153D associated with the stack 104 of four doped piezoelectric layers 105, 107, 109, 111 and with the top acoustic reflector 115. Accordingly, the elongated portion of etched edge region 153D shown in FIG. 3D may extend through (e.g., entirely through or partially through) the fourth pair of top metal electrode layers, 149, 151, the third pair of top metal electrode layers, 145, 147, the second pair of top metal electrode layers, 141,143, at least one of the lateral features 157 (e.g., patterned layer 157), the optional mass load layer 155, the first pair of top metal electrode layers 137, 139 and the initial top metal electrode layer 135 of the top acoustic reflector 115. The elongated portion of etched edge region 153D may extend through (e.g., entirely through or partially through) the stack 104 of four doped piezoelectric layers 105, 107, 109, 111. The elongated portion of etched edge region 153D may extend through (e.g., entirely through or partially through) the first doped piezoelectric layer, 105, e.g., having the normal axis orientation, first interposer layer 159, first middle doped piezoelectric layer, 107, e.g., having the reverse axis orientation, second interposer layer 161, second middle interposer layer, 109, e.g., having the normal axis orientation, third interposer layer 163, and top doped piezoelectric layer 111, e.g., having the reverse axis orientation. The elongated portion of etched edge region 153D may extend along the thickness dimension T25 of the top acoustic reflector 115. The elongated portion of etched edge region 153D may extend along the thickness dimension T27 of the stack 104 of four doped piezoelectric layers 105, 107, 109, 111. Just as suitable photolithographic masking and etching may be used to form the elongated portion of etched edge region 153D at the lateral extremity the top acoustic reflector 115 and at a lateral extremity of the stack 104 of four doped piezoelectric layers 105, 107, 109, 111 as shown in FIG. 3D, such suitable photolithographic masking and etching may likewise be used to form another elongated portion of the laterally opposing etched edge region 154D at the opposing lateral extremity the top acoustic reflector 115 and the stack 104 of four doped piezoelectric layers 105, 107, 109, 111, e.g., arranged laterally opposing or opposite from the elongated portion of etched edge region 153D, as shown in FIG. 3D. The another elongated portion of the laterally opposing etched edge region 154D may extend through (e.g., entirely through or partially through) the opposing lateral extremity of the top acoustic reflector 115 and the stack of four doped piezoelectric layers 105, 107, 109, 111, e.g., arranged laterally opposing or opposite from the elongated portion of etched edge region 153D, as shown in FIG. 3D. The mesa structure (e.g., third mesa structure) corresponding to the top acoustic reflector 115 may extend laterally between (e.g., may be formed between) etched edge region 153D and laterally opposing etched edge region 154D. The mesa structure (e.g., first mesa structure) corresponding to stack 104 of the example four doped piezoelectric layers may extend laterally between (e.g., may be formed between) etched edge region 153D and laterally opposing etched edge region 154D. Dry etching may be used, e.g., reactive ion etching may be used to etch the materials of the stack 104 of four doped piezoelectric layers 105, 107, 109, 111 and any interposer layers. For example, Chlorine based reactive ion etch may be used to etch doped Aluminum Nitride piezoelectric layers. For example, Fluorine based reactive ion etch may be used to etch Tungsten (W), Molybdenum (Mo), Titanium (Ti), Silicon Nitride (SiN), Silicon Dioxide (SiO2) and/or Silicon Carbide (SiC) in cases where these materials are used in interposer layers.

Figure 3E:
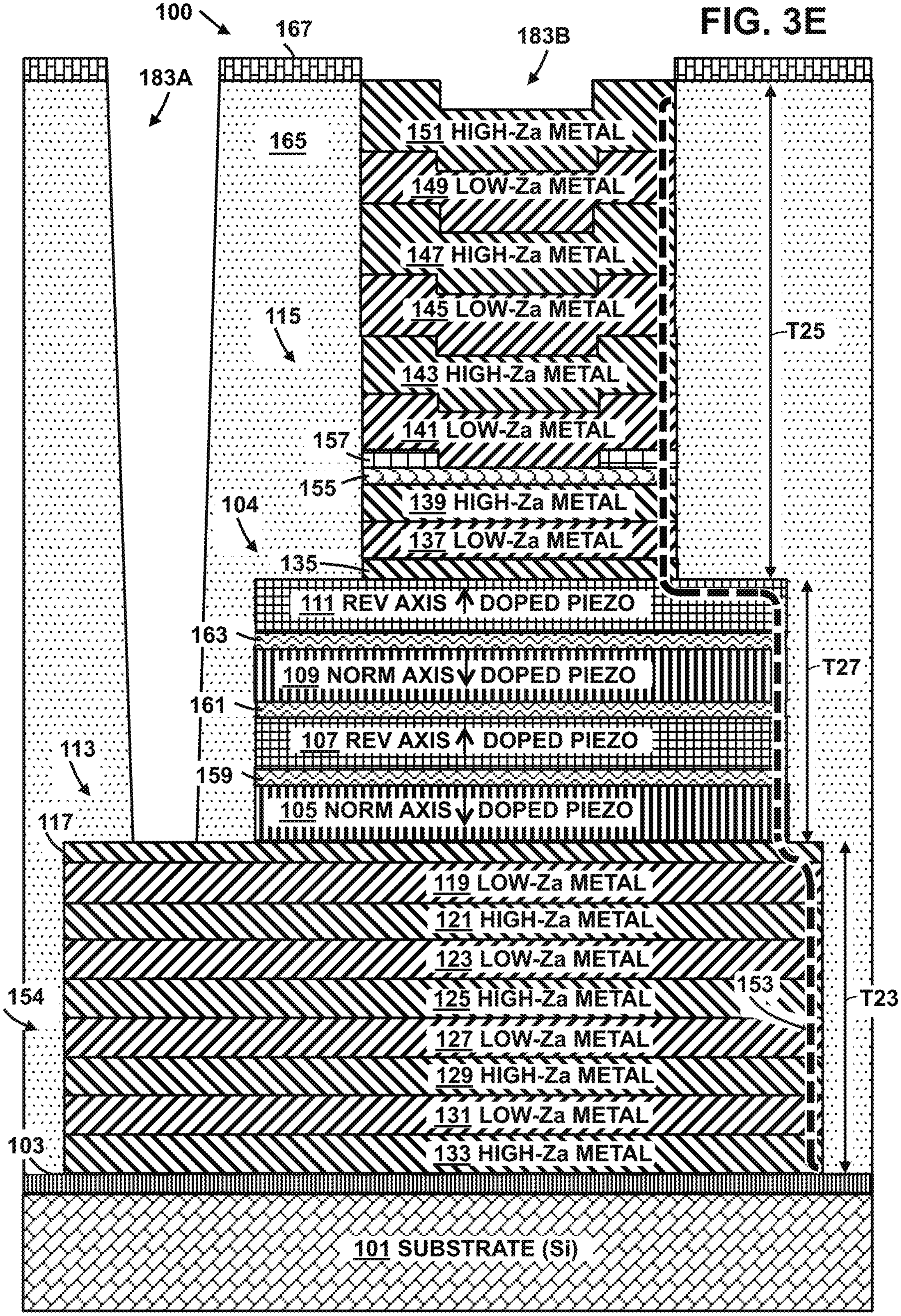

After etching to form the elongated portion of etched edge region 153D for top acoustic reflector 115 and the stack 104 of four doped piezoelectric layers 105, 107, 109, 111 as shown in FIG. 3D, further additional suitable photolithographic masking and etching may be used to form etched edge region 153D for top acoustic reflector 115 and for the stack 104 of four doped piezoelectric layers 105, 107, 109, 111 and for bottom acoustic reflector 113 as shown in FIG. 3E. The notional heavy dashed line is used in FIG. 3E depicting the etched edge region 153 associated with the stack 104 of four doped piezoelectric layers 105, 107, 109, 111 and with the top acoustic reflector 115 and with the bottom acoustic reflector 113. The etched edge region 153 may extend along the thickness dimension T25 of the top acoustic reflector 115. The etched edge region 153 may extend along the thickness dimension T27 of the stack 104 of four doped piezoelectric layers 105, 107, 109, 111. The etched edge region 153 may extend along the thickness dimension T23 of the bottom acoustic reflector 113. Just as suitable photolithographic masking and etching may be used to form the etched edge region 153 at the lateral extremity the top acoustic reflector 115 and at the lateral extremity of the stack 104 of four doped piezoelectric layers 105, 107, 109, 111 and at a lateral extremity of the bottom acoustic reflector 113 as shown in FIG. 3E, such suitable photolithographic masking and etching may likewise be used to form another laterally opposing etched edge region 154 at the opposing lateral extremity of the top acoustic reflector 115 and the stack 104 of four doped piezoelectric layers 105, 107, 109, 111, and the bottom acoustic reflector 113, e.g., arranged laterally opposing or opposite from the etched edge region 153, as shown in FIG. 3E. The laterally opposing etched edge region 154 may extend through (e.g., entirely through or partially through) the opposing lateral extremity of the top acoustic reflector 115 and the stack of four doped piezoelectric layers 105, 107, 109, 111, and the bottom acoustic reflector 113 e.g., arranged laterally opposing or opposite from the etched edge region 153, as shown in FIG. 3E.

After the foregoing etching to form the etched edge region 153 and the laterally opposing etched edge region 154 of the resonator 100 shown in FIG. 3E, a planarization layer 165 may be deposited. A suitable planarization material (e.g., Silicon Dioxide (SiO2), Hafnium Dioxide (HfO2), Polyimide, or BenzoCyclobutene (BCB)). These materials may be deposited by suitable methods, for example, chemical vapor deposition, standard or reactive magnetron sputtering (e.g., in cases of SiO2 or HfO2) or spin coating (e.g., in cases of Polyimide or BenzoCyclobutene (BCB)). An isolation layer 167 may also be deposited over the planarization layer 165. A suitable low dielectric constant (low-k), low acoustic impedance (low-Za) material may be used for the isolation layer 167, for example polyimide, or BenzoCyclobutene (BCB). These materials may be deposited by suitable methods, for example, chemical vapor deposition, standard or reactive magnetron sputtering or spin coating. After planarization layer 165 and the isolation layer 167 have been deposited, additional procedures of photolithographic masking, layer etching, and mask removal may be done to form a pair of etched acceptance locations 183A, 183B for electrical interconnections. Reactive ion etching or inductively coupled plasma etching with a gas mixture of argon, oxygen and a fluorine containing gas such as tetrafluoromethane (CF4) or Sulfur hexafluoride (SF6) may be used to etch through the isolation layer 167 and the planarization layer 165 to form the pair of etched acceptance locations 183A, 183B for electrical interconnections. Photolithographic masking, sputter deposition, and mask removal may then be used form electrical interconnects in the pair of etched acceptance locations 183A, 183B shown in FIG. 3E, so as to provide for the bottom electrical interconnect 169 and top electrical interconnect 171 that are shown explicitly in FIG. 1A. A suitable material, for example Gold (Au) may be used for the bottom electrical interconnect 169 and top electrical interconnect 171.

FIGS. 4A through 4G show alternative example bulk acoustic wave resonators 400A through 400G to the example bulk acoustic wave resonator 100A shown in FIG. 1A. For example, the bulk acoustic wave resonator 400A, 400E shown in FIG. 4A, 4E may have a cavity 483A, 483E, e.g., an air cavity 483A, 483E, e.g., extending into substrate 401A, 401E, e.g., extending into silicon substrate 401A, 401E, e.g., arranged below bottom acoustic reflector 413A, 413E. The cavity 483A, 483E may be formed using techniques known to those with ordinary skill in the art. For example, the cavity 483A,483E may be formed by initial photolithographic masking and etching of the substrate 401A, 401E (e.g., silicon substrate 401A, 401E), and deposition of a sacrificial material (e.g., phosphosilicate glass (PSG)). The phosphosilicate glass (PSG) may comprise 8% phosphorous and 92% silicon dioxide. The resonator 400A, 400E may be formed over the sacrificial material (e.g., phosphosilicate glass (PSG)). The sacrificial material may then be selectively etched away beneath the resonator 400A, 400E, leaving cavity 483A, 483E beneath the resonator 400A, 400E. For example phosphosilicate glass (PSG) sacrificial material may be selectively etched away by hydrofluoric acid beneath the resonator 400A, 400E, leaving cavity 483A, 483E beneath the resonator 400A, 400E. The cavity 483A, 483E may, but need not, be arranged to provide acoustic isolation of the structures, e.g., bottom acoustic reflector 413A, 413E, e.g., stack 404A, 404E of doped piezoelectric layers, e.g., resonator 400A, 400E from the substrate 401A, 401E.

Figure 4A:
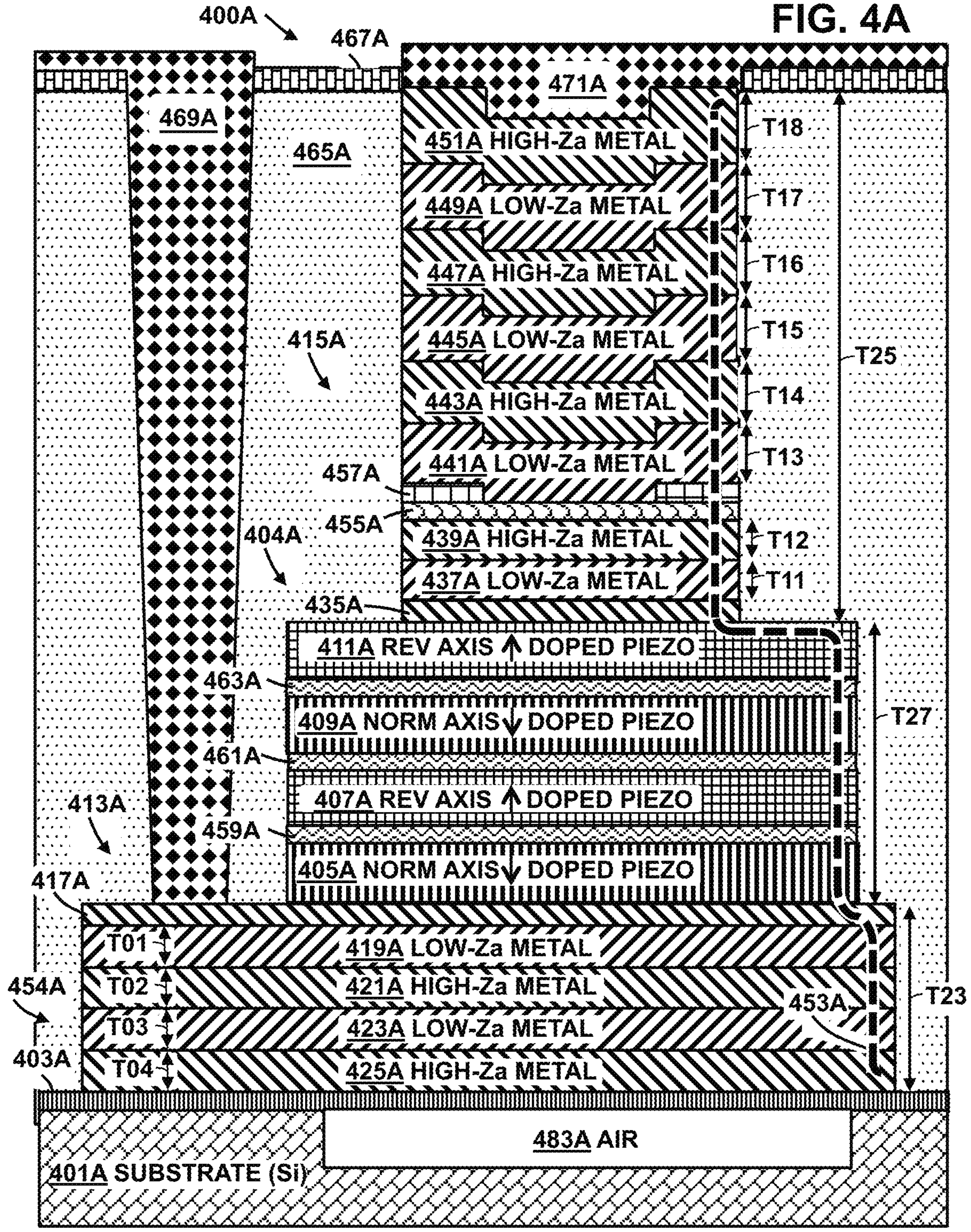
FIGS. 4A through 4G show alternative example bulk acoustic wave resonators to the example bulk acoustic wave resonator structures shown in FIG. 1A.
Figure 4B:
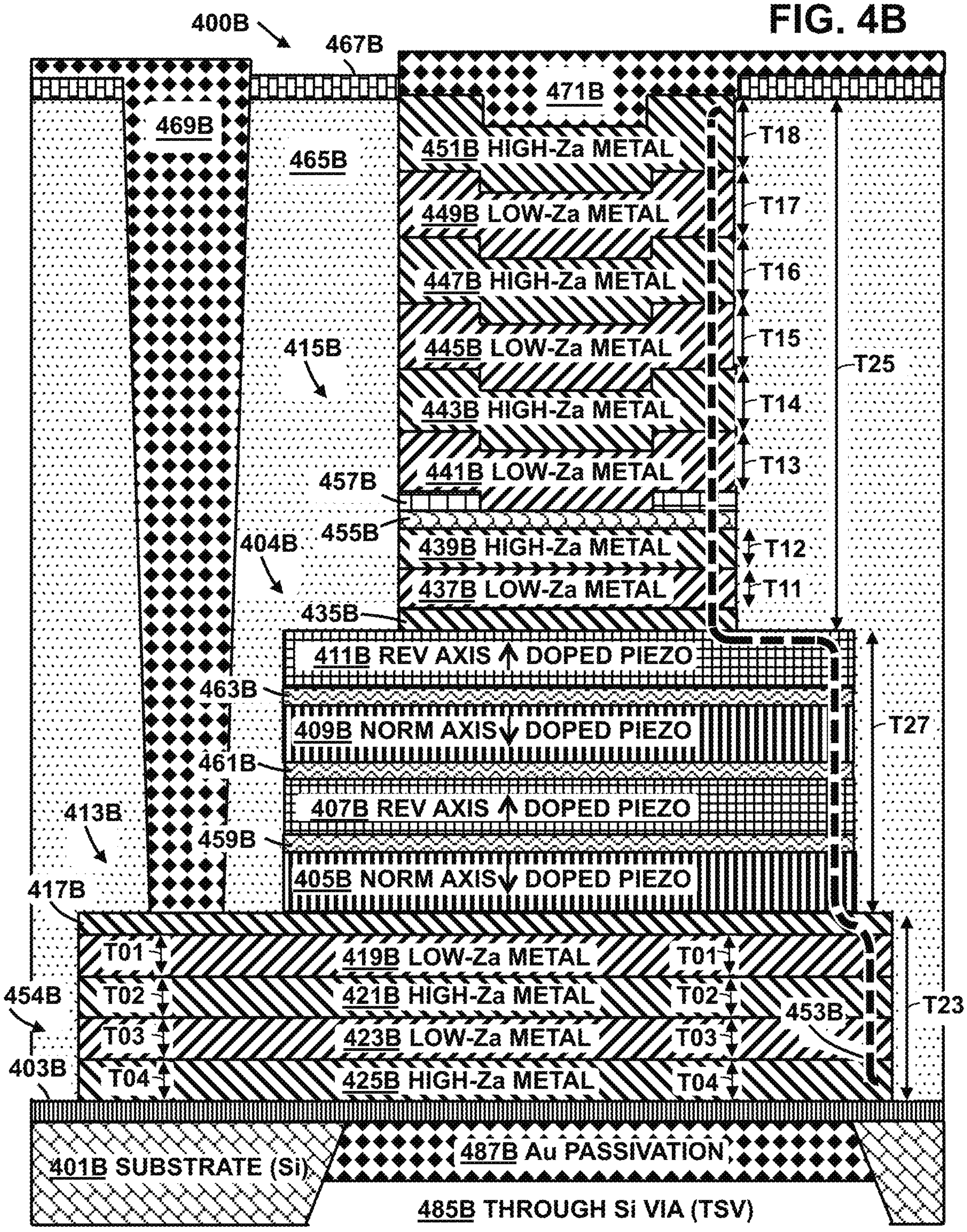
Figure 4C:
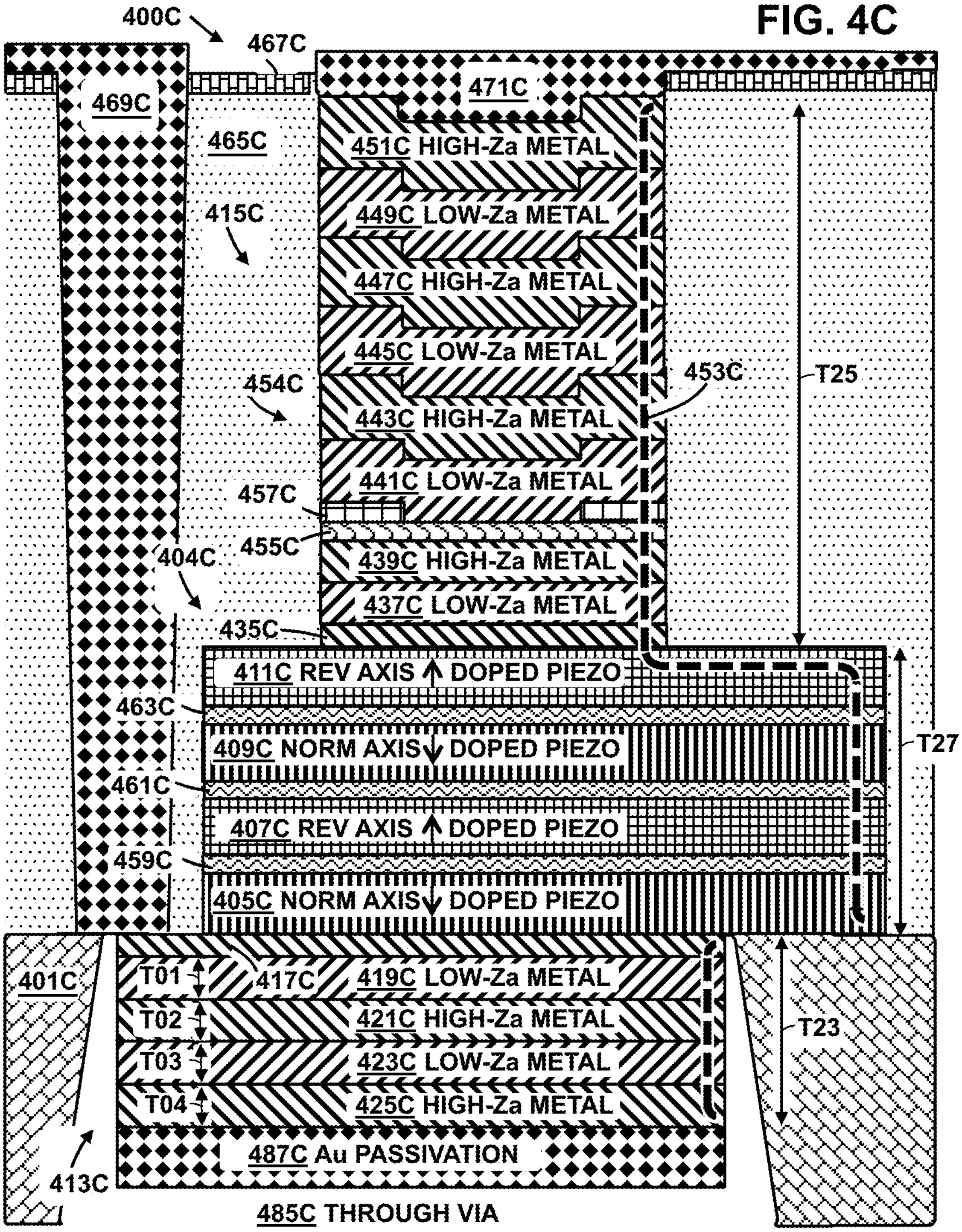
Figure 4D:
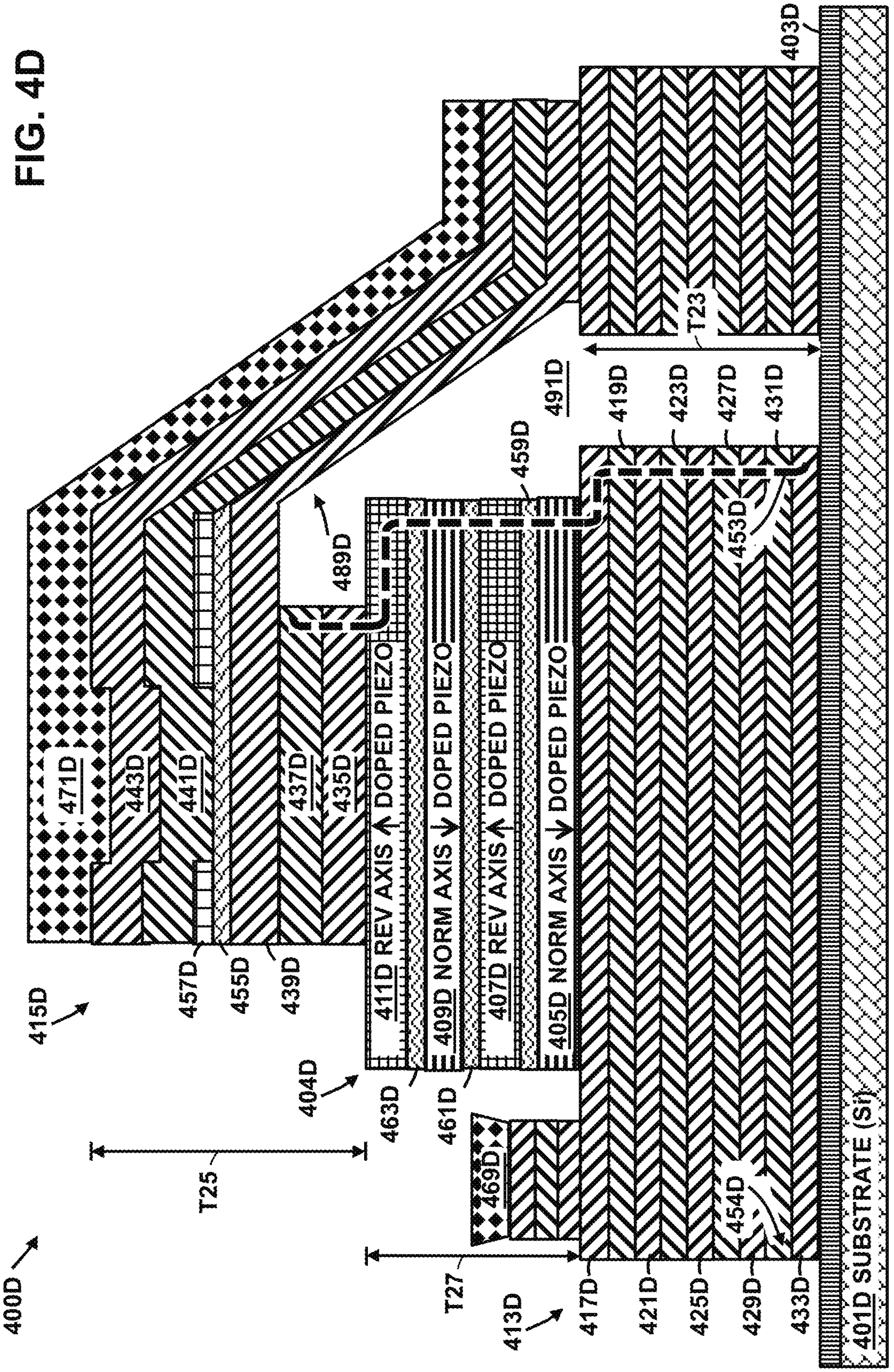
Figure 4E:
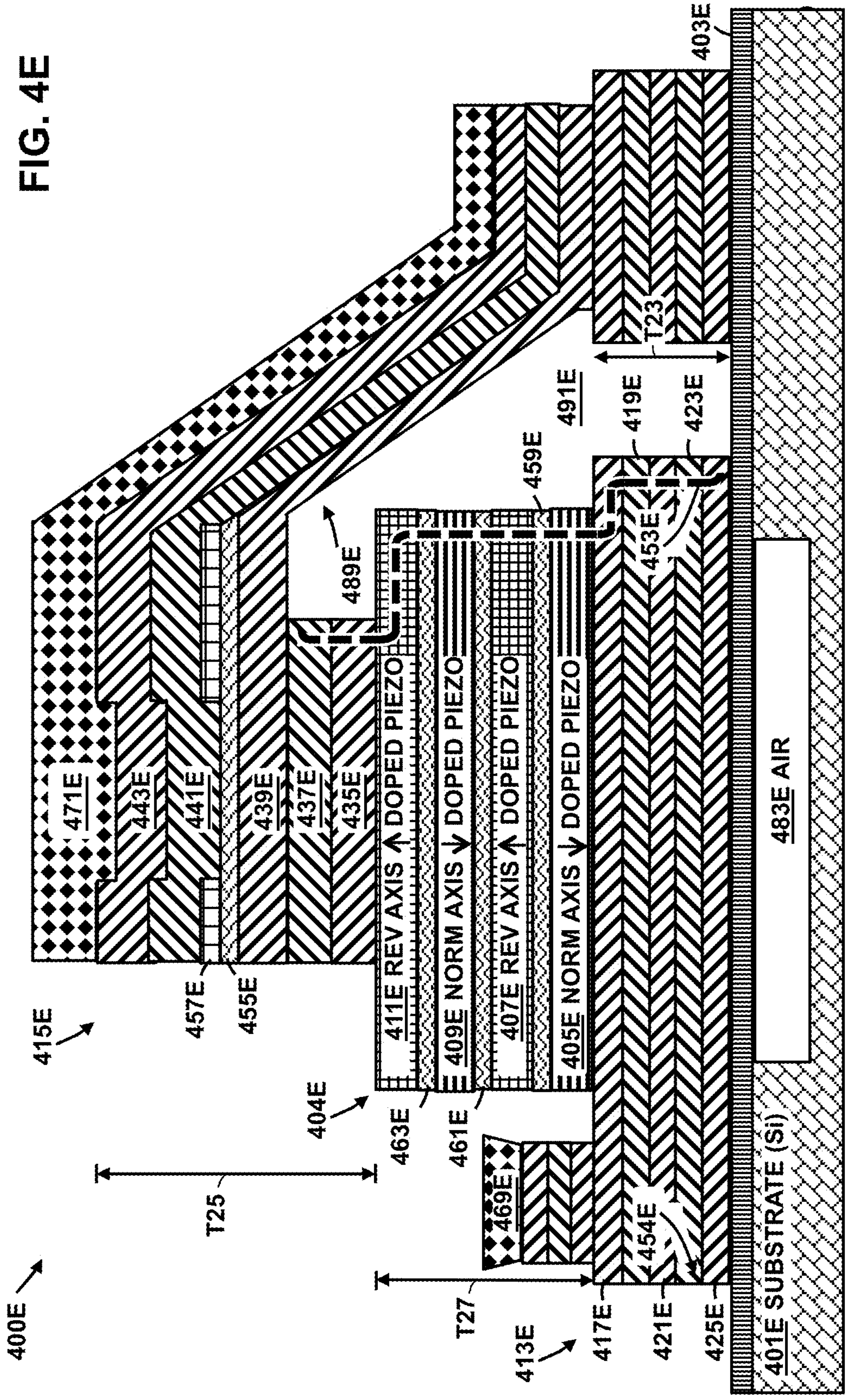
Figure 4F:
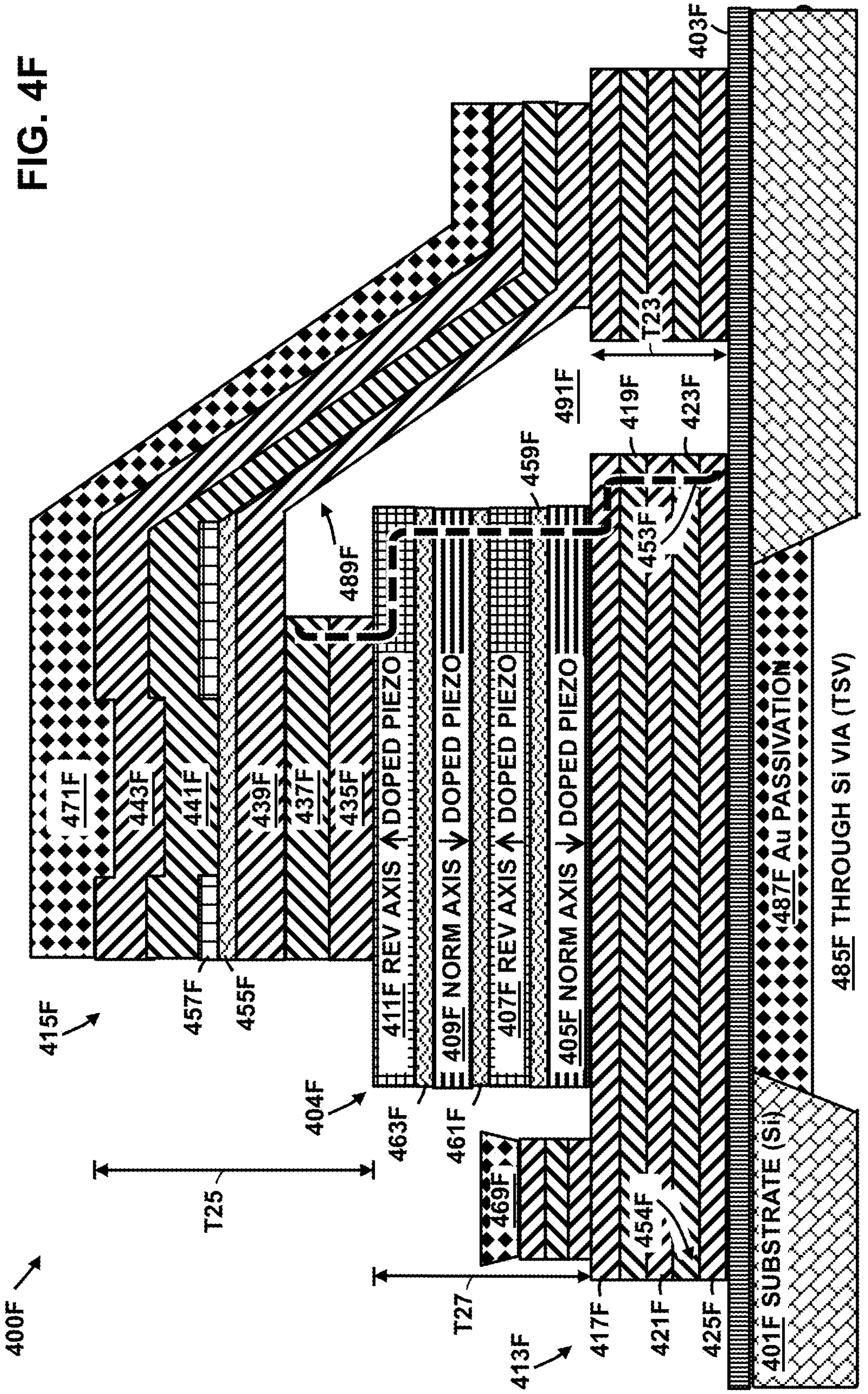
Figure 4G:
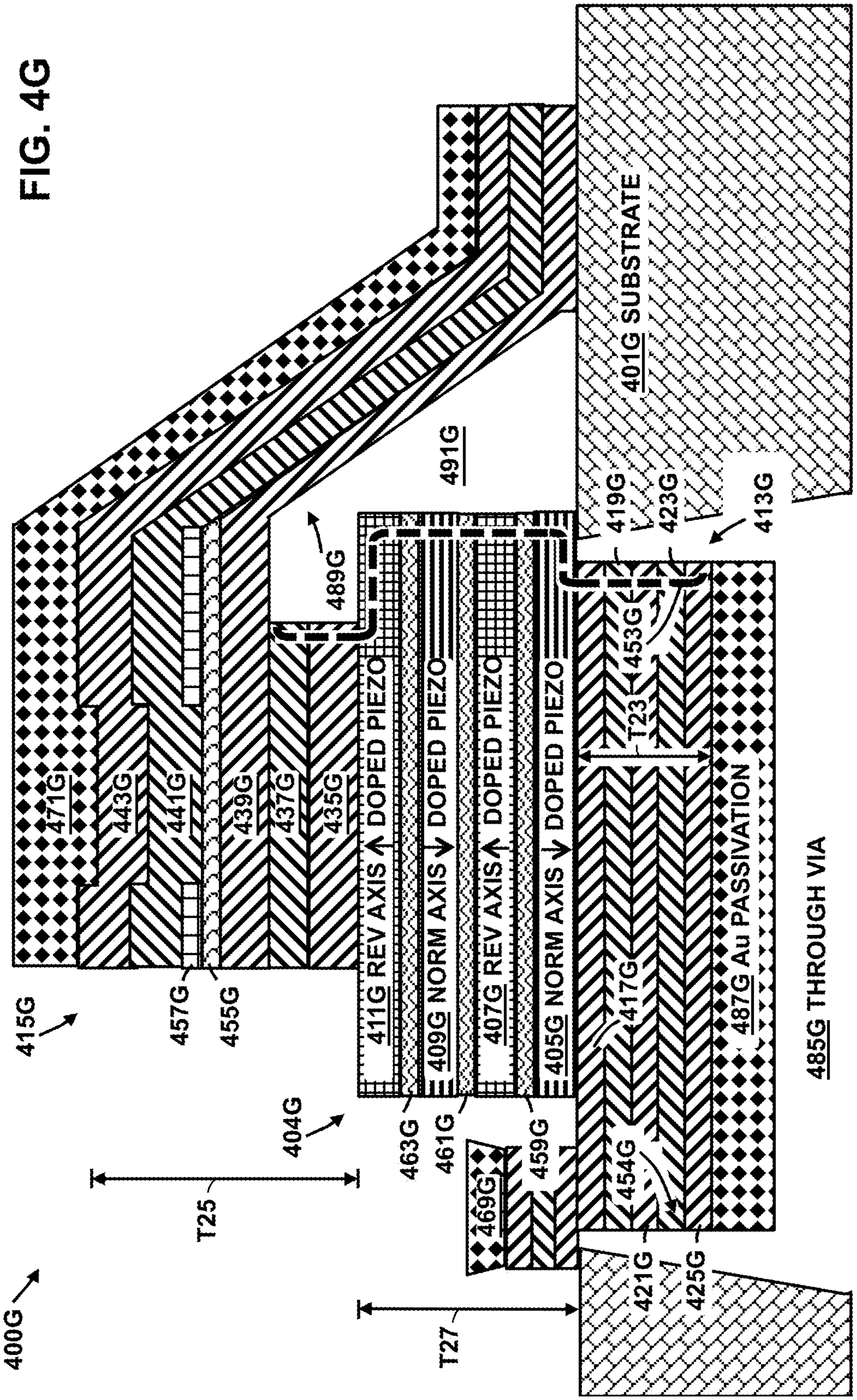

Similarly, in FIGS. 4B, 4C, 4F and 4G, a via 485B, 485C, 485F, 485G (e.g., through silicon via 485B, 485F, e.g., through silicon carbide via 485C, 485G) may, but need not, be arranged to provide acoustic isolation of the structures, e.g., bottom acoustic reflector 413B, 413C, 413F, 413G, e.g., stack 404B, 404C, 404F, 404G, of doped piezoelectric layers, e.g., resonator 400B, 400C, 400F, 400G from the substrate 401B, 401C, 401F, 401G. The via 485B, 485C, 485F, 485G (e.g., through silicon via 485B, 485F, e.g., through silicon carbide via 485C, 485G) may be formed using techniques (e.g., using photolithographic masking and etching techniques) known to those with ordinary skill in the art. For example, in FIGS. 4B and 4F, backside photolithographic masking and etching techniques may be used to form the through silicon via 485B, 485F, and an additional passivation layer 487B, 487F may be deposited, after the resonator 400B, 400F is formed. For example, in FIGS. 4C and 4G, backside photolithographic masking and etching techniques may be used to form the through silicon carbide via 485C, 485G, after the top acoustic reflector 415C, 415G and stack 404C, 404G of doped piezoelectric layers are formed. In FIGS. 4C and 4G, after the through silicon carbide via 485C, 485G, is formed, backside photolithographic masking and deposition techniques may be used to form bottom acoustic reflector 413C, 413G, and additional passivation layer 487C, 487G.

In FIGS. 4A, 4B, 4C, 4E, 4F, 4G, bottom acoustic reflector 413A, 413B, 413C, 413E, 413F, 413G, may include the acoustically reflective bottom electrode stack of the plurality of bottom metal electrode layers, in which thicknesses of the bottom metal electrode layers may be related to wavelength (e.g., acoustic wavelength) at the main resonant frequency of the example resonator 400A, 400B, 400C, 400E, 400F, 400G. As mentioned previously herein, the layer thickness of the initial bottom metal electrode layer 417A, 417B, 417C, 417E, 417F, 417G, may be about one eighth of a wavelength (e.g., one eighth acoustic wavelength) at the main resonant frequency of the example resonator 400A. Respective layer thicknesses, (e.g., T01 through T04, explicitly shown in FIGS. 4A, 4B, 4C) for members of the pairs of bottom metal electrode layers may be about one quarter of the wavelength (e.g., one quarter acoustic wavelength) at the main resonant frequency of the example resonators 400A, 400B, 400C, 400E, 400F, 400G. Relatively speaking, in various alternative designs of the example resonators 400A, 400B, 400C, 400E, 400F, 400G, for relatively lower main resonant frequencies (e.g., five Gigahertz (5 GHz)) and having corresponding relatively longer wavelengths (e.g., longer acoustic wavelengths), may have relatively thicker bottom metal electrode layers in comparison to other alternative designs of the example resonators 400A, 400B, 400C, 400E, 400F, 400G, for relatively higher main resonant frequencies (e.g., twenty-four Gigahertz (24 GHz)). There may be corresponding longer etching times to form, e.g., etch through, the relatively thicker bottom metal electrode layers in designs of the example resonator 400A, 400B, 400C, 400E, 400F, 400G, for relatively lower main resonant frequencies (e.g., five Gigahertz (5 GHz)). Accordingly, in designs of the example resonators 400A, 400B, 400C, 400E, 400F, 400G, for relatively lower main resonant frequencies (e.g., five Gigahertz (5 GHz)) having the relatively thicker bottom metal electrode layers, there may (but need not) be an advantage in etching time in having a relatively fewer number (e.g., five (5)) of bottom metal electrode layers, shown in 4A, 4B, 4C, 4E, 4F, 4G, in comparison to a relatively larger number (e.g., nine (9)) of bottom metal electrode layers, shown in FIGS. 1A and 1*n* FIG. 4D. The relatively larger number (e.g., nine (9)) of bottom metal electrode layers, shown in FIGS. 1A and 1*n* FIG. 4D may (but need not) provide for relatively greater acoustic isolation than the relatively fewer number (e.g., five (5)) of bottom metal electrode layers. However, in FIGS. 4A and 4E the cavity 483A, 483E, (e.g., air cavity 483A, 483E) may (but need not) be arranged to provide acoustic isolation enhancement relative to some designs without the cavity 483A, 483E. Similarly, in FIGS. 4B, 4C, 4F, 4G, the via 483B, 483C, 483F, 483G, (e.g., through silicon via 485B, 485F, e.g., through silicon carbide via 485C, 485G) may (but need not) be arranged to provide acoustic isolation enhancement relative to some designs without the via 483B, 483C, 483F, 483G.

In FIGS. 4A and 4E, the cavity 483A, 483E may (but need not) be arranged to compensate for relatively lesser acoustic isolation of the relatively fewer number (e.g., five (5)) of bottom metal electrode layers. In FIGS. 4A and 4E, the cavity 483A, 483E may (but need not) be arranged to provide acoustic isolation benefits, while retaining possible electrical conductivity improvements and etching time benefits of the relatively fewer number (e.g., five (5)) of bottom metal electrode layers, e.g., particularly in designs of the example resonator 400A, 400E, for relatively lower main resonant frequencies (e.g., five Gigahertz (5 GHz)). Similarly, in FIGS. 4B, 4C, 4F, 4G, the via 483B, 483C, 483F, 483G, may (but need not) be arranged to compensate for relatively lesser acoustic isolation of the relatively fewer number (e.g., five (5)) of bottom metal electrode layers. In FIGS. 4B, 4C, 4F, 4G, the via 483B, 483C, 483F, 483G, may (but need not) be arranged to provide acoustic isolation benefits, while retaining possible electrical conductivity improvement benefits and etching time benefits of the relatively fewer number (e.g., five (5)) of bottom metal electrode layers, e.g., particularly in designs of the example resonator 400B, 400C, 400F, 400G, for relatively lower main resonant frequencies (e.g., five Gigahertz (5 GHz), e.g., below six Gigahertz (6 GHz), e.g., below five Gigahertz (5 GHz)).

FIGS. 4D through 4G show alternative example bulk acoustic wave resonators 400D through 400G to the example bulk acoustic wave resonator 100A shown in FIG. 1A, in which the top acoustic reflector, 415D through 415G, may comprise a lateral connection portion, 489D through 489G, (e.g., bridge portion, 489D through 489G), of the top acoustic reflector, 415D through 415G. A gap, 491D through 491G, may be formed beneath the lateral connection portion, 489D through 489G, (e.g., bridge portion, 489D through 489G), of the top acoustic reflector 415D through 415G. The gap, 491D through 491G, may be arranged adjacent to the etched edge region, 453D through 453G, of the example resonators 400D through 400G.

For example, the gap, 491D through 491G, may be arranged adjacent to where the etched edge region, 453D through 453G, extends through (e.g., extends entirely through or extends partially through) the stack 404D through 404G, of doped piezoelectric layers, for example along the thickness dimension T27 of the stack 404D through 404G. For example, the gap, 491D through 491G, may be arranged adjacent to where the etched edge region, 453D through 453G, extends through (e.g., extends entirely through or extends partially through) the bottom doped piezoelectric layer 405D through 405G. For example, the gap, 491D through 491G, may be arranged adjacent to where the etched edge region, 453D through 453G, extends through (e.g., extends entirely through or extends partially through) the bottom doped piezoelectric layer 405D through 405G. For example, the gap, 491D through 491G, may be arranged adjacent to where the etched edge region, 453D through 453G, extends through (e.g., extends entirely through or extends partially through) the first middle doped piezoelectric layer 407D through 407G. For example, the gap, 491D through 491G, may be arranged adjacent to where the etched edge region, 453D through 453G, extends through (e.g., extends entirely through or extends partially through) the second middle doped piezoelectric layer 409D through 409G. For example, the gap, 491D through 491G, may be arranged adjacent to where the etched edge region, 453D through 453G, extends through (e.g., extends entirely through or extends partially through) the top doped piezoelectric layer 411D through 411G. For example, the gap, 491D through 491G, may be arranged adjacent to where the etched edge region, 453D through 453G, extends through (e.g., extends entirely through or extends partially through) one or more interposer layers (e.g., first interposer layer, 495D through 459G, second interposer layer, 461D through 461G, third interposer layer 411D through 411G).

For example, as shown in FIGS. 4D through 4G, the gap, 491D through 491G, may be arranged adjacent to where the etched edge region, 453D through 453G, extends through (e.g., extends partially through) the top acoustic reflector 415D through 415G, for example partially along the thickness dimension T25 of the top acoustic reflector 415D through 415G. For example, the gap, 491D through 491G, may be arranged adjacent to where the etched edge region, 453D through 453G, extends through (e.g., extends entirely through or extends partially through) the initial top electrode layer 435D through 435G. For example, the gap, 491D through 491G, may be arranged adjacent to where the etched edge region, 453D through 453G, extends through (e.g., extends entirely through or extends partially through) the first member, 437D through 437G, of the first pair of top electrode layers, 437D through 437G, 439D through 439G.

For example, as shown in FIGS. 4D through 4F, the gap, 491D through 491F, may be arranged adjacent to where the etched edge region, 453D through 453F, extends through (e.g., extends entirely through or extends partially through) the bottom acoustic reflector 413D through 413F, for example along the thickness dimension T23 of the bottom acoustic reflector 413D through 413F. For example, the gap, 491D through 491F, may be arranged adjacent to where the etched edge region, 453D through 453F, extends through (e.g., extends entirely through or extends partially through) the initial bottom electrode layer 417D through 417F. For example, the gap, 491D through 491F, may be arranged adjacent to where the etched edge region, 453D through 453F, extends through (e.g., extends entirely through or extends partially through) the first pair of bottom electrode layers, 419D through 419F, 421D through 421F. For example, the gap, 491D through 491F, may be arranged adjacent to where the etched edge region, 453D through 453F, extends through (e.g., extends entirely through or extends partially through) the second pair of bottom electrode layers, 423D through 423F, 425D through 425F. For example, as shown in FIGS. 4D through 4F, the etched edge region, 453D through 453F, may extend through (e.g., entirely through or partially through) the bottom acoustic reflector, 413D through 413F, and through (e.g., entirely through or partially through) one or more of the doped piezoelectric layers, 405D through 405F, 407D through 407F, 409D through 409F, 411D through 411F, to the lateral connection portion, 489D through 489G, (e.g., to the bridge portion, 489D through 489G), of the top acoustic reflector, 415D through 415F.

As shown in FIGS. 4D-4G, lateral connection portion, 489D through 489G, (e.g., bridge portion, 489D through 489G), of top acoustic reflector, 415D through 415G, may be a multilayer lateral connection portion, 415D through 415G, (e.g., a multilayer metal bridge portion, 415D through 415G, comprising differing metals, e.g., metals having differing acoustic impedances.) For example, lateral connection portion, 489D through 489G, (e.g., bridge portion, 489D through 489G), of top acoustic reflector, 415D through 415G, may comprise the second member, 439D through 439G, (e.g., comprising the relatively high acoustic impedance metal) of the first pair of top electrode layers, 437D through 437G, 439D through 439G. For example, lateral connection portion, 489D through 489G, (e.g., bridge portion, 489D through 489G), of top acoustic reflector, 415D through 415G, may comprise the second pair of top electrode layers, 441D through 441G, 443D through 443G.

Gap 491D-491G may be an air gap 491D-491G, or may be filled with a relatively low acoustic impedance material (e.g., BenzoCyclobutene (BCB)), which may be deposited using various techniques known to those with skill in the art. Gap 491D-491G may be formed by depositing a sacrificial material (e.g., phosphosilicate glass (PSG)) after the etched edge region, 453D through 453G, is formed. The lateral connection portion, 489D through 489G, (e.g., bridge portion, 489D through 489G), of top acoustic reflector, 415D through 415G, may then be deposited (e.g., sputtered) over the sacrificial material. The sacrificial material may then be selectively etched away beneath the lateral connection portion, 489D through 489G, (e.g., e.g., beneath the bridge portion, 489D through 489G), of top acoustic reflector, 415D through 415G, leaving gap 491D-491G beneath the lateral connection portion, 489D through 489G, (e.g., beneath the bridge portion, 489D through 489G). For example the phosphosilicate glass (PSG) sacrificial material may be selectively etched away by hydrofluoric acid beneath the lateral connection portion, 489D through 489G, (e.g., beneath the bridge portion, 489D through 489G), of top acoustic reflector, 415D through 415G, leaving gap 491D-491G beneath the lateral connection portion, 489D through 489G, (e.g., beneath the bridge portion, 489D through 489G).

Although in various example resonators, 100A, 400A, 400B, 400D, 400E, 400F, polycrystalline doped piezoelectric layers (e.g., polycrystalline doped Aluminum Nitride (AlN)) may be deposited (e.g., by sputtering), in other example resonators 400C, 400G, alternative single crystal or near single crystal doped piezoelectric layers (e.g., single/near single crystal doped Aluminum Nitride (AlN)) or epitaxial doped piezoelectric layers (e.g., epitaxial doped Aluminum Nitride (AlN)) may be deposited (e.g., by metal organic chemical vapor deposition (MOCVD)). Normal axis piezoelectric layers (e.g., normal axis doped Aluminum Nitride (AlN) piezoelectric layers) may be deposited by MOCVD using techniques known to those with skill in the art. For example. aluminum nitride can be deposited using a gas flow of trimethyl aluminum (Al(CH3)3) and ammonia (NH3) at a precursor:ammonia gas ratio of approximately 1000 or less. Doping by single or multiple elements can be accomplished by the addition of small quantities of metal-organic species. The exact quantity of the doping precursor is dependent upon the amount of dopant to be incorporated into the Aluminum Nitride film. For example, Bis(cyclopentadienyl)magnesium, (MgCp2) and tetrakis-diethylamido hafnium (TDEAHf), also known as hafnium diethylamide can be used as the organometallic doping compounds for MOCVD doping of aluminum nitride grown by MOCVD.

In other words, Bis(cyclopentadienyl)magnesium, (MgCp2) and tetrakis-diethylamido hafnium (TDEAHf), also known as hafnium diethylamide may be used as the organometallic doping compounds for MOCVD doping of aluminum nitride grown by MOCVD. For example, a layer of MOCVD Aluminum Nitride having a uniform distribution of Magnesium and Hafnium may be synthesized by using techniques described previously herein. For a uniform distribution of Magnesium and Hafnium in the Aluminum Nitride film, the MgCp2 and TDEAHf may be added to the Aluminum Nitride deposition precursors in sufficient quantity to enable the desired doping amount of Magnesium and Hafnium in the deposited Aluminum Nitride film. For example, normal axis piezoelectric layer can be synthesized by MOCVD in a deposition environment where the Nitrogen to Aluminum gas ratio is relatively low, e.g., 1000 or less. With this ratio of Nitrogen to Aluminum gases, the MgCp2 and TDEAHf are also admitted into the deposition environment. The result is an Aluminum Nitride film with a normal axis piezoelectric layer and Magnesium and Hafnium incorporated into the crystal lattice of the Aluminum Nitride.

As discussed previously herein, the interposer layers may be deposited by sputtering, but alternatively may be deposited by MOCVD. Reverse axis doped piezoelectric layers (e.g., reverse axis doped Aluminum Nitride (AlN) piezoelectric layers) may likewise be deposited via MOCVD. For the respective example resonators 400C, 400G shown in FIGS. 4C and 4G, the alternating axis doped piezoelectric stack 404C, 404G comprised of doped piezoelectric layers 405C, 407C, 409C, 411C, 405G, 407G, 409G, 411G as well as interposer layers 459C, 461C, 463C, 459G, 461G, 453G extending along stack thickness dimension T27 fabricated using MOCVD on a silicon carbide substrate 401C, 401G. For example, doped aluminum nitride of doped piezoelectric layers 405C, 407C, 409C, 411C, 405G, 407G, 409G, 411G can grow nearly epitaxially on silicon carbide (e.g., 4H SiC) by virtue of the small lattice mismatch between the polar axis Aluminum Nitride wurtzite structure and specific crystal orientations of silicon carbide. Alternative small lattice mismatch substrates may be used (e.g., sapphire, e.g., aluminum oxide). By varying the ratio of the Aluminum and Nitrogen in the deposition precursors, a doped Aluminum Nitride film may be produced with the desired polarity (e.g., normal axis, e.g., reverse axis). For example, normal axis doped Aluminum Nitride may be synthesized using MOCVD when a Nitrogen to Aluminum ratio in precursor gases approximately 1000 along with metal-organic precursors and process described previously herein. For example, reverse axis doped Aluminum Nitride may synthesized when the Nitrogen to Aluminum ratio is approximately 27000 along with metal-organic precursors and process described previously herein. For example, an oxyaluminum nitride layer, at lower temperature, may be deposited by MOCVD. This oxyaluminum nitride layer may reverse piezoelectric axis (e.g., reverse piezoelectric axis polarity) of the growing aluminum nitride under MOCVD growth conditions. Initially, this oxyaluminum nitride layer be deposited by itself under MOCVD growth conditions. Increasing the nitrogen to aluminum ratio into the several thousands (e.g., 27000) during the MOCVD synthesis may provide for the reverse axis piezoelectric layer to be synthesized. To dope the reverse axis layer, the magnesium and hafnium precursors may be admitted into the deposition chamber after the oxy-aluminum nitride layer has been deposited and during the deposition of the reverse axis aluminum nitride layer. By controlling from of dopant precursors (e.g., by controlling flow of magnesium and hafnium precursors) doping may be graded.

Varying amounts of magnesium and hafnium can be added to the aluminum nitride layer by varying the amount of the magnesium and hafnium precursor during the deposition step. For example, the initial MOCVD layer can be pure aluminum nitride at the beginning of the deposition and as deposition proceeds, the magnesium and hafnium precursors can be added in ever increasing amounts until the desired final amount of doping is achieved. In this way the amount of doping gradually increases, in the aluminum nitride layer. In addition, the doping profile through the layer thickness gradually increases from zero at the beginning of the layer deposition to the final desired doping level. Graded doping may facilitate deposition of reverse axis doped piezoelectric Aluminum Nitride.

In accordance with the foregoing, FIGS. 4C and 4G show MOCVD synthesized normal axis doped piezoelectric layer 405C, 405G, MOCVD synthesized reverse axis doped piezoelectric layer 407C, 407G, MOCVD synthesized normal axis doped piezoelectric layer 409C, 409G, and MOCVD synthesized reverse axis doped piezoelectric layer 411C, 411G. For example, normal axis doped piezoelectric layer 405C, 405G may be synthesized by MOCVD in a deposition environment where the nitrogen to aluminum gas ratio is relatively low, e.g., 1000 or less. Next an oxyaluminum nitride layer, 459 C at lower temperature, may be deposited by MOCVD that may reverse axis (e.g., reverse axis polarity) of the growing doped aluminum nitride under MOCVD growth conditions, and has also been shown to be able to be deposited by itself under MOCVD growth conditions. Increasing the nitrogen to aluminum ratio into the several thousands during the MOCVD synthesis may enable the reverse axis doped piezoelectric layer 407C, 407G to be synthesized. Interposer layer 461C, 461G may be an oxide layer such as, but not limited to, aluminum oxide or silicon dioxide. This oxide layer may be deposited in in a low temperature physical vapor deposition process such as sputtering or in a higher temperature chemical vapor deposition process. Normal axis doped piezoelectric layer 409C, 409G may be grown by MOCVD on top of interposer layer 461C, 461G using growth conditions similar to the normal axis layer 405C, 405G, as discussed previously, namely MOCVD in a deposition environment where the nitrogen to aluminum gas ratio is relatively low, e.g., 1000 or less. Next an aluminum oxynitride, interposer layer 463C, 463G may be deposited in a low temperature MOCVD process followed by a reverse axis doped piezoelectric layer 411C, 411G, synthesized in a high temperature MOCVD process and an atmosphere of nitrogen to aluminum ratio in the several thousand range. Upon conclusion of these depositions, the doped piezoelectric stack 404C, 404G shown in FIGS. 4C and 4G may be realized.

Figure 5:
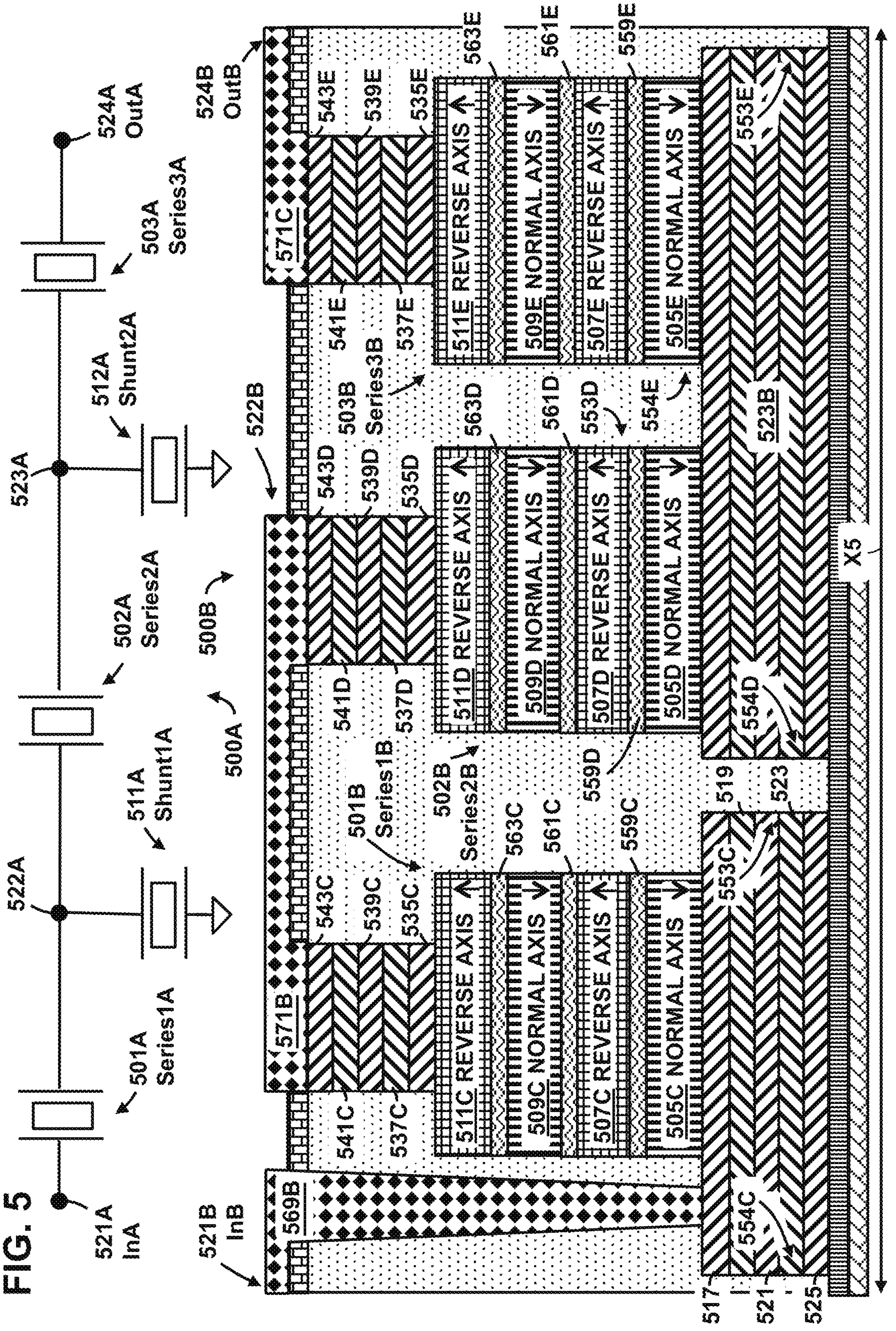
FIG. 5 shows a schematic of an example ladder filter using three series resonators of the bulk acoustic wave resonator structure of FIG. 1A, and two mass loaded shunt resonators of the bulk acoustic wave resonator structure of FIG. 1A, along with a simplified view of the three series resonators.

FIG. 5 shows a schematic of an example ladder filter 500A (e.g., SHF or EHF wave ladder filter 500A) using three series resonators of the bulk acoustic wave resonator structure of FIG. 1A (e.g., three bulk acoustic SHF or EHF wave resonators), and two mass loaded shunt resonators of the bulk acoustic wave resonator structure of FIG. 1A (e.g., two mass loaded bulk acoustic SHF or EHF wave resonators), along with a simplified view of the three series resonators. Accordingly, the example ladder filter 500A (e.g., SHF or EHF wave ladder filter 500A) is an electrical filter, comprising a plurality of bulk acoustic wave (BAW) resonators, e.g., on a substrate, in which the plurality of BAW resonators may comprise a respective first layer (e.g., bottom layer) of doped piezoelectric material having a respective piezoelectrically excitable resonance mode. The plurality of BAW resonators of the filter 500A may comprise a respective top acoustic reflector (e.g., top acoustic reflector electrode) including a respective initial top metal electrode layer and a respective first pair of top metal electrode layers electrically and acoustically coupled with the respective first layer (e.g., bottom layer) of doped piezoelectric material to excite the respective piezoelectrically excitable resonance mode at a respective resonant frequency. For example, the respective top acoustic reflector (e.g., top acoustic reflector electrode) may include the respective initial top metal electrode layer and the respective first pair of top metal electrode layers, and the foregoing may have a respective peak acoustic reflectivity in the Super High Frequency (SHF) band or the Extremely High Frequency (EHF) band that includes the respective resonant frequency of the respective BAW resonator. The plurality of BAW resonators of the filter 500A may comprise a respective bottom acoustic reflector (e.g., bottom acoustic reflector electrode) including a respective initial bottom metal electrode layer and a respective first pair of bottom metal electrode layers electrically and acoustically coupled with the respective first layer (e.g., bottom layer) of doped piezoelectric material to excite the respective piezoelectrically excitable resonance mode at the respective resonant frequency. For example, the respective bottom acoustic reflector (e.g., bottom acoustic reflector electrode) may include the respective initial bottom metal electrode layer and the respective first pair of bottom metal electrode layers, and the foregoing may have a respective peak acoustic reflectivity in the super high frequency band or the extremely high frequency band that includes the respective resonant frequency of the respective BAW resonator. The respective first layer (e.g., bottom layer) of doped piezoelectric material may be sandwiched between the respective top acoustic reflector an the respective bottom acoustic reflector. Further, the plurality of BAW resonators may comprise at least one respective additional layer of doped piezoelectric material, e.g., first middle doped piezoelectric layer. The at least one additional layer of doped piezoelectric material may have the piezoelectrically excitable main resonance mode with the respective first layer (e.g., bottom layer) of doped piezoelectric material. The respective first layer (e.g., bottom layer) of doped piezoelectric material may have a respective first piezoelectric axis orientation (e.g., normal axis orientation) and the at least one respective additional layer of doped piezoelectric material may have a respective piezoelectric axis orientation (e.g., reverse axis orientation) that opposes the first piezoelectric axis orientation of the respective first layer of doped piezoelectric material. Further discussion of features that may be included in the plurality of BAW resonators of the filter 500A is present previously herein with respect to previous discussion of FIG. 1A As shown in the schematic appearing at an upper section of FIG. 5, the example ladder filter 500A may include an input port comprising a first node 521A (InA), and may include a first series resonator 501A (Series1A) (e.g., first bulk acoustic SHF or EHF wave resonator 501A) coupled between the first node 521A (InA) associated with the input port and a second node 522A. The example ladder filter 500A may also include a second series resonator 502A (Series2A) (e.g., second bulk acoustic SHF or EHF wave resonator 502A) coupled between the second node 522A and a third node 523A. The example ladder filter 500A may also include a third series resonator 503A (Series3A) (e.g., third bulk acoustic SHF or EHF wave resonator 503A) coupled between the third node 523A and a fourth node 524A (OutA), which may be associated with an output port of the ladder filter 500A. The example ladder filter 500A may also include a first mass loaded shunt resonator 511A (Shunt1A) (e.g., first mass loaded bulk acoustic SHF or EHF wave resonator 511A) coupled between the second node 522A and ground. The example ladder filter 500A may also include a second mass loaded shunt resonator 512A (Shunt2A) (e.g., second mass loaded bulk acoustic SHF or EHF wave resonator 512A) coupled between the third node 523 and ground.

Appearing at a lower section of FIG. 5 is the simplified view of the three series resonators 501B (Series1B), 502B (Series2B), 503B (Series3B) in a serial electrically interconnected arrangement 500B, for example, corresponding to series resonators 501A, 502A, 503A, of the example ladder filter 500A. The three series resonators 501B (Series1B), 502B (Series2B), 503B (Series3B), may be constructed as shown in the arrangement 500B and electrically interconnected in a way compatible with integrated circuit fabrication of the ladder filter. Although the first mass loaded shunt resonator 511A (Shunt1A) and the second mass loaded shunt resonator 512A are not explicitly shown in the arrangement 500B appearing at a lower section of FIG. 5, it should be understood that the first mass loaded shunt resonator 511A (Shunt1A) and the second mass loaded shunt resonator 512A are constructed similarly to what is shown for the series resonators in the lower section of FIG. 5, but that the first and second mass loaded shunt resonators 511A, 512A may include mass layers, in addition to layers corresponding to those shown for the series resonators in the lower section of FIG. 5 (e.g., the first and second mass loaded shunt resonators 511A, 512A may include respective mass layers, in addition to respective top acoustic reflectors of respective top metal electrode layers, may include respective alternating axis stacks of doped piezoelectric material layers, and may include respective bottom acoustic reflectors of bottom metal electrode layers.) For example, all of the resonators of the ladder filter may be co-fabricated using integrated circuit processes (e.g., Complementary Metal Oxide Semiconductor (CMOS) compatible fabrication processes) on the same substrate (e.g., same silicon substrate). The example ladder filter 500A and serial electrically interconnected arrangement 500B of series resonators 501A, 502A, 503A, may respectively be relatively small in size, and may respectively have a lateral dimension (X5) of less than approximately one millimeter.

For example, the serial electrically interconnected arrangement 500B of three series resonators 501B (Series1B), 502B (Series2B), 503B (Series3B), may include an input port comprising a first node 521B (InB) and may include a first series resonator 501B (Series1B) (e.g., first bulk acoustic SHF or EHF wave resonator 501B) coupled between the first node 521B (InB) associated with the input port and a second node 522B. The first node 521B (InB) may include bottom electrical interconnect 569B electrically contacting a first bottom acoustic reflector of first series resonator 501B (Series1B) (e.g., first bottom acoustic reflector electrode of first series resonator 501B (Series1B)). Accordingly, in addition to including bottom electrical interconnect 569, the first node 521B (InB) may also include the first bottom acoustic reflector of first series resonator 501B (Series1B) (e.g., first bottom acoustic reflector electrode of first series resonator 501B (Series1B)). The first bottom acoustic reflector of first series resonator 501B (Series1B) (e.g., first bottom acoustic reflector electrode of first series resonator 501B (Series1B)) may include a stack of the plurality of bottom metal electrode layers 517 through 525. The serial electrically interconnected arrangement 500B of three series resonators 501B (Series1B), 502B (Series2B), 503B (Series3B), may include the second series resonator 502B (Series2B) (e.g., second bulk acoustic SHF or EHF wave resonator 502B) coupled between the second node 522B and a third node 523B. The third node 523B may include a second bottom acoustic reflector of second series resonator 502B (Series2B) (e.g., second bottom acoustic reflector electrode of second series resonator 502B (Series2B)). The second bottom acoustic reflector of second series resonator 502B (Series2B) (e.g., second bottom acoustic reflector electrode of second series resonator 502B (Series2B)) may include an additional stack of an additional plurality of bottom metal electrode layers. The serial electrically interconnected arrangement 500B of three series resonators 501B (Series1B), 502B (Series2B), 503B (Series3B), may also include the third series resonator 503B (Series3B) (e.g., third bulk acoustic SHF or EHF wave resonator 503B) coupled between the third node 523B and a fourth node 524B (OutB). The third node 523B, e.g., including the additional plurality of bottom metal electrode layers, may electrically interconnect the second series resonator 502B (Series2B) and the third series resonator 503B (Series3B). The second bottom acoustic reflector (e.g., second bottom acoustic reflector electrode) of second series resonator 502B (Series2B) of the third node 523B, e.g., including the additional plurality of bottom metal electrode layers, may be a mutual bottom acoustic reflector (e.g., mutual bottom acoustic reflector electrode), and may likewise serve as bottom acoustic reflector (e.g., mutual bottom acoustic reflector electrode) of third series resonator 503B (Series3B). The fourth node 524B (OutB) may be associated with an output port of the serial electrically interconnected arrangement 500B of three series resonators 501B (Series1B), 502B (Series2B), 503B (Series3B). The fourth node 524B (OutB) may include electrical interconnect 571C.

The stack of the plurality of bottom metal electrode layers 517 through 525 are associated with the first bottom acoustic reflector (e.g., first bottom acoustic reflector electrode) of first series resonator 501B (Series1B). The additional stack of the additional plurality of bottom metal electrode layers (e.g., of the third node 523B) may be associated with the mutual bottom acoustic reflector (e.g., mutual bottom acoustic reflector electrode) of both the second series resonant 502B (Series2B) and the third series resonator 503B (Series3B). Although stacks of respective five bottom metal electrode layers are shown in simplified view in FIG. 5, in should be understood that the stacks may include respective larger numbers of bottom metal electrode layers, e.g., respective nine top metal electrode layers. Further, the first series resonator (Series1B), and the second series resonant 502B (Series2B) and the third series resonator 503B (Series3B) may all have the same, or approximately the same, or different (e.g., achieved by means of additional mass loading layers) resonant frequency (e.g., the same, or approximately the same, or different main resonant frequency). For example, small additional massloads (e.g, a tenth of the main shunt mass-load) of series and shunt resonators may help to reduce pass-band ripples in insertion loss, as may be appreciated by one with skill in the art. The bottom metal electrode layers 517 through 525 and the additional plurality of bottom metal electrode layers (e.g., of the mutual bottom acoustic reflector, e.g., of the third node 523B) may have respective thicknesses that are related to wavelength (e.g., acoustic wavelength) for the resonant frequency (e.g., main resonant frequency) of the series resonators (e.g., first series resonator 501B (Series1B), e.g., second series resonator 502B, e.g., third series resonator (503B)). Various embodiments for series resonators (e.g., first series resonator 501B (Series1B), e.g., second series resonator 502B, e.g., third series resonator (503B)) having various relatively higher resonant frequency (e.g., higher main resonant frequency) may have relatively thinner bottom metal electrode thicknesses, e.g., scaled thinner with relatively higher resonant frequency (e.g., higher main resonant frequency). Similarly, various embodiments of the series resonators (e.g., first series resonator 501B (Series1B), e.g., second series resonator 502B, e.g., third series resonator (503B)) having various relatively lower resonant frequency (e.g., lower main resonant frequency) may have relatively thicker bottom metal electrode layer thicknesses, e.g., scaled thicker with relatively lower resonant frequency (e.g., lower main resonant frequency). The bottom metal electrode layers 517 through 525 and the additional plurality of bottom metal electrode layers (e.g., of the mutual bottom acoustic reflector, e.g., of the third node 523B) may include members of pairs of bottom metal electrodes having respective thicknesses of one quarter wavelength (e.g., one quarter acoustic wavelength) at the resonant frequency (e.g., main resonant frequency) of the series resonators (e.g., first series resonator 501B (Series1B), e.g., second series resonator 502B, e.g., third series resonator (503B)). The stack of bottom metal electrode layers 517 through 525 and the stack of additional plurality of bottom metal electrode layers (e.g., of the mutual bottom acoustic reflector, e.g., of the third node 523B) may include respective alternating stacks of different metals, e.g., different metals having different acoustic impedances (e.g., alternating relatively high acoustic impedance metals with relatively low acoustic impedance metals). The foregoing may provide acoustic impedance mismatches for facilitating acoustic reflectivity (e.g., SHF or EHF acoustic wave reflectivity) of the first bottom acoustic reflector (e.g., first bottom acoustic reflector electrode) of the first series resonator 501B (Series1B) and the mutual bottom acoustic reflector (e.g., of the third node 523B) of the second series resonator 502B (Series2B) and the third series resonator 503B (Series3B).

A first top acoustic reflector (e.g., first top acoustic reflector electrode) comprises a first stack of a first plurality of top metal electrode layers 535C through 543C of the first series resonator 501B (Series1B). A second top acoustic reflector (e.g., second top acoustic reflector electrode) comprises a second stack of a second plurality of top metal electrode layers 535D through 543D of the second series resonator 502B (Series2B). A third top acoustic reflector (e.g., third top acoustic reflector electrode) comprises a third stack of a third plurality of top metal electrode layers 535E through 543E of the third series resonator 503B (Series3B). Although stacks of respective five top metal electrode layers are shown in simplified view in FIG. 5, in should be understood that the stacks may include respective larger numbers of top metal electrode layers, e.g., respective nine bottom metal electrode layers. Further, the first plurality of top metal electrode layers 535C through 543C, the second plurality of top metal electrode layers 535D through 543D, and the third plurality of top metal electrode layers 535E through 543E may have respective thicknesses that are related to wavelength (e.g., acoustic wavelength) for the resonant frequency (e.g., main resonant frequency) of the series resonators (e.g., first series resonator 501B (Series1B), e.g., second series resonator 502B, e.g., third series resonator (503B)). Various embodiments for series resonators (e.g., first series resonator 501B (Series1B), e.g., second series resonator 502B, e.g., third series resonator (503B)) having various relatively higher resonant frequency (e.g., higher main resonant frequency) may have relatively thinner top metal electrode thicknesses, e.g., scaled thinner with relatively higher resonant frequency (e.g., higher main resonant frequency). Similarly, various embodiments of the series resonators (e.g., first series resonator 501B (Series1B), e.g., second series resonator 502B, e.g., third series resonator (503B)) having various relatively lower resonant frequency (e.g., lower main resonant frequency) may have relatively thicker top metal electrode layer thicknesses, e.g., scaled thicker with relatively lower resonant frequency (e.g., lower main resonant frequency). The first plurality of top metal electrode layers 535C through 543C, the second plurality of top metal electrode layers 535D through 543D, and the third plurality of top metal electrode layers 535E through 543E may include members of pairs of bottom metal electrodes having respective thicknesses of one quarter wavelength (e.g., one quarter acoustic wavelength) of the resonant frequency (e.g., main resonant frequency) of the series resonators (e.g., first series resonator 501B (Series1B), e.g., second series resonator 502B, e.g., third series resonator (503B)). The first stack of the first plurality of top metal electrode layers 535C through 543C, the second stack of the second plurality of top metal electrode layers 535D through 543D, and the third stack of the third plurality of top metal electrode layers 535E through 543E may include respective alternating stacks of different metals, e.g., different metals having different acoustic impedances (e.g., alternating relatively high acoustic impedance metals with relatively low acoustic impedance metals). The foregoing may provide acoustic impedance mismatches for facilitating acoustic reflectivity (e.g., SHF or EHF acoustic wave reflectivity) of the top acoustic reflectors (e.g., the first top acoustic reflector of the first series resonator 501B (Series1B), e.g., the second top acoustic reflector of the second series resonator 502B (Series2B), e.g., the third top acoustic reflector of the third series resonator 503B (Series3B)). Although not explicitly shown in the FIG. 5 simplified views of metal electrode layers of the series resonators, respective pluralities of lateral features (e.g., respective pluralities of step features) may be sandwiched between metal electrode layers (e.g., between respective pairs of top metal electrode layers, e.g., between respective first pairs of top metal electrode layers 537C, 539C, 537D, 539D, 537E, 539E, and respective second pairs of top metal electrode layers 541C, 543C, 541D, 543D, 541E, 543E. The respective pluralities of lateral features may, but need not, limit parasitic lateral acoustic modes (e.g., facilitate suppression of spurious modes) of the bulk acoustic wave resonators of FIG. 5 (e.g., of the series resonators, the mass loaded series resonators, and the mass loaded shunt resonators).

The first series resonator 501B (Series1B) may comprise a first alternating axis stack, e.g., an example first stack of four layers of alternating axis doped piezoelectric material, 505C through 511C. The second series resonator 502B (Series2B) may comprise a second alternating axis stack, e.g., an example second stack of four layers of alternating axis doped piezoelectric material, 505D through 511D. The third series resonator 503B (Series3B) may comprise a third alternating axis stack, e.g., an example third stack of four layers of alternating axis doped piezoelectric material, 505E through 511E. The first, second and third alternating axis doped piezoelectric stacks may comprise layers of doped Aluminum Nitride (AlN) having alternating C-axis wurtzite structures. For example, doped piezoelectric layers 505C, 505D, 505E, 509C, 509D, 509E have normal axis orientation. For example, doped piezoelectric layers 507C, 507D, 507E, 511C, 511D, 511E have reverse axis orientation. Members of the first stack of four layers of alternating axis doped piezoelectric material, 505C through 511C, and members of the second stack of four layers of alternating axis doped piezoelectric material, 505D through 511D, and members of the third stack of four layers of alternating axis doped piezoelectric material, 505E through 511E, may have respective thicknesses that are related to wavelength (e.g., acoustic wavelength) for the resonant frequency (e.g., main resonant frequency) of the series resonators (e.g., first series resonator 501B (Series1B), e.g., second series resonator 502B, e.g., third series resonator (503B)). Various embodiments for series resonators (e.g., first series resonator 501B (Series1B), e.g., second series resonator 502B, e.g., third series resonator (503B)) having various relatively higher resonant frequency (e.g., higher main resonant frequency) may have relatively thinner doped piezoelectric layer thicknesses, e.g., scaled thinner with relatively higher resonant frequency (e.g., higher main resonant frequency). Similarly, various embodiments of the series resonators (e.g., first series resonator 501B (Series1B), e.g., second series resonator 502B, e.g., third series resonator (503B)) having various relatively lower resonant frequency (e.g., lower main resonant frequency) may have relatively thicker doped piezoelectric layer thicknesses, e.g., scaled thicker with relatively lower resonant frequency (e.g., lower main resonant frequency). The example first stack of four layers of alternating axis doped piezoelectric material, 505C through 511C, the example second stack of four layers of alternating axis doped piezoelectric material, 505D through 511D and the example third stack of four layers of alternating axis doped piezoelectric material, 505D through 511D may include stack members of doped piezoelectric layers having respective thicknesses of approximately one half wavelength (e.g., one half acoustic wavelength) at the resonant frequency (e.g., main resonant frequency) of the series resonators (e.g., first series resonator 501B (Series1B), e.g., second series resonator 502B, e.g., third series resonator (503B)).

The example first stack of four layers of alternating axis doped piezoelectric material, 505C through 511C, may include a first three members of interposer layers 559C, 561C, 563C respectively sandwiched between the corresponding four layers of alternating axis doped piezoelectric material, 505C through 511C. The example second stack of four layers of alternating axis doped piezoelectric material, 505D through 511D, may include a second three members of interposer layers 559D, 561D, 563D respectively sandwiched between the corresponding four layers of alternating axis doped piezoelectric material, 505D through 511D. The example third stack of four layers of alternating axis doped piezoelectric material, 505E through 511E, may include a third three members of interposer layers 559E, 561E, 563E respectively sandwiched between the corresponding four layers of alternating axis doped piezoelectric material, 505E through 511E. One or more (e.g., one or a plurality of) interposer layers may be metal interposer layers. The metal interposer layers may be relatively high acoustic impedance metal interposer layers (e.g., using relatively high acoustic impedance metals such as Tungsten (W) or Molybdenum (Mo)). Such metal interposer layers may (but need not) flatten stress distribution across adjacent doped piezoelectric layers, and may (but need not) raise effective electromechanical coupling coefficient (Kt2) of adjacent doped piezoelectric layers. Alternatively or additionally, one or more (e.g., one or a plurality of) interposer layers may be dielectric interposer layers. The dielectric of the dielectric interposer layers may be a dielectric that has a positive acoustic velocity temperature coefficient, so acoustic velocity increases with increasing temperature of the dielectric. The dielectric of the dielectric interposer layers may be, for example, silicon dioxide. Dielectric interposer layers may, but need not, facilitate compensating for frequency response shifts with increasing temperature. Alternatively or additionally, one or more (e.g., one or a plurality of) interposer layers may be formed of different metal layers. For example, high acoustic impedance metal layer such as Tungsten (W), Molybdenum (Mo) may (but need not) raise effective electromechanical coupling coefficient (Kt2) while subsequently deposited metal layer with hexagonal symmetry such as Titanium (Ti) may (but need not) facilitate higher crystallographic quality of subsequently deposited doped piezoelectric layer. Alternatively or additionally, one or more (e.g., one or a plurality of) interposer layers may be formed of different dielectric layers. For example, high acoustic impedance dielectric layer such as Hafnium Dioxide (HfO2) may (but need not) raise effective electromechanical coupling coefficient (Kt2) while subsequently deposited amorphous dielectric layer such as Silicon Dioxide (SiO2) may (but need not) facilitate compensating for temperature dependent frequency shifts. Alternatively or additionally, one or more (e.g., one or a plurality of) interposer layers may comprise metal and dielectric for respective interposer layers. For example, high acoustic impedance metal layer such as Tungsten (W), Molybdenum (Mo) may (but need not) raise effective electromechanical coupling coefficient (Kt2). Subsequently deposited amorphous dielectric layer such as Silicon Dioxide (SiO2) may (but need not) facilitate compensating for temperature dependent frequency shifts. The first series resonator 501B (Series1B), the second series resonator 502B (Series2B) and the third series resonator 503B (Series3B) may have respective etched edge regions 553C, 553D, 553E, and respective laterally opposing etched edge regions 554C, 554D, 554E. Reference is made to resonator mesa structures as have already been discussed in detail previously herein. Accordingly, they are not discussed again in detail at this point. Briefly, respective first, second and third mesa structures of the respective first series resonator 501B (Series1B), the respective second series resonator 502B (Series2B) and the respective third series resonator 503B (Series3B) may extend between respective etched edge regions 553C, 553D, 553E, and respective laterally opposing etched edge regions 554C, 554D, 554E of the respective first series resonator 501B (Series1B), the respective second series resonator 502B (Series2B) and the respective third series resonator 503B (Series3B). The second bottom acoustic reflector of second series resonator 502B (Series2B) of the third node 523B, e.g., including the additional plurality of bottom metal electrode layers may be a second mesa structure. For example, this may be a mutual second mesa structure bottom acoustic reflector 523B, and may likewise serve as bottom acoustic reflector of third series resonator 503B (Series3B). Accordingly, this mutual second mesa structure bottom acoustic reflector 523B may extend between etched edge region 553E of the third series resonator 503B (Series3B) and the laterally opposing etched edge region 554D of the third series resonator 503B (Series3B).

Figure 6:
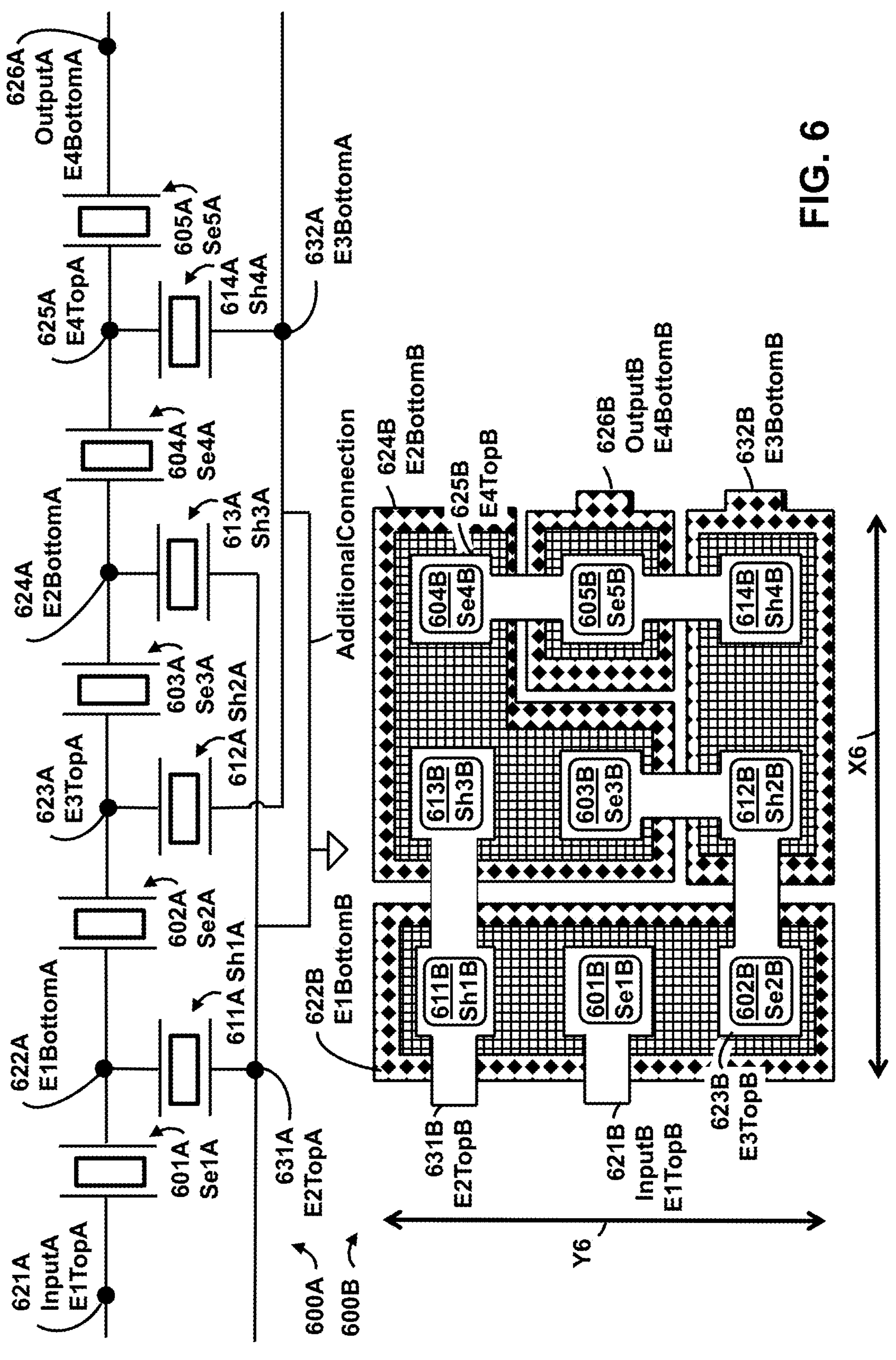
FIG. 6 shows a schematic of an example ladder filter using five series resonators of the bulk acoustic wave resonator structure of FIG. 1A, and four mass loaded shunt resonators of the bulk acoustic wave resonator structure of FIG. 1A, along with a simplified top view of the nine resonators interconnected in the example ladder filter, and lateral dimensions of the example ladder filter.

FIG. 6 shows a schematic of an example ladder filter 600A (e.g., SHF or EHF wave ladder filter 600A) using five series resonators of the bulk acoustic wave resonator structure of FIG. 1A (e.g., five bulk acoustic SHF or EHF wave resonators), and four mass loaded shunt resonators of the bulk acoustic wave resonator structure of FIG. 1A (e.g., four mass loaded bulk acoustic SHF or EHF wave resonators), along with a simplified top view of the nine resonators interconnected in the example ladder filter 600B, and lateral dimensions of the example ladder filter 600B. As shown in the schematic appearing at an upper section of FIG. 6, the example ladder filter 600A may include an input port comprising a first node 621A (InputA E1TopA), and may include a first series resonator 601A (Ser1A) (e.g., first bulk acoustic SHF or EHF wave resonator 601A) coupled between the first node 621A (InputA E1TopA) associated with the input port and a second node 622A (E1BottomA). The example ladder filter 600A may also include a second series resonator 602A (Ser2A) (e.g., second bulk acoustic SHF or EHF wave resonator 602A) coupled between the second node 622A (E1BottomA) and a third node 623A (E3TopA). The example ladder filter 600A may also include a third series resonator 603A (Ser3A) (e.g., third bulk acoustic SHF or EHF wave resonator 603A) coupled between the third node 623A (E3TopA) and a fourth node 624A (E2BottomA). The example ladder filter 600A may also include a fourth series resonator 604A (Ser4A) (e.g., fourth bulk acoustic SHF or EHF wave resonator 604A) coupled between the fourth node 624A (E2BottomA) and a fifth node 625A (E4TopA). The example ladder filter 600A may also include a fifth series resonator 605A (Ser5A) (e.g., fifth bulk acoustic SHF or EHF wave resonator 605A) coupled between the fifth node 625A (E4TopA) and a sixth node 626A (OutputA E4BottomA), which may be associated with an output port of the ladder filter 600A. The example ladder filter 600A may also include a first mass loaded shunt resonator 611A (Sh1A) (e.g., first mass loaded bulk acoustic SHF or EHF wave resonator 611A) coupled between the second node 622A (E1BottomA) and a first grounding node 631A (E2TopA). The example ladder filter 600A may also include a second mass loaded shunt resonator 612A (Sh2A) (e.g., second mass loaded bulk acoustic SHF or EHF wave resonator 612A) coupled between the third node 623A (E3TopA) and a second grounding node 632A (E3BottomA). The example ladder filter 600A may also include a third mass loaded shunt resonator 613A (Sh3A) (e.g., third mass loaded bulk acoustic SHF or EHF wave resonator 613A) coupled between the fourth node 624A (E2BottomA) and the first grounding node 631A (E2TopA). The example ladder filter 600A may also include a fourth mass loaded shunt resonator 614A (Sh4A) (e.g., fourth mass loaded bulk acoustic SHF or EHF wave resonator 614A) coupled between the fifth node 625A (E4TopA) and the second grounding node 632A (E3BottomA). The first grounding node 631A (E2TopA) and the second grounding node 632A (E3BottomA) may be interconnected to each other, and may be connected to ground, through an additional grounding connection (AdditionalConnection).

Appearing at a lower section of FIG. 6 is the simplified top view of the nine resonators interconnected in the example ladder filter 600B, and lateral dimensions of the example ladder filter 600B. The example ladder filter 600B may include an input port comprising a first node 621B (InputA E1TopB), and may include a first series resonator 601B (Ser1B) (e.g., first bulk acoustic SHF or EHF wave resonator 601B) coupled between (e.g., sandwiched between) the first node 621B (InputA E1TopB) associated with the input port and a second node 622B (E1BottomB). The example ladder filter 600B may also include a second series resonator 602B (Ser2B) (e.g., second bulk acoustic SHF or EHF wave resonator 602B) coupled between (e.g., sandwiched between) the second node 622B (E1BottomB) and a third node 623B (E3TopB). The example ladder filter 600B may also include a third series resonator 603B (Ser3B) (e.g., third bulk acoustic SHF or EHF wave resonator 603B) coupled between (e.g., sandwiched between) the third node 623B (E3TopB) and a fourth node 624B (E2BottomB). The example ladder filter 600B may also include a fourth series resonator 604B (Ser4B) (e.g., fourth bulk acoustic SHF or EHF wave resonator 604B) coupled between (e.g., sandwiched between) the fourth node 624B (E2BottomB) and a fifth node 625B (E4TopB). The example ladder filter 600B may also include a fifth series resonator 605B (Ser5B) (e.g., fifth bulk acoustic SHF or EHF wave resonator 605B) coupled between (e.g., sandwiched between) the fifth node 625B (E4TopB) and a sixth node 626B (OutputB E4BottomB), which may be associated with an output port of the ladder filter 600B. The example ladder filter 600B may also include a first mass loaded shunt resonator 611B (Sh1B) (e.g., first mass loaded bulk acoustic SHF or EHF wave resonator 611B) coupled between (e.g., sandwiched between) the second node 622B (E1BottomB) and a first grounding node 631B (E2TopB). The example ladder filter 600B may also include a second mass loaded shunt resonator 612B (Sh2B) (e.g., second mass loaded bulk acoustic SHF or EHF wave resonator 612B) coupled between (e.g., sandwiched between) the third node 623B (E3TopB) and a second grounding node 632B (E3BottomB). The example ladder filter 600B may also include a third mass loaded shunt resonator 613B (Sh3B) (e.g., third mass loaded bulk acoustic SHF or EHF wave resonator 613B) coupled between (e.g., sandwiched between) the fourth node 624B (E2BottomB) and the first grounding node 631B (E2TopB). The example ladder filter 600B may also include a fourth mass loaded shunt resonator 614B (Sh4B) (e.g., fourth mass loaded bulk acoustic SHF or EHF wave resonator 614B) coupled between (e.g., sandwiched between) the fifth node 625B (E4TopB) and the second grounding node 632B (E3BottomB). The first grounding node 631B (E2TopB) and the second grounding node 632B (E3BottomB) may be interconnected to each other, and may be connected to ground, through an additional grounding connection, not shown in the lower section of FIG. 6. The example ladder filter 600B may respectively be relatively small in size, and may respectively have lateral dimensions (X6 by Y6) of less than approximately one millimeter by one millimeter.

Figure 7:
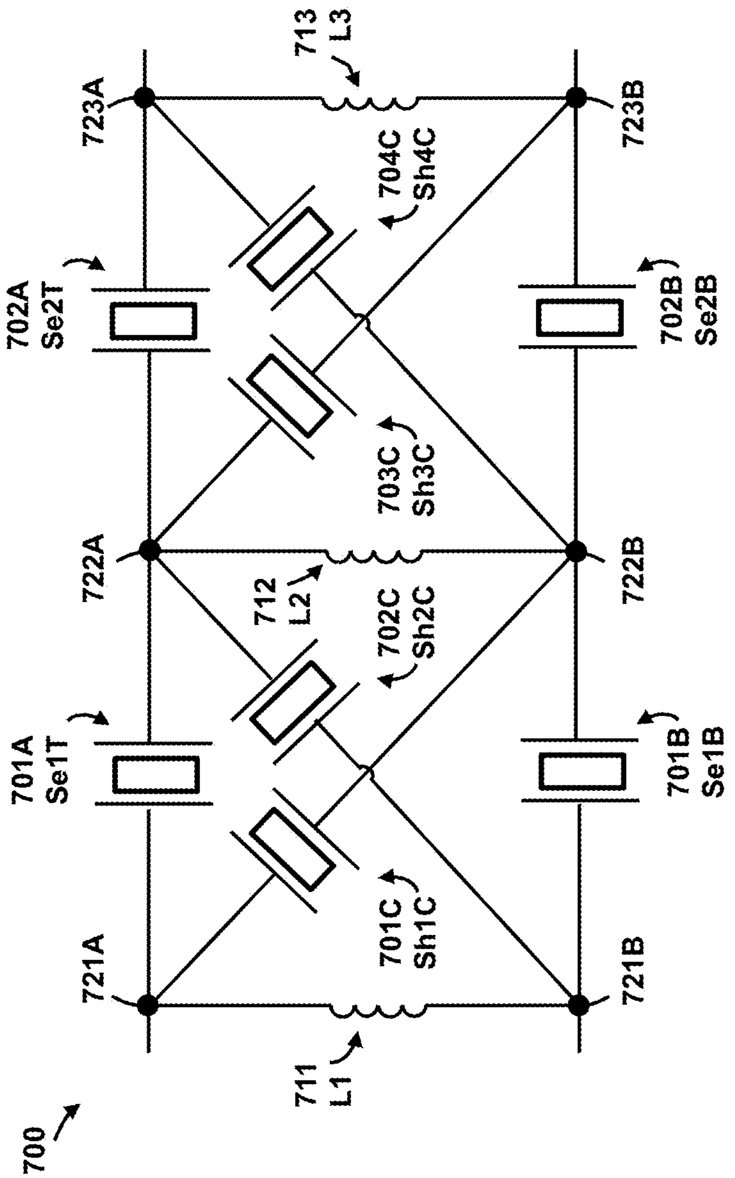
FIG. 7 shows an schematic of example inductors modifying an example lattice filter using a first pair of series resonators of the bulk acoustic wave resonator structure of FIG. 1A, a second pair of series resonators of the bulk acoustic wave resonator structure of FIG. 1A and two pairs of cross coupled mass loaded shunt resonators of the bulk acoustic wave resonator structure of FIG. 1A.

FIG. 7 shows an schematic of example inductors modifying an example lattice filter 700 using a first pair of series resonators 701A (Se1T), 702A (Se2T), (e.g., two bulk acoustic SHF or EHF wave resonators) of the bulk acoustic wave resonator structure of FIG. 1A, a second pair of series resonators 701B (Se2B), 702B (Se2B), (e.g., two additional bulk acoustic SHF or EHF wave resonators) of the bulk acoustic wave resonator structure of FIG. 1A and two pairs of cross coupled mass loaded shunt resonators 701C (Sh1C), 702D (Sh2C), 703C (Sh3C), 704C (Sh4C), (e.g., four mass loaded bulk acoustic SHF or EHF wave resonators) of the bulk acoustic wave resonator structure of FIG. 1A. As shown in the schematic of FIG. 7, the example inductor modified lattice filter 700 may include a first top series resonator 701A (Se1T) (e.g., first top bulk acoustic SHF or EHF wave resonator 701A) coupled between a first top node 721A and a second top node 722A. The example inductor modified lattice filter 700 may also include a second top series resonator 702A (Se2T) (e.g., second top bulk acoustic SHF or EHF wave resonator 702A) coupled between the second top node 722A and a third top node 723A.

The example inductor modified lattice filter 700 may include a first bottom series resonator 701B (Se1B) (e.g., first bottom bulk acoustic SHF or EHF wave resonator 701B) coupled between a first bottom node 721B and a second bottom node 722B. The example inductor modified lattice filter 700 may also include a second bottom series resonator 702B (Se2B) (e.g., second bottom bulk acoustic SHF or EHF wave resonator 702B) coupled between the second bottom node 722B and a third bottom node 723B. The example inductor modified lattice filter 700 may include a first cross-coupled mass loaded shunt resonator 701C (Sh1C) (e.g., first mass loaded bulk acoustic SHF or EHF wave resonator 701C) coupled between the first top node 721A and the second bottom node 722B. The example inductor modified lattice filter 700 may also include a second cross-coupled mass loaded shunt resonator 702C (Sh2C) (e.g., second mass loaded bulk acoustic SHF or EHF wave resonator 702C) coupled between the second top node 722A and the first bottom node 721B. The example inductor modified lattice filter 700 may include a third cross-coupled mass loaded shunt resonator 703C (Sh3C) (e.g., third mass loaded bulk acoustic SHF or EHF wave resonator 703C) coupled between the second top node 722A and the third bottom node 723B. The example inductor modified lattice filter 700 may also include a fourth cross-coupled mass loaded shunt resonator 704C (Sh4C) (e.g., fourth mass loaded bulk acoustic SHF or EHF wave resonator 704C) coupled between the third top node 723A and the second bottom node 722B. The example inductor modified lattice filter 700 may include a first inductor 711 (L1) coupled between the first top node 721A and the first bottom node 721B. The example inductor modified lattice filter 700 may include a second inductor 712 (L2) coupled between the second top node 722A and the second bottom node 722B. The example inductor modified lattice filter 700 may include a third inductor 713 (L3) coupled between the third top node 723A and the third bottom node 723B.

Figure 8A:
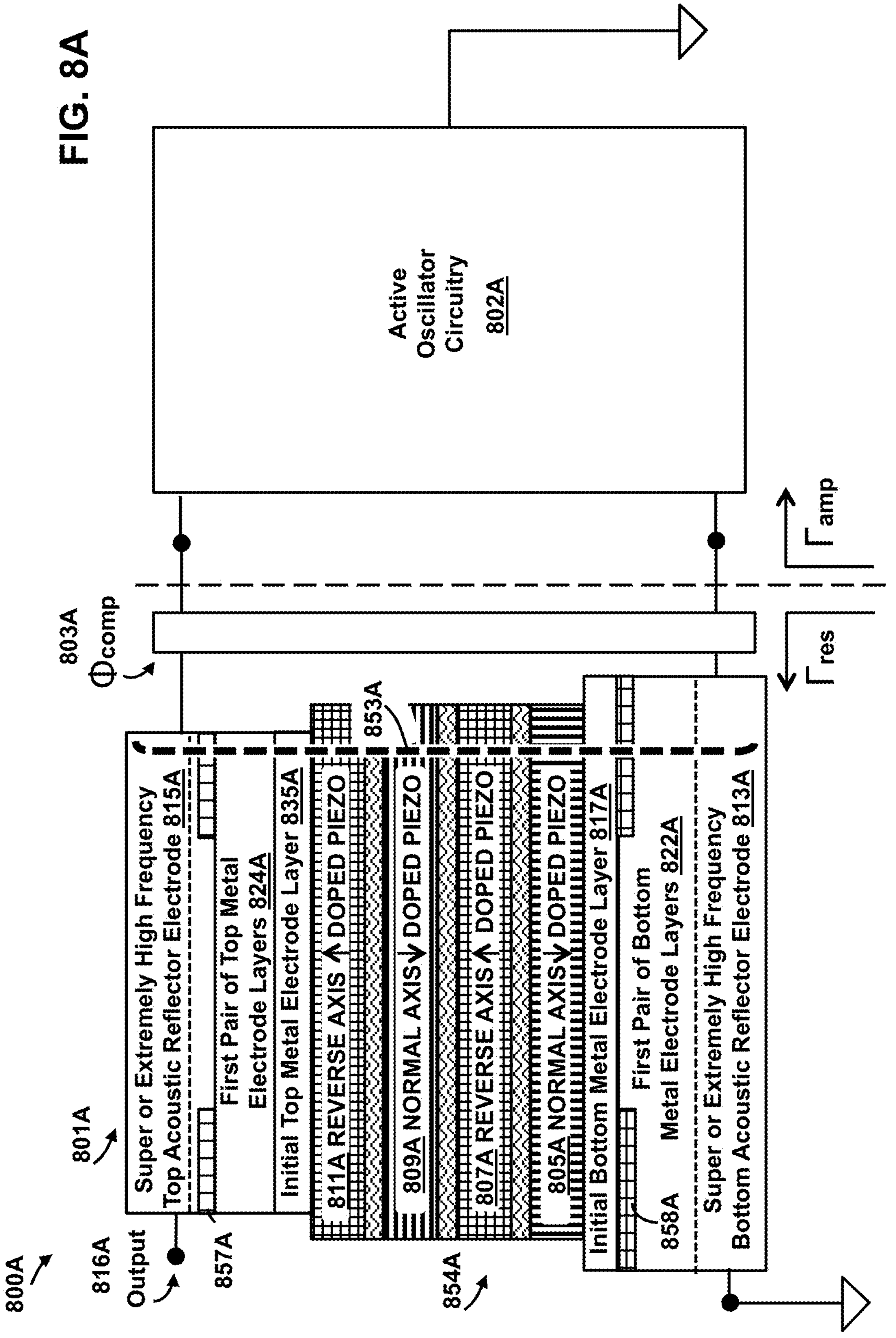
FIG. 8A shows an example oscillator using the bulk acoustic wave resonator structure of FIG. 1A.
Figure 8B:
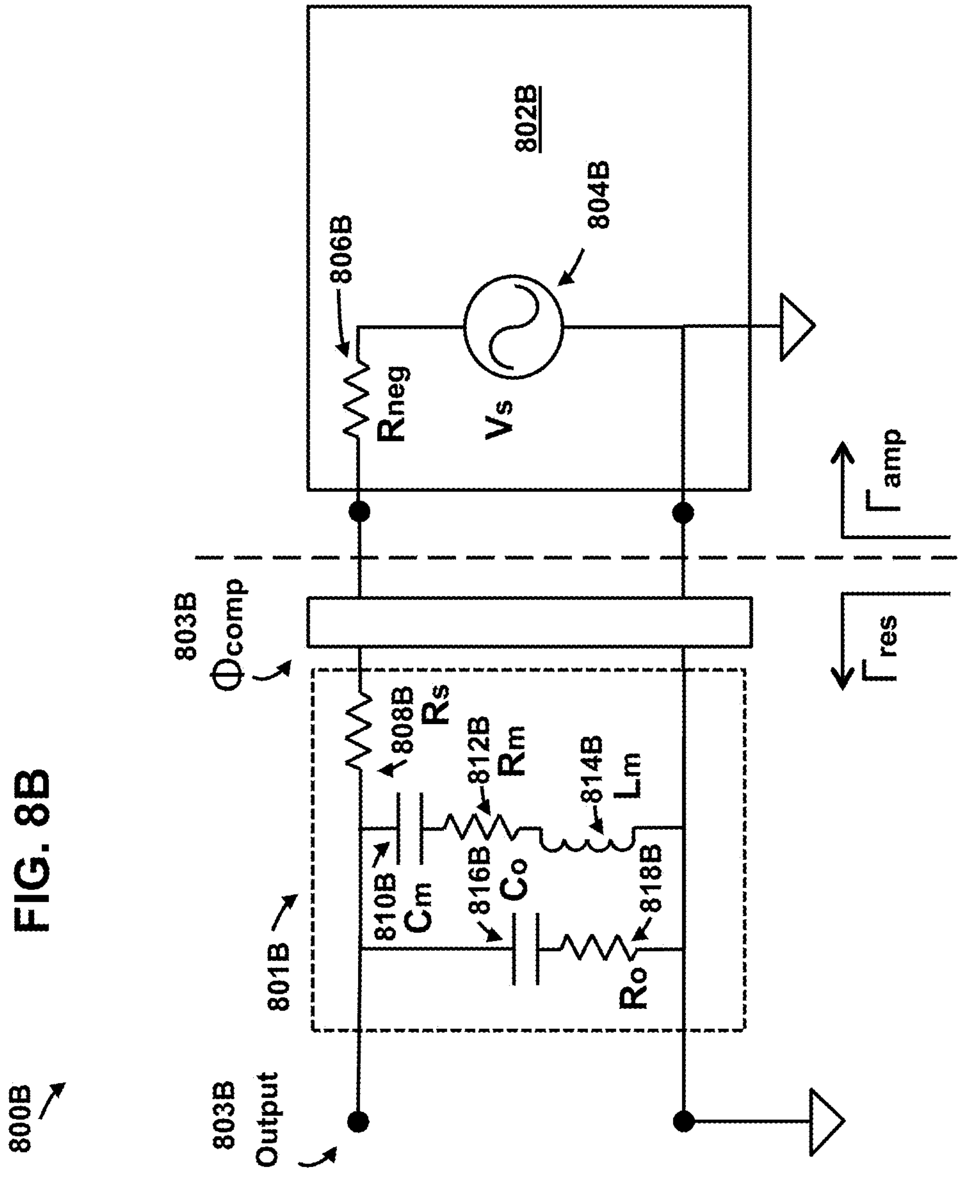
FIG. 8B shows a schematic of and example circuit implementation of the oscillator shown in FIG. 8A.

FIGS. 8A and 8B show an example oscillator 800A, 800B (e.g., millimeter wave oscillator 800A, 800B, e.g., Super High Frequency (SHF) wave oscillator 800A, 800B, e.g., Extremely High Frequency (EHF) wave oscillator 800A, 800B) using the bulk acoustic wave resonator structure of FIG. 1A. For example, FIGS. 8A and 8B shows simplified views of bulk acoustic wave resonator 801A, 801B electrically coupled with electrical oscillator circuitry (e.g., active oscillator circuitry 802A, 802B) through phase compensation circuitry 803A, 803B (Φcomp). The example oscillator 800A, 800B may be a negative resistance oscillator, e.g., in accordance with a one-port model as shown in FIGS. 8A and 8B. The electrical oscillator circuitry, e.g., active oscillator circuitry, may include one or more suitable active devices (e.g., one or more suitably configured amplifying transistors) to generate a negative resistance commensurate with resistance of the bulk acoustic wave resonator 801A, 801B. In other words, energy lost in bulk acoustic wave resonator 801A, 801B may be replenished by the active oscillator circuitry, thus allowing steady oscillation, e.g., steady SHF or EHF wave oscillation. To ensure oscillation start-up, active gain (e.g., negative resistance) of active oscillator circuitry 802A, 802B may be greater than one. As illustrated on opposing sides of a notional dashed line in FIGS. 8A and 8B, the active oscillator circuitry 802A, 802B may have a complex reflection coefficient of the active oscillator circuitry (Γamp), and the bulk acoustic wave resonator 801A, 801B together with the phase compensation circuitry 803A, 803B (Φcomp) may have a complex reflection coefficient (Γres). To provide for the steady oscillation, e.g., steady SHF or EHF wave oscillation, a magnitude may be greater than one for |Γamp Γres|, e.g., magnitude of a product of the complex reflection coefficient of the active oscillator circuitry (Γamp) and the complex reflection coefficient (Γres) of the resonator to bulk acoustic wave resonator 801A, 801B together with the phase compensation circuitry 803A, 803B (Φcomp) may be greater than one. Further, to provide for the steady oscillation, e.g., steady SHF or EHF wave oscillation, phase angle may be an integer multiple of three-hundred-sixty degrees for ∠Γamp Γres, e.g., a phase angle of the product of the complex reflection coefficient of the active oscillator circuitry (Γamp) and the complex reflection coefficient (Γres) of the resonator to bulk acoustic wave resonator 801A, 801B together with the phase compensation circuitry 803A, 803B (Φcomp) may be an integer multiple of three-hundred-sixty degrees. The foregoing may be facilitated by phase selection, e.g., electrical length selection, of the phase compensation circuitry 803A, 803B (Φcomp).

In the simplified view of FIG. 8A, the bulk acoustic wave resonator 801A (e.g., bulk acoustic SHF or EHF wave resonator) includes first normal axis doped piezoelectric layer 805A, first reverse axis doped piezoelectric layer 807A, and another normal axis doped piezoelectric layer 809A, and another reverse axis doped piezoelectric layer 811A arranged in a four doped piezoelectric layer alternating axis stack arrangement sandwiched between multilayer metal acoustic SHF or EHF wave reflector top electrode 815A and multilayer metal acoustic SHF or EHF wave reflector bottom electrode 813A. An output 816A of the oscillator 800A may be coupled to the bulk acoustic wave resonator 801A (e.g., coupled to multilayer metal acoustic SHF or EHF wave reflector top electrode 815A) It should be understood that interposer layers as discussed previously herein with respect to FIG. 1A are explicitly shown in the simplified view the example resonator 801A shown in FIG. 8A. Such interposer layers may be included and interposed between adjacent doped piezoelectric layers. For example, a first interposer layer is arranged between first normal axis doped piezoelectric layer 805A and first reverse axis doped piezoelectric layer 807A. For example, a second interposer layer is arranged between first reverse axis doped piezoelectric layer 807A and another normal axis doped piezoelectric layer 809A. For example, a third interposer is arranged between the another normal axis doped piezoelectric layer 809A and another reverse axis doped piezoelectric layer 807A. As discussed previously herein, such interposer may be metal or dielectric, or metal and dielectric and may, but need not provide various benefits, as discussed previously herein.

General structures and applicable teaching of this disclosure for the multilayer metal acoustic SHF or EHF reflector top electrode 815A and the multilayer metal acoustic SHF or EHF reflector bottom electrode have already been discussed in detail previously herein with respect of FIGS. 1A and 4A through 4G, which for brevity are incorporated by reference rather than repeated fully here. As already discussed, these structures are directed to respective pairs of metal electrode layers, in which a first member of the pair has a relatively low acoustic impedance (relative to acoustic impedance of an other member of the pair), in which the other member of the pair has a relatively high acoustic impedance (relative to acoustic impedance of the first member of the pair), and in which the respective pairs of metal electrode layers have layer thicknesses corresponding to approximately one quarter wavelength (e.g., approximately one quarter acoustic wavelength) at a main resonant frequency of the resonator. Accordingly, it should be understood that the bulk acoustic SHF or EHF wave resonator 801A shown in FIG. 8A may include multilayer metal acoustic SHF or EHF wave reflector top electrode 815A and multilayer metal acoustic SHF or EHF wave reflector bottom electrode 815B in which the respective pairs of metal electrode layers may include layer thicknesses corresponding to approximately a quarter wavelength (e.g., approximately one quarter of an acoustic wavelength) at a SHF or EHF wave main resonant frequency of the bulk acoustic SHF or EHF wave resonator 801A. Initial top metal electrode layer 835A and initial bottom metal electrode layer 817A may have respective layer thickness of about one eighth of a wavelength (e.g., one eighth of an acoustic wavelength) at the main resonant frequency of the bulk acoustic SHF or EHF wave resonator 801A. The multilayer metal acoustic SHF or EHF wave reflector top electrode 815A may include the initial top metal electrode layer 835A and the first pair of top metal electrode layers 824A electrically and acoustically coupled with the four doped piezoelectric layer alternating axis stack arrangement (e.g., with the first normal axis doped piezoelectric layer 805A, e.g., with first reverse axis doped piezoelectric layer 807A, e.g., with another normal axis doped piezoelectric layer 809A, e.g., with another reverse axis doped piezoelectric layer 811A) to excite the piezoelectrically excitable resonance mode at the resonant frequency. For example, the multilayer metal acoustic SHF or EHF wave reflector top electrode 815A may include the initial top metal electrode layer 835A and the first pair of top metal electrode layers 824A, and the foregoing may have a respective peak acoustic reflectivity in the Super High Frequency (SHF) band or the Extremely High Frequency (EHF) band that includes the respective resonant frequency of the respective BAW resonator. The multilayer metal acoustic SHF or EHF wave reflector top electrode 815A may include a first mass patterned layer 857A. The first pair of top metal electrodes 824A may be interposed between the first patterned layer 857A and a stack of layers of doped piezoelectric material including the first layer of doped piezoelectric material 805A (e.g., normal axis layer of doped piezoelectric material 805A) and the second layer of doped piezoelectric material 807A (e.g., reverse axis layer of doped piezoelectric material 807A). First and second patterned layers 857A, 858A (e.g., top patterned layer 857A and bottom patterned layer 858A) may contribute substantially differently to facilitating spurious mode suppression in the bulk acoustic wave resonator 801A for oscillator 800A. In accordance with the teachings of this disclosure, one of the patterned layers (e.g., second patterned layer 858A, e.g., bottom patterned layer 858A) may be arranged substantially nearer to a doped piezoelectric layer stack including the first and second layers of doped piezoelectric material than another one of the mass load layers (e.g., first patterned layer 857A, e.g., top patterned layer 857A), to contribute more to facilitating spurious mode suppression for bulk acoustic wave resonator 801A for oscillator 800A than what the another one of the patterned layers contributes.

Similarly, the multilayer metal acoustic SHF or EHF wave reflector bottom electrode 813A may include the initial bottom metal electrode layer 817A and the first pair of bottom metal electrode layers 822A electrically and acoustically coupled with the four doped piezoelectric layers alternating axis stack arrangement (e.g., with the first normal axis doped piezoelectric layer 805A, e.g, with first reverse axis doped piezoelectric layer 807A, e.g., with another normal axis doped piezoelectric layer 809A, e.g., with another reverse axis doped piezoelectric layer 811A) to excite the piezoelectrically excitable resonance mode at the resonant frequency. For example, the multilayer metal acoustic SHF or EHF wave reflector bottom electrode 817A may include the initial bottom metal electrode layer 817A and the first pair of bottom metal electrode layers 822A, and the foregoing may have a respective peak acoustic reflectivity in the Super High Frequency (SHF) band or the Extremely High Frequency (EHF) band that includes the resonant frequency of the BAW resonator 801A. The second patterned layer 858A may be interposed between the first pair of bottom metal electrodes 822A and the initial bottom metal electrode layer 817A.

An output 816A of the oscillator 800A may be coupled to the bulk acoustic wave resonator 801A (e.g., coupled to multilayer metal acoustic SHF or EHF wave reflector top electrode 815A). Interposer layers as discussed previously herein with respect to FIG. 1A are explicitly shown in the simplified view the example resonator 801A shown in FIG. 8A. Such interposer layers may be included and interposed between adjacent piezoelectric layers. For example, a first interposer layer may be arranged between first normal axis piezoelectric layer 805A and first reverse axis piezoelectric layer 807A. For example, a second interposer layer may be arranged between first reverse axis piezoelectric layer 807A and another normal axis piezoelectric layer 809A. For example, a third interposer may be arranged between the another normal axis piezoelectric layer 809A and another reverse axis piezoelectric layer 807A. As discussed previously herein, such interposer may be metal and/or dielectric, and may, but need not provide various benefits, as discussed previously herein. Alternatively or additionally, one or more (e.g., one or a plurality of) interposer layers may be formed of different metal layers. For example, high acoustic impedance metal layer such as Tungsten (W) or Molybdenum (Mo) may (but need not) raise effective electromechanical coupling coefficient (Kt2) while subsequently deposited metal layer with hexagonal symmetry such as Titanium (Ti) may (but need not) facilitate higher crystallographic quality of subsequently deposited doped piezoelectric layer. Alternatively or additionally, one or more (e.g., one or a plurality of) interposer layers may be formed of different dielectric layers. For example, high acoustic impedance dielectric layer such as Hafnium Dioxide (HfO2) may (but need not) raise effective electromechanical coupling coefficient (Kt2). Subsequently deposited amorphous dielectric layer such as Silicon Dioxide (SiO2) may (but need not) facilitate compensating for temperature dependent frequency shifts. Alternatively or additionally, one or more (e.g., one or a plurality of) interposer layers may comprise metal and dielectric for respective interposer layers. For example, high acoustic impedance metal layer such as Tungsten (W) or Molybdenum (Mo) may (but need not) raise effective electromechanical coupling coefficient (Kt2). Subsequently deposited amorphous dielectric layer such as Silicon Dioxide (SiO2) may (but need not) facilitate compensating for temperature dependent frequency shifts.

A notional heavy dashed line is used in depicting an etched edge region 853A associated with example resonator 801A. The example resonator 801A may also include a laterally opposing etched edge region 854A arranged opposite from the etched edge region 853A. The etched edge region 853A (and the laterally opposing etch edge region 854A) may similarly extend through various members of the example resonator 801A of FIG. 8A, in a similar fashion as discussed previously herein with respect to the etched edge region 253D (and the laterally opposing etch edge region 254D) of example resonator 2001D shown in FIG. 2B. As shown in FIG. 8A, a first mesa structure corresponding to the stack of four doped piezoelectric material layers 805A, 807A, 809A, 811A may extend laterally between (e.g., may be formed between) etched edge region 853A and laterally opposing etched edge region 854A. A second mesa structure corresponding to multilayer metal acoustic SHF or EHF wave reflector bottom electrode 813A may extend laterally between (e.g., may be formed between) etched edge region 853A and laterally opposing etched edge region 854A. Third mesa structure corresponding to multilayer metal acoustic SHF or EHF wave reflector top electrode 815A may extend laterally between (e.g., may be formed between) etched edge region 853A and laterally opposing etched edge region 854A. Although not explicitly shown in the FIG. 8A simplified view of metal electrode layers, e.g., multilayer metal acoustic SHF or EHF wave reflector top electrode 815A, a plurality of lateral features (e.g., plurality of step features) may be sandwiched between metal electrode layers (e.g., between pairs of top metal electrode layers. The plurality of lateral features may, but need not, limit parasitic lateral acoustic modes of the example bulk acoustic wave resonator of FIG. 8A.

FIG. 8B shows a schematic of and example circuit implementation of the oscillator shown in FIG. 8A. Active oscillator circuitry 802B may include active elements, symbolically illustrated in FIG. 8B by alternating voltage source 804B (Vs) coupled through negative resistance 806B (Rneg), e.g., active gain element 806B, to example bulk acoustic wave resonator 801B (e.g., bulk acoustic SHF or EHF wave resonator) via phase compensation circuitry 803B (Φcomp). The representation of example bulk acoustic wave resonator 801B (e.g., bulk acoustic SHF or EHF wave resonator) may include passive elements, symbolically illustrated in FIG. 8B by electrode ohmic loss parasitic series resistance 808B (Rs), motional capacitance 810B (Cm), acoustic loss motional resistance 812B (Rm), motional inductance 814B (Lm), static or plate capacitance 816B (Co), and acoustic loss parasitic 818B (Ro). An output 816B of the oscillator 800B may be coupled to the bulk acoustic wave resonator 801B (e.g., coupled to a multilayer metal acoustic SHF or EHF wave reflector top electrode of bulk acoustic wave resonator 801B).

Figure 9A:
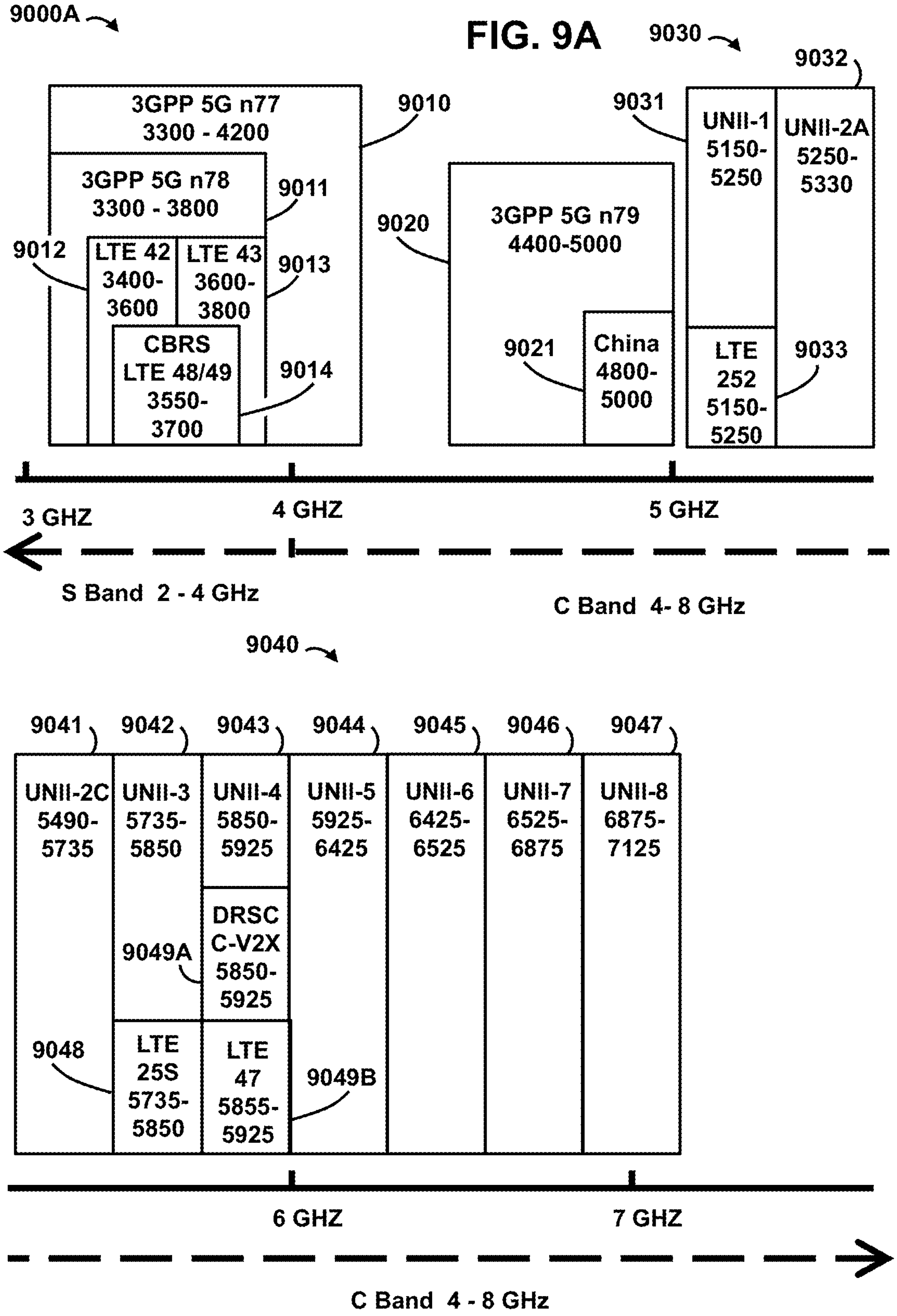
FIGS. 9A and 9B are simplified diagrams of a frequency spectrum illustrating application frequencies and application frequency bands of the example bulk acoustic wave resonators shown in FIG. 1A and FIGS. 4A through 4G, and the example filters shown in FIGS. 5 through 7, and the example oscillators shown in FIGS. 8A and 8B.
Figure 9B:
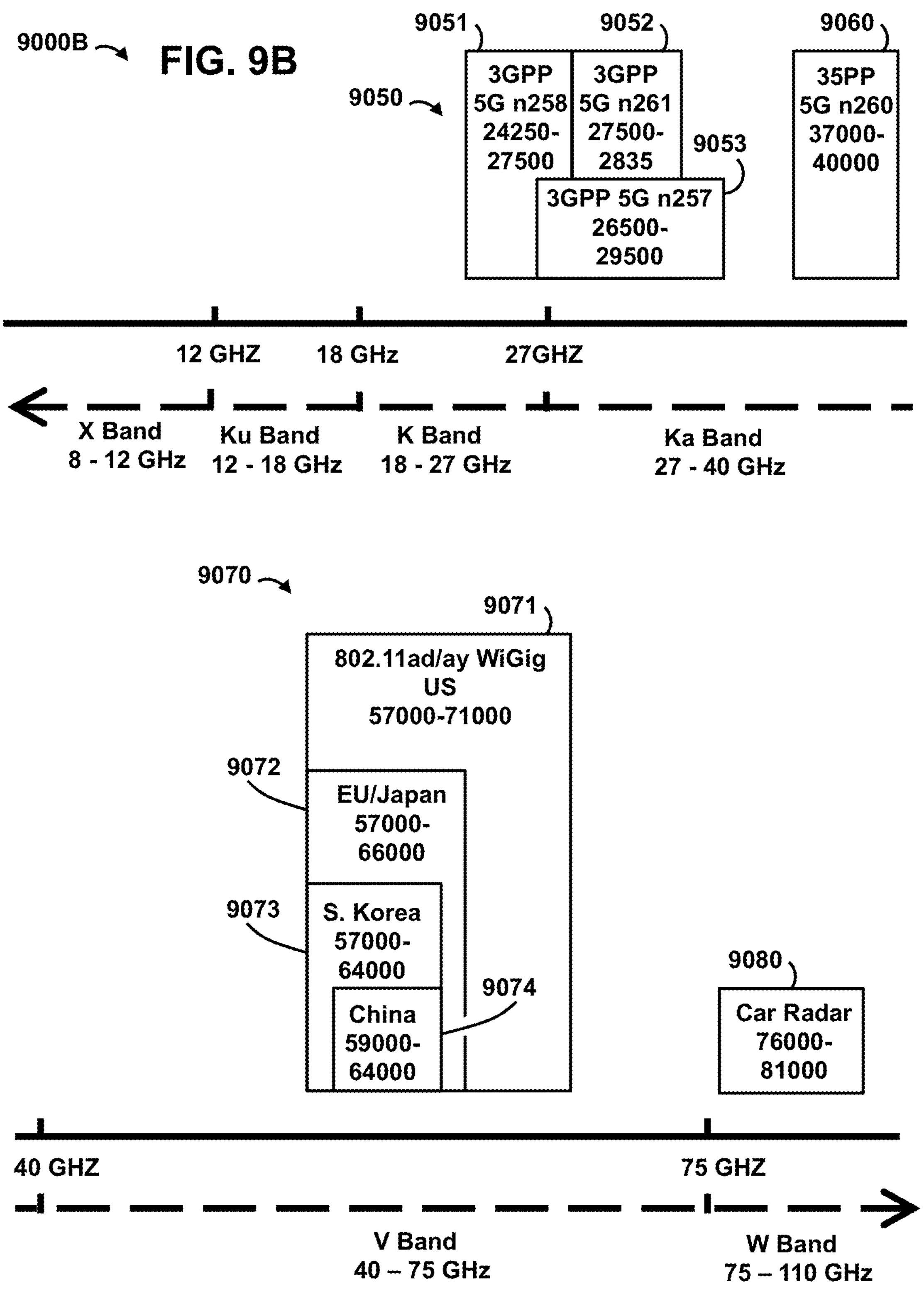

FIGS. 9A and 9B are simplified diagrams of a frequency spectrum illustrating application frequencies and application frequency bands of the example bulk acoustic wave resonators shown in FIG. 1A and FIGS. 4A through 4G, and the example filters shown in FIGS. 5 through 7, and the example oscillators shown in FIGS. 8A and 8B. A widely used standard to designate frequency bands in the microwave range by letters is established by the United States Institute of Electrical and Electronic Engineers (IEEE). In accordance with standards published by the IEEE, as defined herein, and as shown in FIGS. 9A and 9B are application bands as follows: S Band (2 GHz-4 GHz), C Band (4 GHz-8 GHz), X Band (8 GHz-12 GHz), Ku Band (12 GHz-18 GHz), K Band (18 GHz-27 GHz), Ka Band (27 GHz-40 GHz), V Band (40 GHz-75 GHz), and W Band (75 GHz-110 GHz). FIG. 9A shows a first frequency spectrum portion 9000A in a range from three Gigahertz (3 GHz) to eight Gigahertz (8 GHz), including application bands of S Band (2 GHz-4 GHz) and C Band (4 GHz-8 GHz). As described subsequently herein, the 3rd Generation Partnership Project standards organization (e.g., 3GPP) has standardized various 5G frequency bands. For example, included is a first application band 9010 (e.g., 3GPP 5G n77 band) (3.3 GHz-4.2 GHz) configured for fifth generation broadband cellular network (5G) applications. As described subsequently herein, the first application band 9010 (e.g., 5G n77 band) includes a 5G sub-band 9011 (3.3 GHz-3.8 GHz). The 3GPP 5G sub-band 9011 includes Long Term Evolution broadband cellular network (LTE) application sub-bands 9012 (3.4 GHz-3.6 GHz), 9013 (3.6 GHz-3.8 GHz), and 9014 (3.55 GHz-3.7 GHz). A second application band 9020 (4.4 GHz-5.0 GHz) includes a sub-band 9021 for China specific applications. Discussed next are Unlicensed National Information Infrastructure (UNII) bands. A third application band 9030 includes a UNII-1 band 9031 (5.15 GHz-5.25 GHz) and a UNII-2A band 9032 (5.25 GHz 5.33 GHz). An LTE band 9033 (LTE Band 252) overlaps the same frequency range as the UNII-1 band 6031. A fourth application band 9040 includes a UNII-2C band 9041 (5.490 GHz-5.735 GHz), a UNII-3 band 9042 (5.735 GHz-5.85 GHz), a UNII-4 band 9043 (5.85 GHz-5.925 GHz), a UNII-5 band 9044 (5.925 GHz-6.425 GHz), a UNII-6 band 9045 (6.425 GHz-6.525 GHz), a UNII-7 band 9046 (6.525 Ghz-6.875 Ghz), and a UNII-8 band 9047 (6.875 GHz-7125 Ghz). An LTE band 9048 overlaps the same frequency range (5.490 GHz-5.735 GHz) as the UNII-3 band 9042. A sub-band 9049A shares the same frequency range as the UNII-4 band 9043. An LTE band 9049B shares a subsection of the same frequency range (5.855 GHz-5.925 GHz).

FIG. 9B shows a second frequency spectrum portion 9000B in a range from eight Gigahertz (8 GHz) to one-hundred and ten Gigahertz (110 GHz), including application bands of X Band (8 Ghz-12 Ghz), Ku Band (12 Ghz-18 Ghz), K Band (18 Ghz-27 Ghz), Ka Band (27 Ghz-40 Ghz), V Band (40 Ghz-75 Ghz), and W Band (75 Ghz-110 Ghz). A fifth application band 9050 includes 3GPP 5G bands configured for fifth generation broadband cellular network (5G) applications, e.g., 3GPP 5G n258 band 9051 (24.25 GHz-27.5 GHz), e.g., 3GPP 5G n261 band 9052 (27.5 GHz-28.35 GHz), e.g., 3GPP 5G n257 band 9053 (26.5 GHz-29.5). A sixth application band 9060 includes the 3GPP 5G n260 band 9060 (37 GHz-40 GHz). A seventh application band 9070 includes United States WiGig Band for IEEE 802.11ad and IEEE 802.11ay 9071 (57 GHz-71 Ghz), European Union and Japan WiGig Band for IEEE 802.11ad and IEEE 802.11ay 9072 (57 GHz-66 Ghz), South Korea WiGig Band for IEEE 802.11ad and IEEE 802.11ay 9073 (57 GHz-64 Ghz), and China WiGig Band for IEEE 802.11ad and IEEE 802.11ay 9074 (59 GHz-64 GHz). An eighth application band 9080 includes an automobile radar band 9080 (76 GHz-81 GHz).

Accordingly, it should be understood from the foregoing that the acoustic wave devices (e.g., resonators, filters and oscillators) of this disclosure may to be implemented in the respective application frequency bands just discussed. For example, the layer thicknesses of the acoustic reflector electrodes and piezoelectric layers in alternating axis arrangement for the example acoustic wave devices (e.g., the 5 GHZ bulk acoustic wave resonators, e.g., the 24 GHz bulk acoustic wave resonators, e.g., the example 39 GHz bulk acoustic wave resonators) of this disclosure may be scaled up and down as needed to be implemented in the respective application frequency bands just discussed. This is likewise applicable to the example filters (e.g., bulk acoustic wave resonator based filters) and example oscillators (e.g., bulk acoustic wave resonator based oscillators) of this disclosure to be implemented in the respective application frequency bands just discussed. The following examples pertain to further embodiments for acoustic wave devices, including but not limited to, e.g., bulk acoustic wave resonators, e.g., bulk acoustic wave resonator based filters, e.g., bulk acoustic wave resonator based oscillators, and from which numerous permutations and configurations will be apparent. A first example is an acoustic wave device comprising first and second layers of piezoelectric material (e.g., one or more layers of doped piezoelectric material) acoustically coupled with one another to have a piezoelectrically excitable resonance mode, in which the first layer of piezoelectric material (e.g., doped piezoelectric material) has a first piezoelectric axis orientation, and the second layer of piezoelectric material (e.g., doped piezoelectric material) has a second piezoelectric axis orientation that opposes the first piezoelectric axis orientation of the first layer of piezoelectric material (e.g., doped piezoelectric material), and in which the first and second layers of piezoelectric material (e.g., first layer of doped piezoelectric material, e.g., second layer of doped piezoelectric material) have respective thicknesses so that the acoustic wave device has a resonant frequency. A second example is an acoustic wave device as described in the first example, in which the resonant frequency of the acoustic wave device is in a 3rd Generation Partnership Project (3GPP) band. A third example is an acoustic wave device as described in the first example in which the resonant frequency of the acoustic wave device is in an Unlicensed National Information Infrastructure (UNII) band. A fourth example is an acoustic wave device as described in the first example, in which the resonant frequency of the acoustic wave device is in a 3GPP n77 band 9010 as shown in FIG. 9A. A fifth example is an acoustic wave device as described in the first example, in which the resonant frequency of the acoustic wave device is in a 3GPP n79 band 9020 as shown in FIG. 9A. A sixth example is an acoustic wave device as described in the first example, in which the resonant frequency of the acoustic wave device is in a 3GPP n258 band 9051 as shown in FIG. 9B. A seventh example is an acoustic wave device as described in the first example, in which the resonant frequency of the acoustic wave device is in a 3GPP n261 band 9052 as shown in FIG. 9B. An eighth example is an acoustic wave device as described in the first example, in which the resonant frequency of the acoustic wave device is in a 3GPP n260 band as shown in FIG. 9B. A ninth example is an acoustic wave device as described in the first example, in which the resonant frequency of the acoustic wave device is in an Institute of Electrical and Electronic Engineers (IEEE) C band as shown in FIG. 9A. A tenth example is an acoustic wave device as described in the first example, in which the resonant frequency of the acoustic wave device is in an Institute of Electrical and Electronic Engineers (IEEE) X band as shown in FIG. 9B. An eleventh example is an acoustic wave device as described in the first example, in which the resonant frequency of the acoustic wave device is in an Institute of Electrical and Electronic Engineers (IEEE) Ku band as shown in FIG. 9B. An twelfth example is an acoustic wave device as described in the first example, in which the resonant frequency of the acoustic wave device is in an Institute of Electrical and Electronic Engineers (IEEE) K band as shown in FIG. 9B. A thirteenth example is an acoustic wave device as described in the first example, in which the resonant frequency of the acoustic wave device is in an Institute of Electrical and Electronic Engineers (IEEE) Ka band as shown in FIG. 9B. A fourteenth example is an acoustic wave device as described in the first example, in which the resonant frequency of the acoustic wave device is in an Institute of Electrical and Electronic Engineers (IEEE) V band as shown in FIG. 9B. A fifteenth example is an acoustic wave device as described in the first example, in which the resonant frequency of the acoustic wave device is in an Institute of Electrical and Electronic Engineers (IEEE) W band as shown in FIG. 9B. A sixteenth example is an acoustic wave device as described in the first example, in which the resonant frequency of the acoustic wave device is in UNII-1 band 9031, as shown in FIG. 9A. A seventeenth example is an acoustic wave device as described in the first example, in which the resonant frequency of the acoustic wave device is in UNII-2A band 9032, as shown in FIG. 9A. A eighteenth example is an acoustic wave device as described in the first example, in which the resonant frequency of the acoustic wave device is in UNII-2C band 9041, as shown in FIG. 9A. A nineteenth example is an acoustic wave device as described in the first example, in which the resonant frequency of the acoustic wave device is in UNII-3 band 9042, as shown in FIG. 9A. A twentieth example is an acoustic wave device as described in the first example, in which the resonant frequency of the acoustic wave device is in UNII-4 band 9043, as shown in FIG. 9A. A twenty first example is an acoustic wave device as described in the first example, in which the resonant frequency of the acoustic wave device is in UNII-5 band 9044, as shown in FIG. 9A. A twenty second example is an acoustic wave device as described in the first example, in which the resonant frequency of the acoustic wave device is in UNII-6 band 9045, as shown in FIG. 9A. A twenty third example is an acoustic wave device as described in the first example, in which the resonant frequency of the acoustic wave device is in UNII-7 band 9046, as shown in FIG. 9A. A twenty fourth example is an acoustic wave device as described in the first example, in which the resonant frequency of the acoustic wave device is in UNII-8 band 9047, as shown in FIG. 9A.

Figure 10:
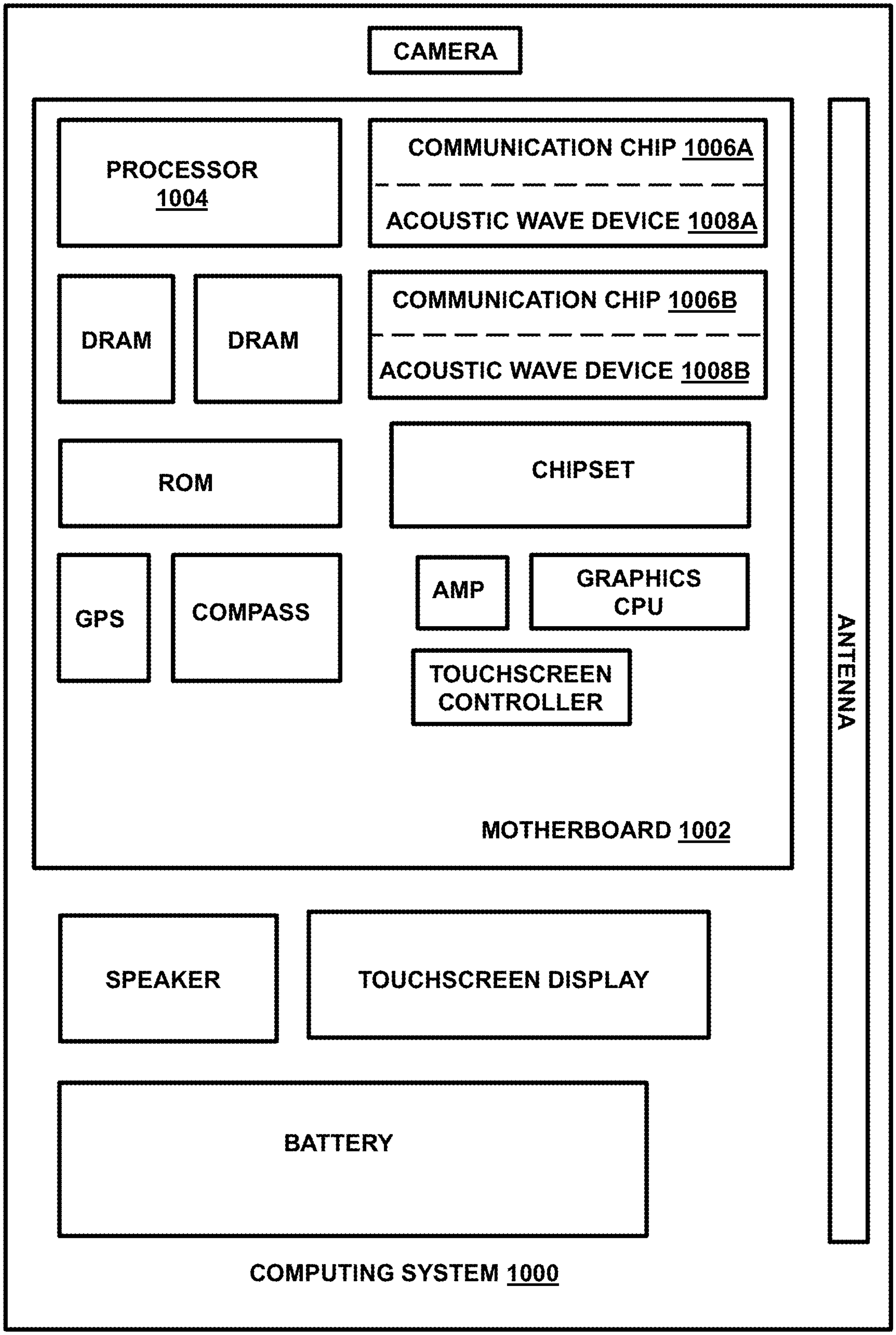
FIG. 10 illustrates a computing system implemented with integrated circuit structures or devices formed using the techniques disclosed herein, in accordance with an embodiment of the present disclosure.

FIG. 10 illustrates a computing system implemented with integrated circuit structures or devices formed using the techniques disclosed herein, in accordance with an embodiment of the present disclosure. As may be seen, the computing system 1000 houses a motherboard 1002. The motherboard 1002 may include a number of components, including, but not limited to, a processor 1004 and at least one communication chip 1006A, 1006B each of which may be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions may be integrated into one or more chips (e.g., for instance, note that the communication chip 1006 may be part of or otherwise integrated into the processor 1004).

The communication chips 1006A, 1006B enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chips 1006A, 1006B may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006A, 1006B. For instance, a first communication chip 1006A may be dedicated to shorter range wireless communications such as Wi-Fi and Bluetooth and a second communication chip 1006B may be dedicated to longer range wireless communications such as GPS, EDGE, GPRS, CDMA, WiMAX, LTE, Ev-DO, 5G and others. In some embodiments, communication chip 1006 may include one or more acoustic wave devices 1008A, 1008B resonator structures (e.g., resonators, filters and/or oscillators 1008A, 1008B) as variously described herein (e.g., acoustic wave devices including a stack of alternating axis doped piezoelectric material). Acoustic wave devices 1008A, 1008B and such bulk acoustic wave resonator may be included in various ways, e.g., one or more resonators, e.g., one or more filters, e.g., one or more oscillators. Further, such acoustic wave devices 1008A, 1008B, e.g., resonators, e.g., filters, e.g., oscillators may be configured to be Super High Frequency (SHF) acoustic wave devices 1008A, 1008B or Extremely High Frequency (EHF) acoustic wave devices 1008A, 1008B, e.g., resonators, filters, and/or oscillators (e.g., operating at greater than 3, 4, 5, 6, 7, or 8 GHz, e.g., operating at greater than 23, 24, 25, 26, 27, 28, 29, or 30 GHz, e.g., operating at greater than 36, 37, 38, 39, or 40 GHz). Further still, such Super High Frequency (SHF) acoustic wave devices or Extremely High Frequency (EHF) resonators, filters, and/or oscillators may be included in the RF front end of computing system 1000 and they may be used for 5G wireless standards or protocols, for example.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chips 1006A, 1006B also may include an integrated circuit die packaged within the communication chips 1006A, 1006B. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006A, 1006B is integrated into processor 1004, rather than having separate communication chips). Further note that processor 1004 may be a chip set having such wireless capability. In short, any number of processor 1004 and/or communication chips 1006 may be used. Likewise, any one chip or chip set may have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent. The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An apparatus comprising:

a bulk acoustic millimeter wave resonator having a main resonant millimeter wave frequency and including at least:

a piezoelectric stack including at least a number of piezoelectric layers, the number of piezoelectric layers including at least a first piezoelectric layer having a first piezoelectric axis orientation, a second piezoelectric layer having a second piezoelectric axis orientation, a third piezoelectric layer having a doping and a third piezoelectric axis orientation, and an arrangement of an interposer layer between the third piezoelectric layer having the doping and the second piezoelectric layer, in which the third piezoelectric layer having the doping, the number of piezoelectric layers, and the arrangement of the interposer layer between the third piezoelectric layer having the doping and the second piezoelectric layer are to facilitate determining a selected electromechanical coupling of the bulk acoustic millimeter wave resonator, and in which the third piezoelectric layer having the doping has a thickness to facilitate the bulk acoustic millimeter wave resonator having the main resonant millimeter wave frequency in one of a Ku band, a K band, a Ka band, a V band and a W band; and a top electrode acoustically reflective of the main resonant millimeter wave frequency, in which the top electrode is electrically and acoustically coupled with the third piezoelectric layer having the doping to excite the main resonant millimeter wave frequency of the bulk acoustic millimeter wave resonator.

2. The apparatus as in claim 1 in which the interposer layer includes at least a dielectric.

3. The apparatus as in claim 1 in which the second piezoelectric axis orientation is antiparallel to the third piezoelectric axis orientation.

4. The apparatus as in claim 1 in which the second piezoelectric layer is substantially free of the doping to facilitate determining the selected electromechanical coupling of the bulk acoustic millimeter wave resonator.

5. The apparatus as in claim 1 in which the first piezoelectric layer has another doping.

6. The apparatus as in claim 1 in which the second piezoelectric layer has an additional doping.

7. The apparatus as in claim 1 in which the first piezoelectric layer has another doping, and the second piezoelectric layer has yet another doping.

8. The apparatus as in claim 1 in which the bulk acoustic millimeter wave resonator includes at least a bottom electrode stack, the bottom electrode stack including at least a first bottom metal electrode layer, a second bottom metal electrode layer, a third bottom metal electrode layer, and a fourth bottom metal electrode layer, and in which the third bottom metal electrode layer and the fourth bottom metal electrode layer are electrically and acoustically coupled with the third piezoelectric layer to excite the main resonant millimeter wave frequency of the bulk acoustic millimeter wave resonator.

9. The apparatus as in claim 1 in which the top electrode includes at least a top electrode stack, the top electrode stack including at least a first top metal electrode layer, a second top metal electrode layer, a third top metal electrode layer, and a fourth top metal electrode layer, and in which the third top metal electrode layer and the fourth top metal electrode layer are electrically and acoustically coupled with the third piezoelectric layer to excite the main resonant millimeter wave frequency of the bulk acoustic millimeter wave resonator.

10. The apparatus as in claim 1 in which:

the bulk acoustic millimeter wave resonator includes at least a bottom electrode;

a first mesa structure includes at least the piezoelectric stack;

a second mesa structure comprises the bottom electrode; and a third mesa structure includes at least the top electrode.

11. The apparatus as in claim 1 in which:

an etched edge region extends through the first piezoelectric layer and the second piezoelectric layer and the third piezoelectric layer;

the top electrode includes at least a connection portion of the top electrode;

a gap is formed beneath the connection portion of the top electrode adjacent to where the etched edge region extends through the first piezoelectric layer and the second piezoelectric layer and the third piezoelectric layer;

the gap is filled with air;

the bulk acoustic millimeter wave resonator includes at least a bottom electrode; and the etched edge region extends through the bottom electrode.

12. The apparatus as in claim 1 comprising a fourth piezoelectric layer, and further comprising at least one or more of: a third pair of piezoelectric layers, a fourth pair of piezoelectric layers, a fifth pair of piezoelectric layers, a sixth pair of piezoelectric layers, a seventh pair of piezoelectric layers, an eighth pair of piezoelectric layers and a ninth pair of piezoelectric layers.

13. The apparatus as in claim 1 in which the bulk acoustic millimeter wave resonator has a quality factor of approximately 730 or greater at the main resonant millimeter wave frequency of the bulk acoustic millimeter wave resonator.

14. The apparatus as in claim 1 in which the main resonant millimeter wave frequency of the bulk acoustic millimeter wave resonator is in a 3rd Generation Partnership Project (3GPP) band in at least one of a 3GPP n257 band, a 3GPP n258 band, a 3GPP n260 band, and a 3GPP n261.

15. The apparatus as in claim 1 in which the piezoelectric stack includes at least an additional interposer layer between the first piezoelectric layer and the second piezoelectric layer to facilitate determining the selected electromechanical coupling of the bulk acoustic millimeter wave resonator, and in which the additional interposer layer includes at least a dielectric.

16. A millimeter wave resonator filter having a millimeter wave filter band comprising:

a substrate;

a plurality of acoustic millimeter wave resonators coupled to provide the millimeter wave resonator filter, in which at least one of the plurality of acoustic millimeter wave resonators includes at least:

a piezoelectric stack including at least a plurality of piezoelectric layers, an additional piezoelectric layer having a doping, and an interposer layer between the additional piezoelectric layer having the doping and the plurality of piezoelectric layers, in which an arrangement of members of the piezoelectric stack has alternating piezoelectric axis orientations, the additional piezoelectric layer and the plurality of piezoelectric layers having respective thicknesses, the respective thicknesses facilitating a main resonant millimeter wave frequency of the at least one of the plurality of acoustic millimeter wave resonators being in the millimeter wave filter band; and a first electrode coupled over the piezoelectric stack and electrically interfacing with the additional piezoelectric layer having the doping and the plurality of piezoelectric layers.

17. The millimeter wave resonator filter as in claim 16 in which the first electrode includes at least a first plurality of metal layers and a second plurality of metal layers arranged to facilitate acoustic reflection of the main resonant millimeter wave frequency.

18. The millimeter wave resonator filter as in claim 16 in which the millimeter wave filter band overlaps at least a portion of at least one of a Ku band, a K band, a Ka band, a V band and a W band.

19. An acoustic millimeter wave resonator comprising:

a piezoelectric stack including at least a plurality of piezoelectric layers, an additional piezoelectric layer having a doping, and an interposer layer between the additional piezoelectric layer having the doping and the plurality of piezoelectric layers, in which an arrangement of members of the piezoelectric stack has alternating piezoelectric axis orientations, the additional piezoelectric layer and the plurality of piezoelectric layers having respective thicknesses, the respective thicknesses facilitating a main resonant millimeter wave frequency of the acoustic millimeter wave resonator being in one of a Ku band, a K band, a Ka band, a V band and a W band; and a first electrode coupled over the piezoelectric stack and electrically interfacing with the additional piezoelectric layer having the doping and the plurality of piezoelectric layers, in which the first electrode has a thickness of greater than a quarter of an acoustic wavelength of the main resonant millimeter wave frequency of the acoustic millimeter wave resonator, and in which the additional piezoelectric layer having the doping, the plurality of piezoelectric layers, and the interposer layer between the additional piezoelectric layer having the doping and the plurality of piezoelectric layers is to facilitate an electromechanical coupling of the acoustic millimeter wave resonator.

20. The acoustic millimeter wave resonator as in claim 19 in which the first electrode includes at least a first plurality of metal layers and a second plurality of metal layers arranged to facilitate acoustic reflection of the main resonant millimeter wave frequency.

* * * * *